United States Patent [19]

Nakanishi

[11] Patent Number: 5,477,066
[45] Date of Patent: Dec. 19, 1995

[54] HETEROJUNCTION BIPOLAR TRANSISTOR

[75] Inventor: Masahiko Nakanishi, Itami, Japan

[73] Assignee: Mitsubishi Denki Kabushiki Kaisha, Tokyo, Japan

[21] Appl. No.: 330,739

[22] Filed: Oct. 28, 1994

Related U.S. Application Data

[62] Division of Ser. No. 1,570, Jan. 6, 1993.

[30] Foreign Application Priority Data

Jan. 9, 1992 [JP] Japan ................... 4-022108

[51] Int. Cl.⁶ ............................... H01L 29/161
[52] U.S. Cl. ............. 257/197; 257/198; 257/201
[58] Field of Search ................. 257/197, 198, 257/23, 25, 187, 201

[56] References Cited

U.S. PATENT DOCUMENTS

| | | | |
|---|---|---|---|
| 4,939,562 | 7/1990 | Adlerstein | 257/198 |
| 5,001,534 | 3/1991 | Lunardi et al. | 257/197 |
| 5,111,265 | 5/1992 | Tanaka | 257/25 |
| 5,150,185 | 9/1992 | Yamada | 257/197 |
| 5,172,197 | 12/1992 | Nguyen et al. | 357/22 |
| 5,285,087 | 2/1994 | Narita et al. | 257/192 |

FOREIGN PATENT DOCUMENTS

| | | |
|---|---|---|
| 0371686 | 11/1989 | European Pat. Off. . |
| 60-037784 | 2/1985 | Japan . |
| 62-61371 | 3/1987 | Japan . |
| 1166573 | 6/1989 | Japan . |
| 1-262663 | 10/1989 | Japan ................... 257/25 |
| 2-00364 | 1/1990 | Japan ................... 257/197 |
| 2295135 | 12/1990 | Japan . |
| 3286540 | 12/1991 | Japan . |
| 4-99382 | 3/1992 | Japan ................... 257/197 |
| 4-101430 | 4/1992 | Japan ................... 257/197 |

OTHER PUBLICATIONS

Greenberg et al, "A Recessed-Gate InAlAs/n+ HFET With An InP Etch-Stop Layer", IEEE Electron Device Letters, vol. 13, No. 3, 1992, pp. 137–139.

Primary Examiner—Sara W. Crane
Assistant Examiner—Courtney Bowers
Attorney, Agent, or Firm—Leydig, Voit & Mayer

[57] ABSTRACT

A heterojunction bipolar transistor includes a III-V compound semiconductor substrate having a surface; III-V compound semiconductor layers successively disposed on the surface including an InGaAs layer, an InP layer, and an InAlAs layer; and base electrodes in contact with the InGaAs layer wherein contact of the base electrodes with the InGaAs layer is coplanar with contact between the InP layer and the InGaAs layer.

2 Claims, 45 Drawing Sheets

HETEROJUNCTION BIPOLAR TRANSISTOR

This disclosure is a division of application Ser. No. 08/001,570, filed Jan. 6, 1993.

FIELD OF THE INVENTION

The present invention relates to III-V compound semiconductor devices and, more particularly to field effect transistors and heterojunction bipolar transistors comprising III-V compound semiconductors.

BACKGROUND OF THE INVENTION

In field effect transistors (hereinafter referred to as FETs), current flowing between source and drain electrodes is controlled by voltage applied to a gate electrode, that is, an input signal to the gate electrode is amplified and current equivalent to the signal amplified is output from the drain electrode. An FET in which electrons travel with high mobility through a two-dimensional electron gas layer is called a high electron mobility transistor (hereinafter referred to as HEMT), and the HEMT operates in a high frequency region of 40 GHz or more. Although the HEMT has a drawback in its low gate junction breakdown voltage, a HEMT with a recess structure achieves a gate junction breakdown voltage as high as that of a silicon device.

FIG. 71 is a sectional view illustrating a conventional HEMT employing an InP substrate. In the figure, reference numeral 1 designates an InP substrate. An InAlAs buffer layer 2, an InGaAs channel layer 3, an n type InAlAs electron supply layer 4, an InAlAs Schottky junction formation layer 5, and an n type InGaAs ohmic contact layer 7 are successively disposed on the InP substrate 1. A gate recess penetrates the n type InGaAs ohmic contact layer 7 and reaches into the InAlAs Schottky junction formation layer 5, and a gate electrode 8 is disposed in the recess. A source electrode 9 and a drain electrode 10 are disposed on the n type InGaAs ohmic contact layer 7 spaced from each other. In this HEMT, current flows through the InGaAs channel layer 3 between the source and drain electrodes. This current is hereinafter referred to as drain current.

FIG. 73 is a sectional view illustrating a conventional MISFET (Metal Insulator Semiconductor FET) employing an InP substrate. In the figure, reference numeral 1 designates an InP substrate. An InAlAs buffer layer 2, an n type InGaAs channel layer 13, an InAlAs Schottky junction formation layer 5, and an n type InGaAs ohmic contact layer 7 are successively disposed on the InP substrate 1. A gate recess penetrates the n type InGaAs ohmic contact layer 7 and reaches into the InAlAs Schottky junction formation layer 5, and a gate electrode 8 is disposed in the recess. A source electrode 9 and a drain electrode 10 are disposed on the n type InGaAs ohmic contact layer 7 spaced from each other. In this MISFET, drain current flows through the n type InGaAs channel layer 13.

FIG. 74 is a sectional view illustrating a conventional HEMT employing a GaAs substrate. In the figure, reference numeral 14 designates a GaAs substrate. A GaAs buffer layer 15, an n type AlGaAs electron supply layer 16, and an n type GaAs ohmic contact layer 17 are successively disposed on the GaAs substrate 14. A source electrode 9 and a drain electrode 10 are disposed on the n type GaAs ohmic contact layer 17 spaced from each other. In this HEMT, drain current flows through the GaAs buffer layer 15 in the vicinity of the boundary between the buffer layer 15 and the n type AlGaAs electron supply layer 16.

FIG. 75 is a sectional view illustrating a conventional MISFET employing a GaAs substrate. In the figure, reference numeral 14 designates a GaAs substrate. A GaAs buffer layer 15, an n type GaAs channel layer 18, an AlGaAs Schottky junction formation layer 19, and an n type GaAs ohmic contact layer 17 are successively disposed on the GaAs substrate 14. A gate recess penetrates the n type GaAs ohmic contact layer 17 and reaches into the AlGaAs Schottky junction formation layer 19, and a gate electrode 8 is disposed in the recess. A source electrode 9 and a drain electrode 10 are disposed on the n type GaAs ohmic contact layer 17 spaced from each other. In this MISFET, drain current flows through the n type GaAs channel layer 18.

FIG. 76 is a sectional view illustrating a conventional MESFET (Metal Semiconductor FET) employing a GaAs substrate. In the figure, reference numeral 14 designates a GaAs substrate. A GaAs buffer layer 15, an n type GaAs channel layer 18, and an n type GaAs ohmic contact layer 17 are successively disposed on the GaAs substrate 14. A gate recess penetrates the n type GaAs ohmic contact layer 17 and reaches into the n type GaAs channel layer 18, and a gate electrode 8 is disposed in the recess. A source electrode 9 and a drain electrode 10 are disposed on the n type GaAs ohmic contact layer 17 spaced from each other. In this MESFET, drain current flows through the n type GaAs channel layer 18.

FIGS. 72(a)–72(c) illustrate a method for producing the HEMT on the InP substrate shown in FIG. 71.

Initially, on the InP substrate 1, the InAlAs buffer layer 2, the InGaAs channel layer 3, the n type InAlAs electron supply layer 4, the InAlAs Schottky junction formation layer 5, and the n type InGaAs ohmic contact layer 7 are successively grown by a crystal growth method (FIG. 72(a)). Then, the source and drain electrodes 9 and 10 are formed on the n type InGaAs ohmic contact layer 7 using vapor deposition and lift-off (FIG. 72(b)). Then, photoresist is deposited on the whole surface and patterned to form a photoresist mask 50. Then, portions of the n type InGaAs ohmic contact layer 7 and the InAlAs Schottky junction formation layer 5 are etched away using the photoresist mask 50, forming the gate recess (FIG. 72(c)). Then, a gate metal is deposited on the surface and the photoresist mask 50 and the overlying portions of the gate metal are removed by lift-off to form the gate electrode 8, resulting in the HEMT of FIG. 71.

A description is given of a heterojunction bipolar transistor (hereinafter referred to as HBT). In the HBT, current flowing between collector and emitter layers is controlled by current flowing through a base layer, that is, amplification is achieved by controlling the current flowing through the emitter layer with a small current flowing through the base layer. When the energy band gap of the emitter layer is larger than that of the base layer, a large amplification factor is achieved.

FIG. 77 is a sectional view illustrating a prior art HBT employing an InP substrate. In the figure, reference numeral 1 designates an InP substrate. An n type InGaAs collector layer 100 having a ridge 100a is disposed on the InP substrate 1, and collector electrodes 105 are disposed on the collector layer 100 at opposite sides of the ridge 100a. A p type InGaAs base layer 101 having a ridge 101a is disposed on the ridge 100a of the collector layer 100, and base electrodes 106 are disposed on the base layer 101 at opposite sides of the ridge 101a. An n type InAlAs emitter layer 103 and an $n^+$ type InGaAs emitter contact layer 104 are disposed on the ridge 101a of the base layer 101. An emitter electrode 107 is disposed on the $n^+$ type InGaAs emitter contact layer 104.

A method for producing the HBT of FIG. 77 is illustrated in FIGS. 78(a)–78(c).

Initially, on the InP substrate 1, the n type InGaAs collector layer 100, the p type InGaAs base layer 101, the n type InAlAs emitter layer 103, and the n⁺ type InGaAs emitter contact layer 104 are successively grown by a crystal growth method (FIG. 78(a)). Then, a first photoresist layer 150 is formed on the n⁺ type InGaAs emitter contact layer 104 using conventional photolithography and, thereafter, the n⁺ type InGaAs emitter contact layer 104 and the n type InAlAs emitter layer 103 are etched using the photoresist layer 150 as a mask. Since the unmasked portions of the n type InAlAs emitter layer 103 have to be completely removed and excessive etching is carried out therefor, upper portions of the p type InGaAs base layer 101 are also etched away (FIG. 78(b)). After removing the first photoresist layer 150, a second photoresist layer 151 is formed over the emitter contact layer 104 extending on portions of the base layer 101 by conventional photolithography, and the p type InGaAs base layer 101 is etched using the second photoresist layer 151 as a mask. Since the unmasked portions of the base layer 101 have to be completely removed and excessive etching is carried out therefor, upper portions of the n type InGaAs collector layer 100 are also etched away (FIG. 78(c)). Thereafter, the collector electrodes 105, the base electrodes 106, and the emitter electrode 107 are formed by vapor deposition and lift-off, completing the HBT of FIG. 77.

In the above-described FETs, the length of the channel, through which current flows from the source to drain, greatly influences electric characteristics of the FET, and the channel length is determined by the depth of the gate recess. Since the depth of the gate recess is usually calculated from the etching speed and the etching time, variations in the etching time directly cause variations in transistor characteristics.

Meanwhile, in the above-described HBT, when the n type emitter layer disposed on the p type base layer is etched to expose the surface of the base layer, the excessive etching is carried out considering the variations in the etching depth, so that the upper portion of the base layer is unfavorably etched away. Since the base layer is usually as thin as about 0.1 micron, even the slight etching of the upper portion of the base layer adversely affects the effective thickness of the base layer, resulting in variations in the electric characteristics of the HBT.

SUMMARY OF THE INVENTION

It is an object of the present invention to provide compound semiconductor devices with uniform electrical characteristics utilizing differences in etching rates of different compound semiconductor materials.

Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

According to a first aspect of the present invention, a field effect transistor includes III-V compound semiconductor layers successively disposed on a III-V compound semiconductor substrate, including, from below, an InAlAs layer, an InP layer, and an InGaAs layer, a gate recess penetrating through the InGaAs layer and the InP layer, and a gate electrode in contact with the InAlAs layer. The contact surface of the gate electrode with the InAlAs layer is on the same level with the interface between the InP layer and the InAlAs layer. In producing the gate recess, the InGaAs layer is first etched with an etchant comprising hydrogen peroxide, water, and at least one of tartaric acid, phosphoric acid, and sulfuric acid using the InP layer as an etching stopper layer, and then the InP layer is etched with hydrochloric acid using the InAlAs layer as an etching stopper layer. Therefore, the depth of the recess is accurately determined by the etching stopper layers, resulting in field effect transistors with uniform electrical characteristics.

According to a second aspect of the present invention, a field effect transistor includes III-V compound semiconductor layers successively disposed on a III-V compound semiconductor substrate, including, from below, an InAlAs layer, an InP layer, and an InGaAs layer, a gate recess penetrating through the InGaAs layer, and a gate electrode in contact with the InP layer. The contact surface of the gate electrode with the InP layer is on the same level with the interface between the InGaAs layer and the InP layer. In producing the gate recess, the InGaAs layer is etched with the etchant comprising hydrogen peroxide, water, and at least one of tartaric acid, phosphoric acid, and sulfuric acid using the InP layer as an etching stopper layer. Therefore, the depth of the recess is accurately determined by the etching stopper layers, resulting in field effect transistors with uniform electric characteristics.

According to a third aspect of the present invention, a field effect transistor includes III-V compound semiconductor layers successively disposed on a III-V compound semiconductor substrate, including a lower InAlAs layer, an InP layer, and an upper InAlAs layer, a gate recess penetrating through the upper InAlAs layer and the InP layer, and a gate electrode in contact with the lower InAlAs layer. The contact surface of the gate electrode with the lower InAlAs layer is on the same level with the interface between the InP layer and the lower InAlAs layer.

According to a fourth aspect of the present invention, a field effect transistor includes III-V compound semiconductor layers successively disposed on a III-V compound semiconductor substrate, including a lower InAlAs layer, an InP layer, and an upper InAlAs layer, a gate recess penetrating through the upper InAlAs layer, and a gate electrode in contact with the InP layer. The contact surface of the gate electrode with the InP layer is on the same level with the interface between the upper InAlAs layer and the InP layer.

According to a fifth aspect of the present invention, two different field effect transistors selected from the above-described four field effect transistors are fabricated on the same substrate. Therefore, two field effect transistors having uniform electrical characteristics and different pinch-off voltages are combined on the same substrate, reducing power consumption.

According to a sixth aspect of the present invention, a semiconductor device includes III-V compound semiconductor layers successively disposed on a III-V compound semiconductor substrate, including a lower InAlAs layer, a lower InP layer, an upper InAlAs layer, and an upper InP layer, a first field effect transistor including a gate electrode in contact with the lower InAlAs layer, and a second field effect transistor including a gate electrode in contact with the upper InAlAs layer. The contact surface of the gate electrode of the first field effect transistor with the lower InAlAs layer is on the same level with the interface between the lower InP layer and the lower InAlAs layer while the contact surface of the gate electrode of the second field effect transistor with the upper InAlAs layer is on the same level with the interface between the upper InP layer and the upper InAlAs layer.

According to a seventh aspect of the present invention, a semiconductor device includes III-V compound semiconductor layers successively disposed on a III-V compound semiconductor substrate, including a lower InP layer, a lower InAlAs layer, an upper InP layer, and an upper InAlAs layer, a first field effect transistor including a gate electrode in contact with the lower InP layer, and a second field effect transistor including a gate electrode in contact with the upper InP layer. The contact surface of the gate electrode of the first field effect transistor with the lower InP layer is on the same level with the interface between the lower InAlAs layer and the lower InP layer while the contact surface of the gate electrode of the second field effect transistor with the upper InP layer is on the same level with the interface between the upper InAlAs layer and the upper InP layer.

According to an eighth aspect of the present invention, a heterojunction bipolar transistor includes III-V compound semiconductor layers successively disposed on a III-V compound semiconductor substrate, including, from below, an InGaAs layer, an InP layer, and an InAlAs layer, and base electrodes in contact with the InGaAs layer. The contact surface of the base electrodes with the InGaAs layer is on the same level with the interface between the InP layer and the InGaAs layer.

According to a ninth aspect of the present invention, a heterojunction bipolar transistor includes III-V compound semiconductor layers successively disposed on a III-V compound semiconductor substrate, including, from below, an InGaAs layer, an InP layer, and an InAlAs layer, and base electrodes in contact with the InP layer. The contact surface of the base electrodes with the InP layer is on the same level with the interface between the InAlAs layer and the InP layer.

According to a tenth aspect of the present invention, a field effect transistor includes III-V compound semiconductor layers successively disposed on a III-V compound semiconductor substrate, including one of laminated structures of AlGaAs/InP/GaAs from below, AlGaAs/InP/InGaAs from below, lower GaAs/InP/upper GaAs, and GaAs/InP/InGaAs from below, and a gate electrode in contact with the AlGaAs layer or the lower GaAs layer. The contact surface of the gate electrode with the AlGaAs layer or the lower GaAs layer is on the same level with the interface between the InP layer and the AlGaAs layer or the lower GaAs layer.

According to an eleventh aspect of the present invention, a field effect transistor includes III-V compound semiconductor layers successively disposed on a III-V compound semiconductor substrate, including one of laminated structures of AlGaAs/InP/GaAs from below, AlGaAs/InP/InGaAs from below, lower GaAs/InP/upper GaAs, and GaAs/InP/InGaAs from below, and a gate electrode in contact with the InP layer. The contact surface of the gate electrode with the InP layer is on the same level with the interface between the InP layer and the upper GaAs layer or the InGaAs layer.

According to a twelfth aspect of the present invention, a field effect transistor includes III-V compound semiconductor layers successively disposed on a III-V compound semiconductor substrate, including a lower AlGaAs layer, an InP layer, and an upper AlGaAs layer, a gate recess penetrating through the upper AlGaAs layer and the InP layer, and a gate electrode in contact with the lower AlGaAs layer. The contact surface of the gate electrode with the lower AlGaAs layer is on the same level with the interface between the InP layer and the lower AlGaAs layer.

According to a thirteenth aspect of the present invention, a field effect transistor includes III-V compound semiconductor layers successively disposed on a III-V compound semiconductor substrate, including a lower AlGaAs layer, an InP layer, and an upper AlGaAs layer, a gate recess penetrating through the upper AlGaAs layer, and gate electrode in contact with the InP layer. The contact surface of the gate electrode with the InP layer is on the same level with the interface between the upper AlGaAs layer and the InP layer.

According to a fourteenth aspect of the present invention, two different field effect transistors selected from the above-described field effect transistors according to the tenth to thirteenth aspects of the present invention are fabricated on the same substrate. Therefore, two field effect transistors having uniform electrical characteristics and different pinch-off voltages are combined on the same substrate, reducing power consumption.

According to a fifteenth aspect of the present invention, a semiconductor device includes III-V compound semiconductor layers successively disposed on a III-V compound semiconductor substrate, including a lower AlgaAs layer, a lower InP layer, an upper AlgaAs layer, and an upper InP layer, a first field effect transistor including a gate electrode in contact with the lower AlgaAs layer, and a second field effect transistor including a gate electrode in contact with the upper AlgaAs layer. The contact surface of the gate electrode of the first field effect transistor with the lower AlgaAs layer is on the same level with the interface between the lower InP layer and the lower AlgaAs layer while the contact surface of the gate electrode of the second field effect transistor with the upper AlgaAs layer is on the same level with the interface between the upper InP layer and the upper AlgaAs layer.

According to a sixteenth aspect of the present invention, a semiconductor device includes III-V compound semiconductor layers successively disposed on a III-V compound semiconductor substrate, including a lower InP layer, a lower AlgaAs layer, an upper InP layer, and an upper AlgaAs layer, a first field effect transistor including a gate electrode in contact with the lower InP layer, and a second field effect transistor including a gate electrode in contact with the upper InP layer. The contact surface of the gate electrode of the first field effect transistor with the lower InP layer is on the same level with the interface between the lower AlGaAs layer and the lower InP layer while the contact surface of the gate electrode of the second field effect transistor with the upper InP layer is on the same level with the interface between the upper AlGaAs layer and the upper InP layer.

According to a seventeenth aspect of the present invention, a heterojunction bipolar transistor includes III-V compound semiconductor layers successively disposed on a III-V compound semiconductor substrate, including, from below, a GaAs layer, an InP layer, and an AlGaAs layer, and base electrodes in contact with the GaAs layer. The contact surface of the base electrodes with the GaAs layer is on the same level with the interface between the InP layer and the GaAs layer.

According to an eighteenth aspect of the present invention, a heterojunction bipolar transistor includes III-V compound semiconductor layers successively disposed on a III-V compound semiconductor substrate, including, from below, a GaAs layer, an InP layer, and an AlGaAs layer, and base electrodes in contact with the InP layer. The contact surface of the base electrode with the InP layer is on the same level with the interface between the AlGaAs layer and the InP layer.

DETAILED DESCRIPTION OF THE PREFERRED EMBODIMENTS

Figure 1:
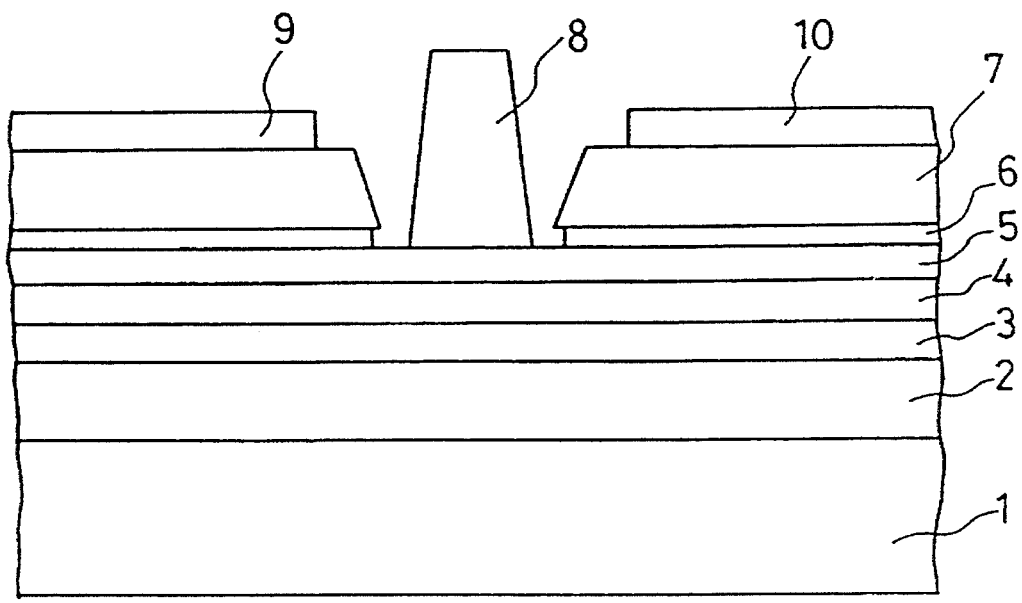
FIG. 1 is a cross-sectional view illustrating a semiconductor device in accordance with a first embodiment of the present invention.

FIG. 1 is a cross-sectional view illustrating a HEMT employing an InP substrate in accordance with a first embodiment of the present invention. In FIG. 1, reference numeral 1 designates an InP substrate. An InAlAs buffer layer 2, an InGaAs channel layer 3, an n type InAlAs electron supply layer 4, and an InAlAs Schottky junction formation layer 5 are disposed on the InP substrate 1. A gate electrode 8 is disposed on the InAlAs Schottky junction formation layer 5. InP etching stopper layers 6 are disposed on the InAlAs Schottky junction formation layer 5 at opposite sides of the gate electrode 8. N type InGaAs ohmic contact layers 7 are disposed on the InP etching stopper layers 6. A source electrode 9 and a drain electrode 10 are disposed on the n type InGaAs ohmic contact layers 7 spaced from each other.

A method for producing the HEMT of FIG. 1 is illustrated in FIGS. 2(a)–2(d).

Initially, there are successively grown on the InP substrate 1, the $In_{0.52}Al_{0.48}As$ buffer layer 2 about 300 nm thick, the $In_{0.53}Ga_{0.47}As$ channel layer 3 about 50 nm thick, the InAlAs electron supply layer 4 about 15 nm thick having a dopant concentration of about $4\times10^{18}$ $cm^{-3}$, the InAlAs Schottky junction formation layer 5 about 20 nm thick, and the InP etching stopper layer 6 about 5 nm thick, the n type $In_{0.52}Ga_{0.48}As$ ohmic contact layer 7 about 50 nm thick having a dopant concentration of about $4\times10^{18}$ $cm^{-3}$ (FIG.

2(a)). Preferably, these layers are grown by MBE (Molecular Beam Epitaxy) or MOCVD (Metal Organic Chemical Vapor Deposition).

Thereafter, source and drain electrodes 9 and 10 about 100 nm thick are formed on the n type InGaAs ohmic contact layer 7 by evaporation, deposition and lift-off. Preferably, the source and drain electrodes comprise Au/Ge/Ni, with Au in contact with the ohmic contact layer 7 (FIG. 2(b)).

Then, a photoresist is deposited on the surface and patterned to form a photoresist mask 50, followed by a recess etching using the photoresist mask 50. The recess etching is carried out at 20°~25° C. using, as an etchant, a mixture of hydrogen peroxide, water, and at least one of tartaric acid, phosphoric acid, and sulfuric acid, which are mixed in the ratio of 1:50. During the etching, this etchant etches InGaAs as a III-V compound semiconductor including As as a main constituent group V element but does not etch InP as a III-V compound semiconductor including P as a main constituent group V element, so that the etching automatically stops when the bottom of the recess reaches the InP etching stopper layer 6 (FIG. 2(c)). The etching conditions described above are common to all embodiments of the present invention.

Figure 70A:
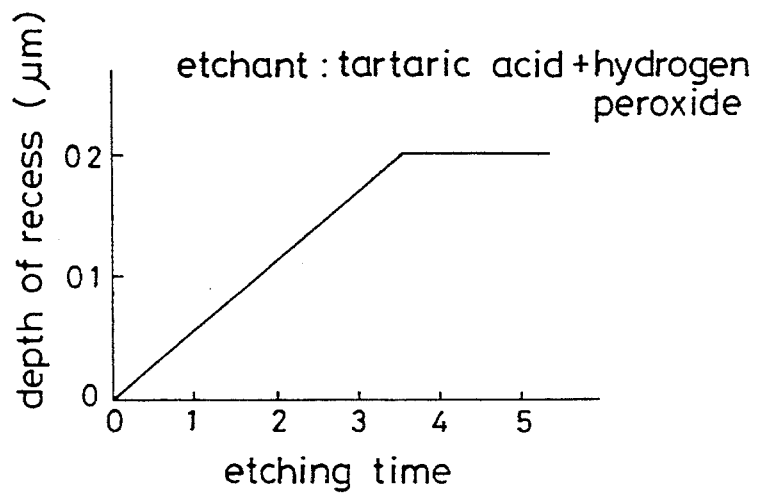
FIGS. 70(a)–70(c) are diagrams illustrating etching rates of various etchants.
Figure 70B:
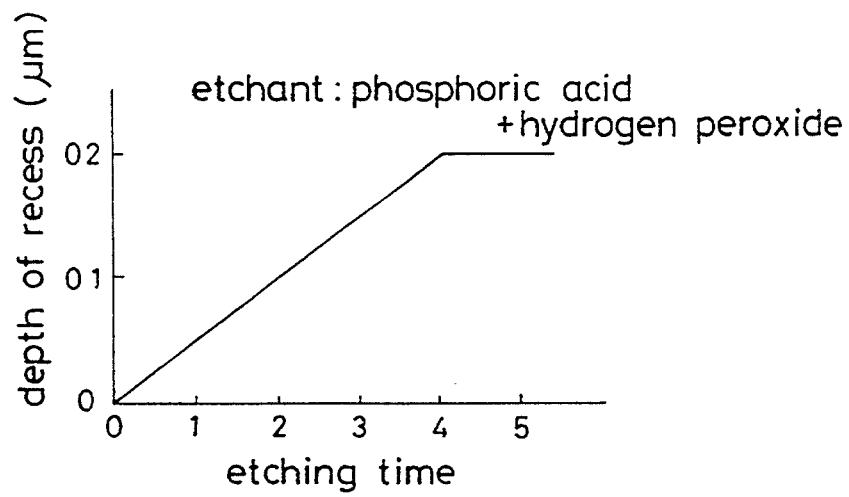
Figure 70C:
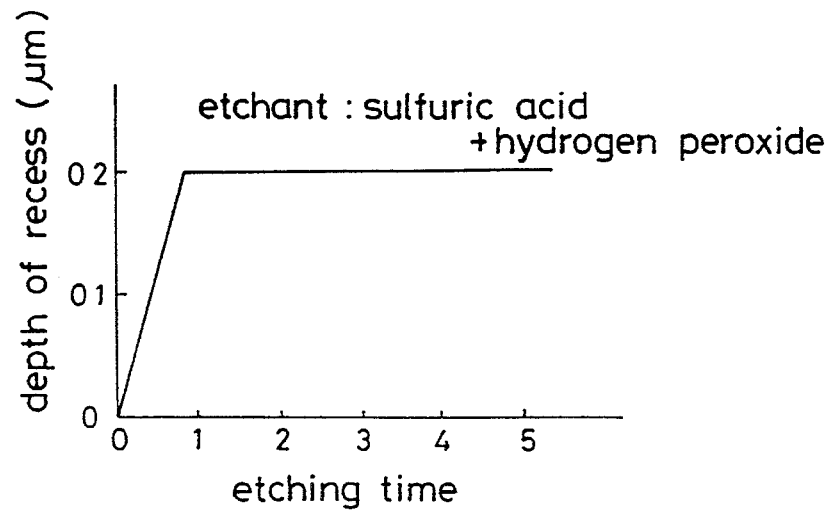
Figure 71:
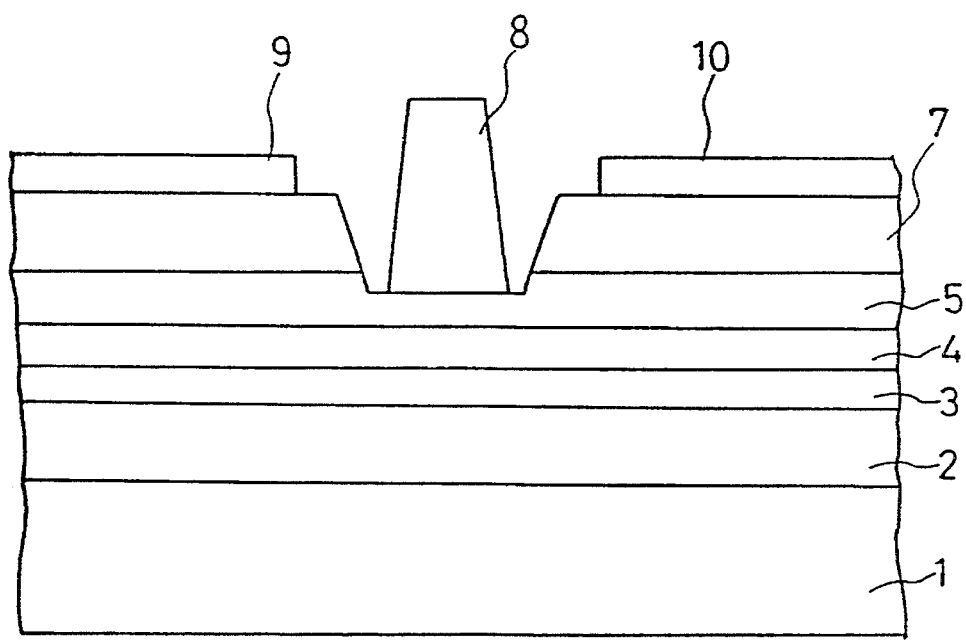
FIG. 71 is a cross-sectional view illustrating a HEMT using an InP substrate in accordance with the prior art.
Figure 72A:
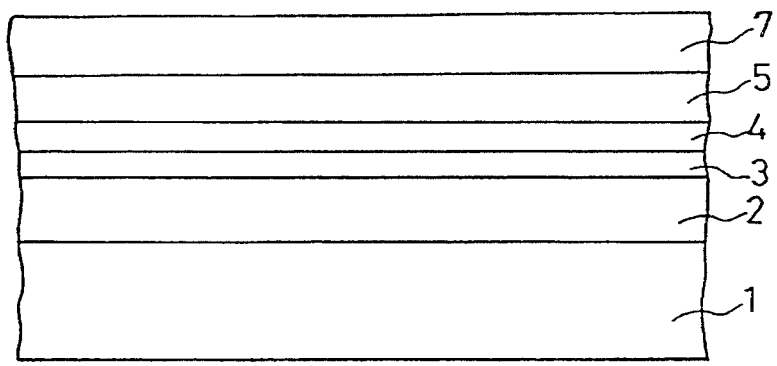
FIGS. 72(a)–72(c) are cross-sectional views illustrating a method for producing the HEMT of FIG. 71.
Figure 72B:
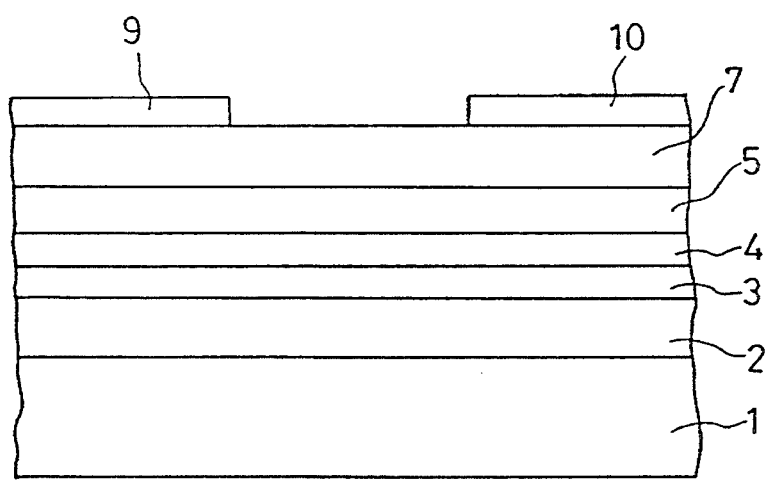
Figure 72C:
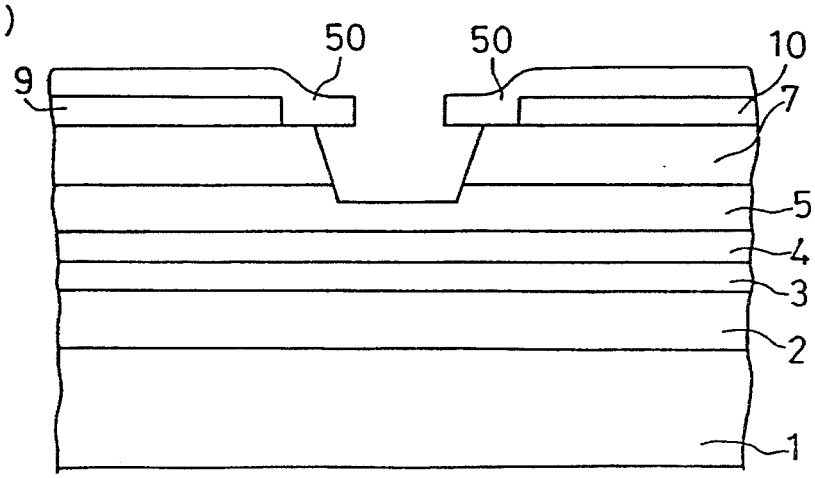
Figure 73:
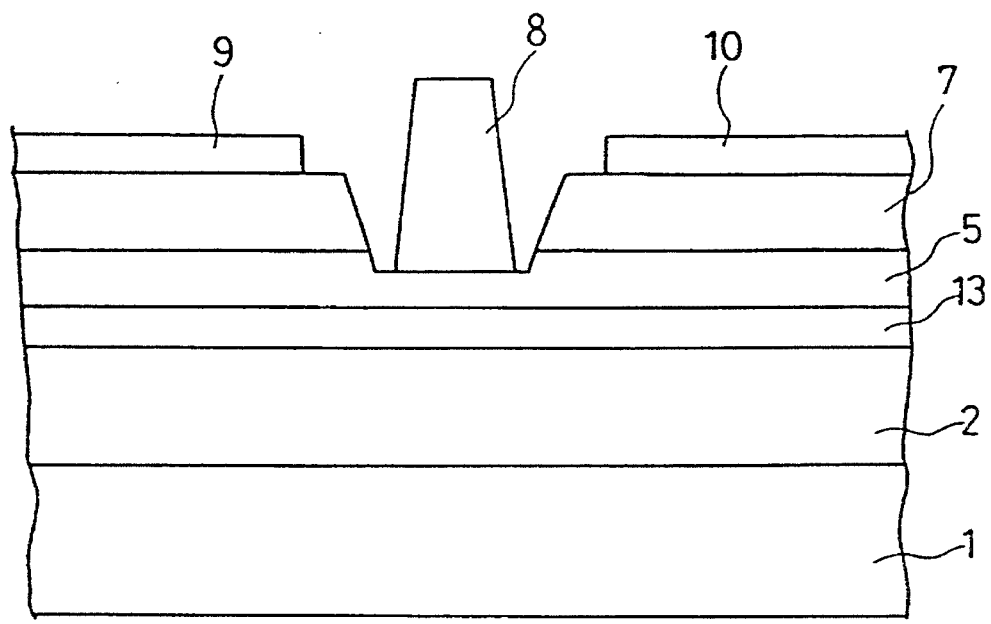
FIG. 73 is a cross-sectional view illustrating a MISFET utilizing an InP substrate in accordance with the prior art.
Figure 74:
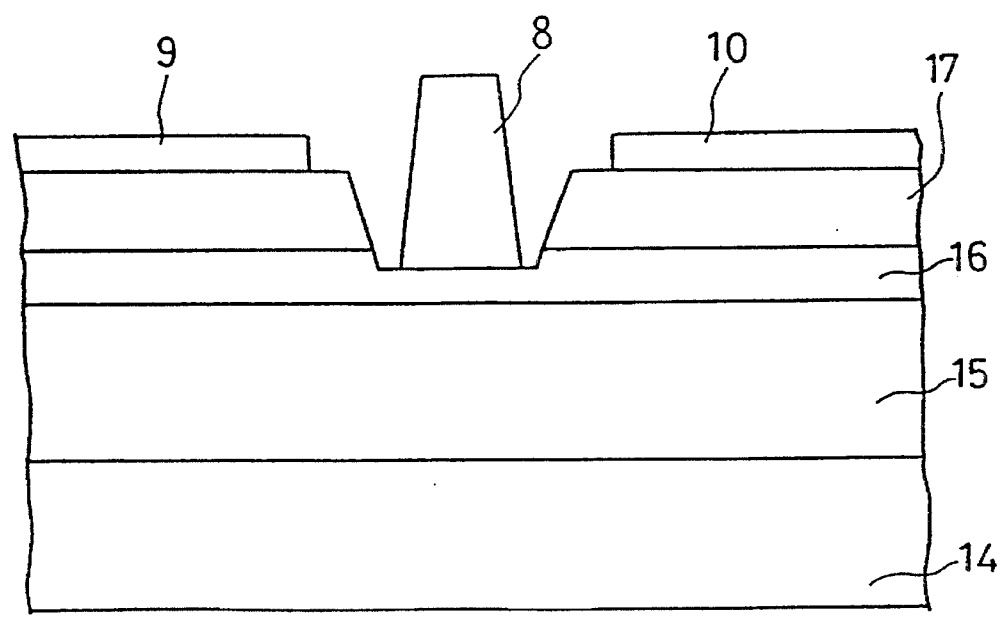
FIG. 74 is a cross-sectional view illustrating a HEMT utilizing a GaAs substrate in accordance with the prior art.
Figure 75:
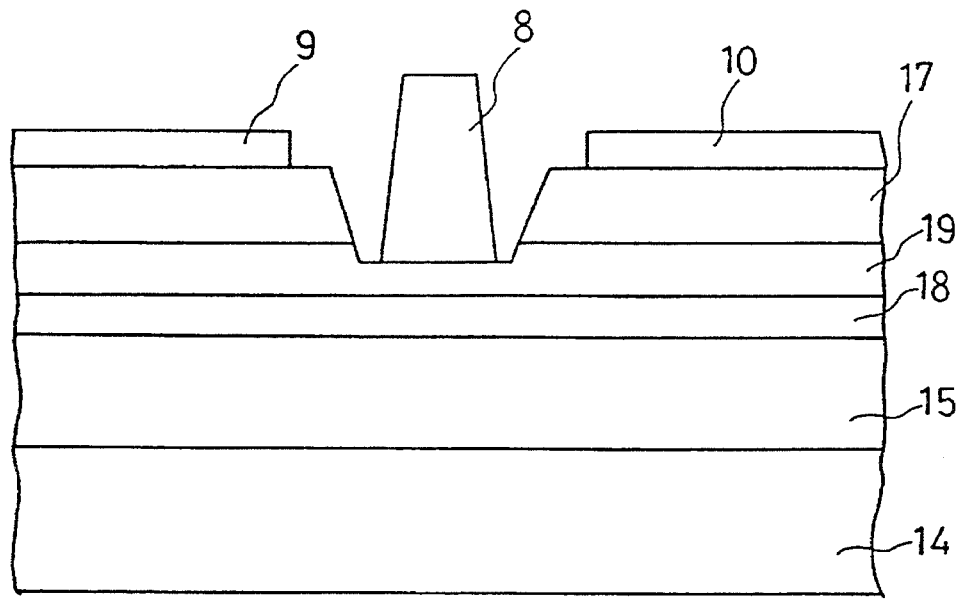
FIG. 75 is a cross-sectional view illustrating a MISFET utilizing a GaAs substrate in accordance with the prior art.
Figure 76:
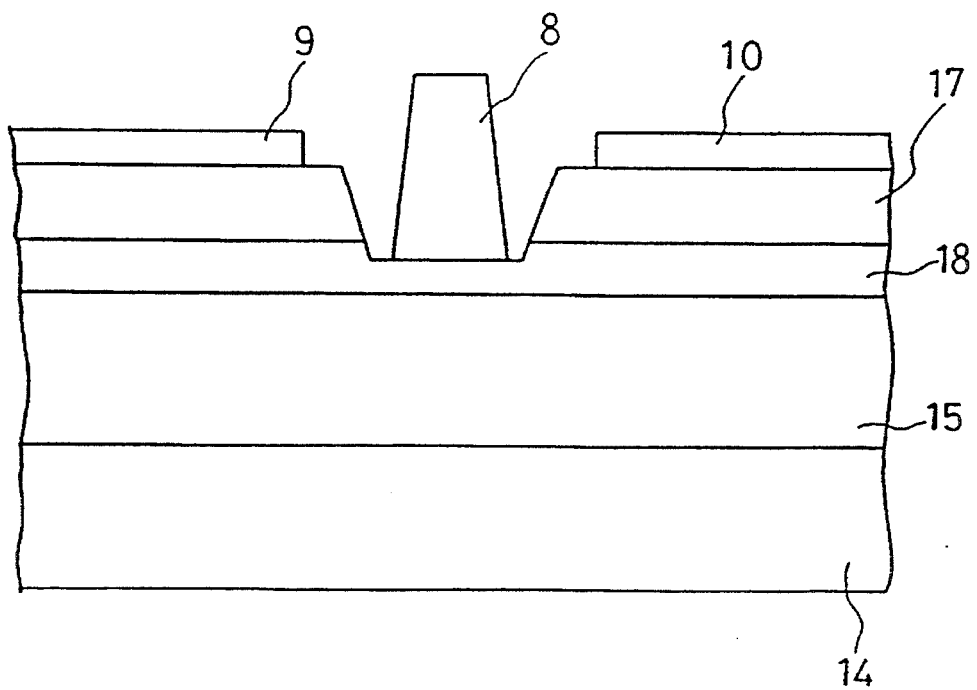
FIG. 76 is a cross-sectional view illustrating a MESFET utilizing a GaAs substrate in accordance with the prior art.
Figure 77:
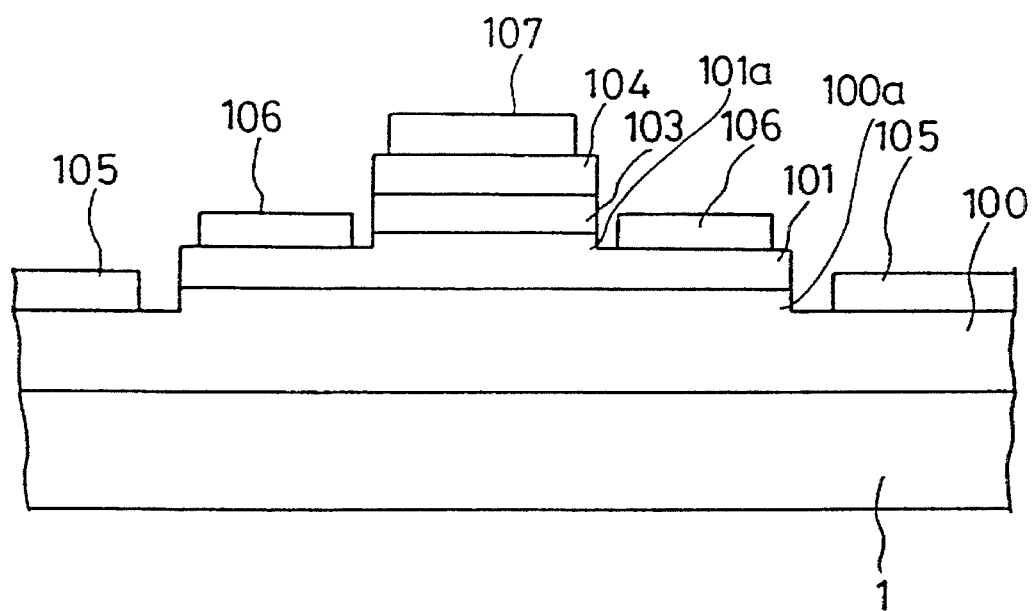
FIG. 77 is a cross-sectional view illustrating a HBT utilizing an InP substrate in accordance with the prior art.
Figure 78A:
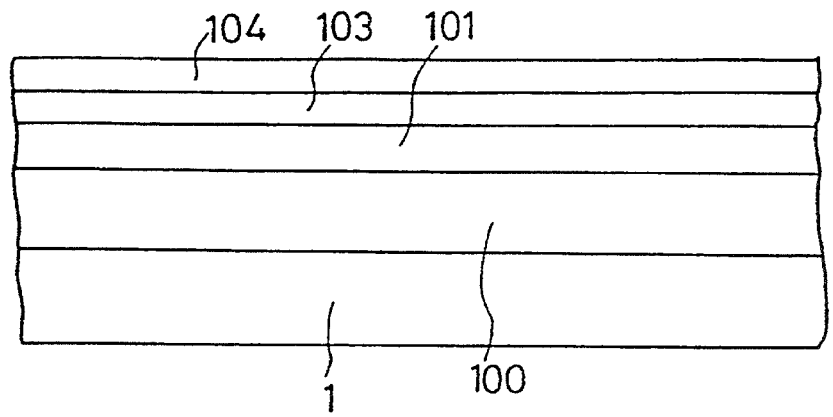
FIGS. 78(a)–78(c) are cross-sectional views illustrating a method for producing the HBT of FIG. 77.
Figure 78B:
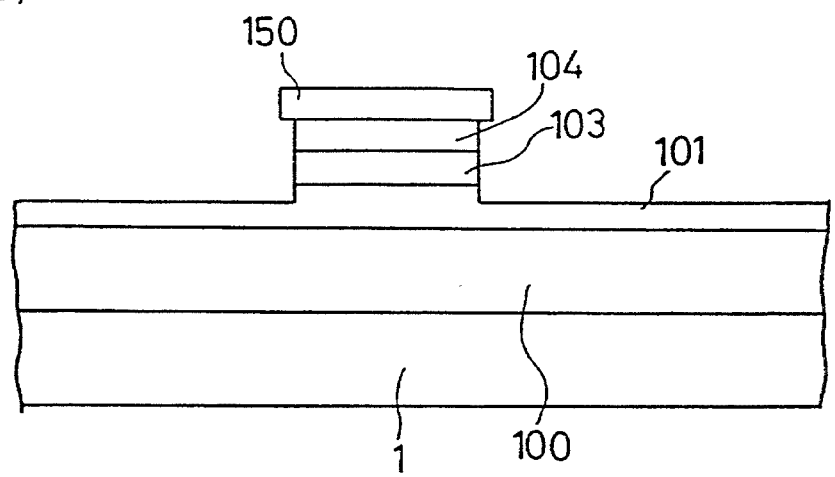
Figure 78C:
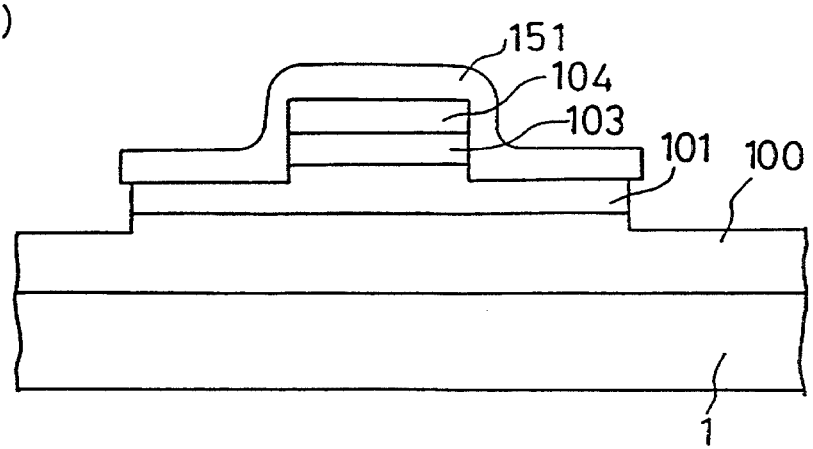

FIGS. 70(a)–70(c) illustrate etching rates of the above-described three kinds of etchants of the InGaAs layer about 0.2 microns thick on the InP substrate. As shown in the figures, whichever etchant is used, it is possible to accurately stop the etching when the depth of the recess reaches 0.2 micron.

Figure 2:
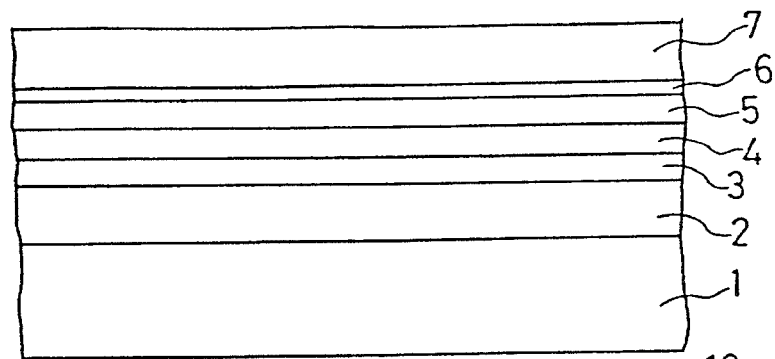
FIGS. 2(a)–2(d) are cross-sectional views illustrating a method for producing the semiconductor device of FIG. 1.
Figure 2:
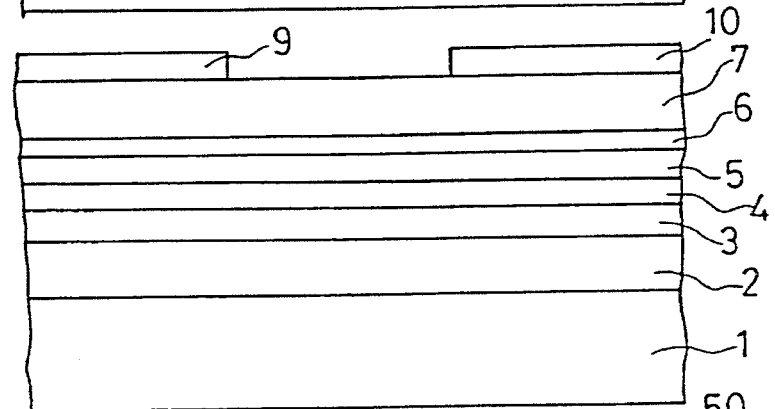
Figure 2:
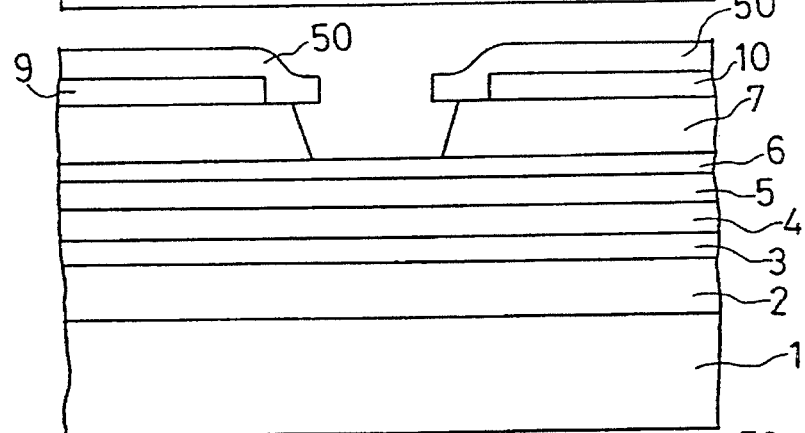
Figure 2:
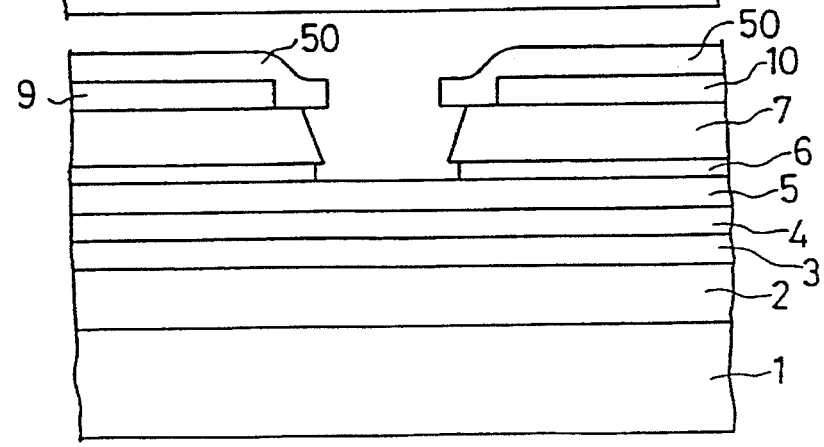

After the recess etching, the InP etching stopper layer 6 exposed at the bottom of the recess is etched away using hydrochloric acid as shown in FIG. 2(d). It is well known that hydrochloric acid etches InP but does not etch InAlAs.

Thereafter, a gate metal, such as aluminum, is deposited on the entire surface to a thickness of about 400 nm and the photoresist mask 50 and the overlying portions of the gate metal are removed by lift-off, forming a gate electrode in contact with the InAlAs Schottky junction formation layer 5. Thus, the HEMT shown in FIG. 1 is completed.

According to the first embodiment of the present invention, the InGaAs and InAlAs layers as III-V compound semiconductor layers including As as a main constituent group V element (hereinafter referred to as first compound semiconductor layers) and the InP layer as a III-V compound semiconductor layer including P as a main constituent group V element (hereinafter referred to as second compound semiconductor) are laminated, and the recess etching is applied to the laminated structure using the etchant comprising hydrogen peroxide, water, and at least one of tartaric acid, phosphoric acid, and sulfuric acid, which etchant selectively etches the first compound semiconductor layers. Therefore, it is possible to accurately stop the etching at the surface of the second compound semiconductor layer, reducing variations in the depth of the recess. As the result, variations in electrical characteristics of the HEMT are reduced.

Figure 3:
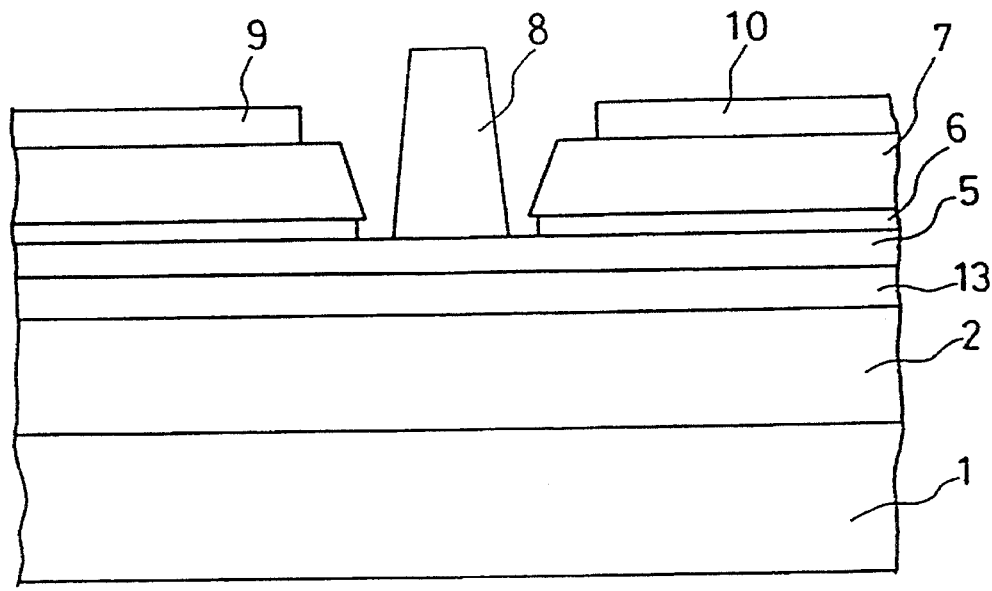
FIG. 3 is a cross-sectional view illustrating a semiconductor device in accordance with a second embodiment of the present invention.

FIG. 3 is a cross-sectional view illustrating a MISFET according to a second embodiment of the present invention. In FIG. 3, the same reference numerals as in FIG. 1 designate the same parts. This MISFET includes an n type InGaAs channel layer 13 about 10 nm thick having a dopant concentration of about $1 \times 10^{18}$ cm$^{-3}$ in place of the InGaAs channel layer 3 and the InAlAs electron supply layer 4 of FIG. 1.

In all embodiments described hereinafter, layers beneath the etching stopper layer are grown by a crystal growth method, such as MBE, MOCVD, and the like, and layers designated by the same numeral have the same thicknesses and carrier concentrations.

Figure 4:
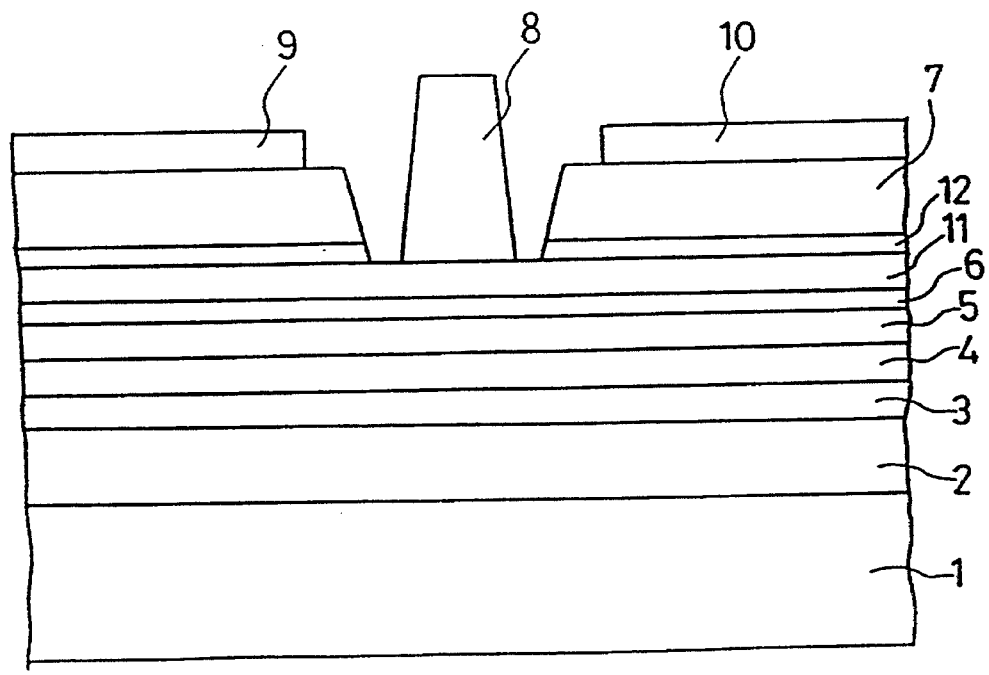
FIG. 4 is a cross-sectional view illustrating a semiconductor device in accordance with a third embodiment of the present invention.

FIG. 4 is a sectional view illustrating a HEMT employing an InP substrate in accordance with a third embodiment of the present invention. In this embodiment, a second InAlAs Schottky junction formation layer 11 about 10 nm thick and a second InP etching stopper layer 12 about 5 nm thick are inserted between the InP etching stopper layer 6 and the InGaAs ohmic contact layer 7. Therefore, the recess etching using the above-described etchant comprising hydrogen peroxide water and acid stops at the second InP etching stopper layer 12. Thereafter, the second etching stopper layer 12 exposed at the bottom of the recess is removed by hydrochloric acid, and the gate electrode 8 is formed on the second Schottky junction formation layer 11.

Figure 5:
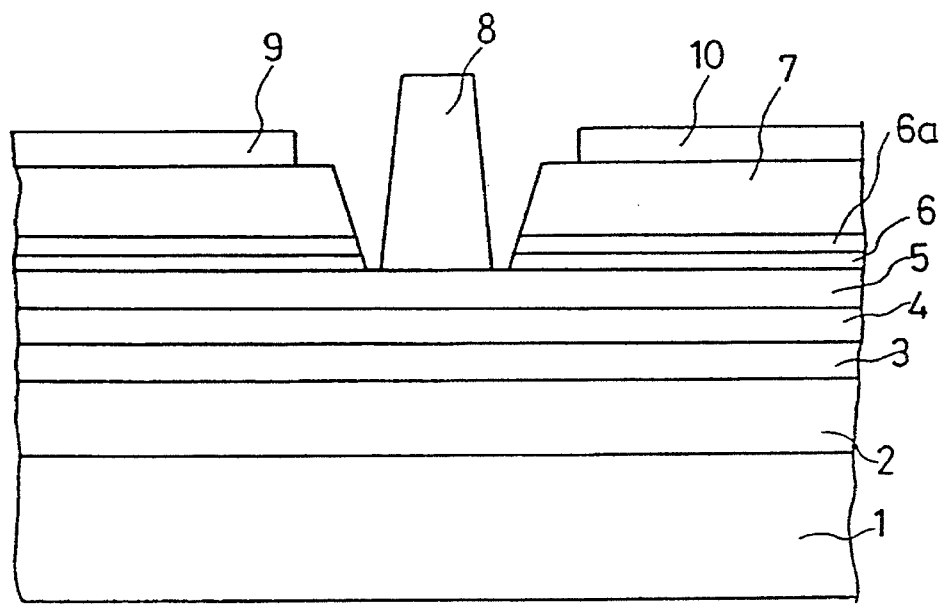
FIG. 5 is a cross-sectional view illustrating a semiconductor device in accordance with a fourth embodiment of the present invention.

FIG. 5 is a cross-sectional view illustrating a HEMT employing an InP substrate in accordance with a fourth embodiment of the present invention. In this embodiment, the InP etching stopper layer 6 includes an InGaAsP layer 6a. More specifically, during the growth of the InGaAs ohmic contact layer 7, Al and Ga separated from the InGaAs layer 7 are mixed into the upper portion of the InP etching stopper layer 6, forming the InGaAsP layer 6a.

Figure 6:
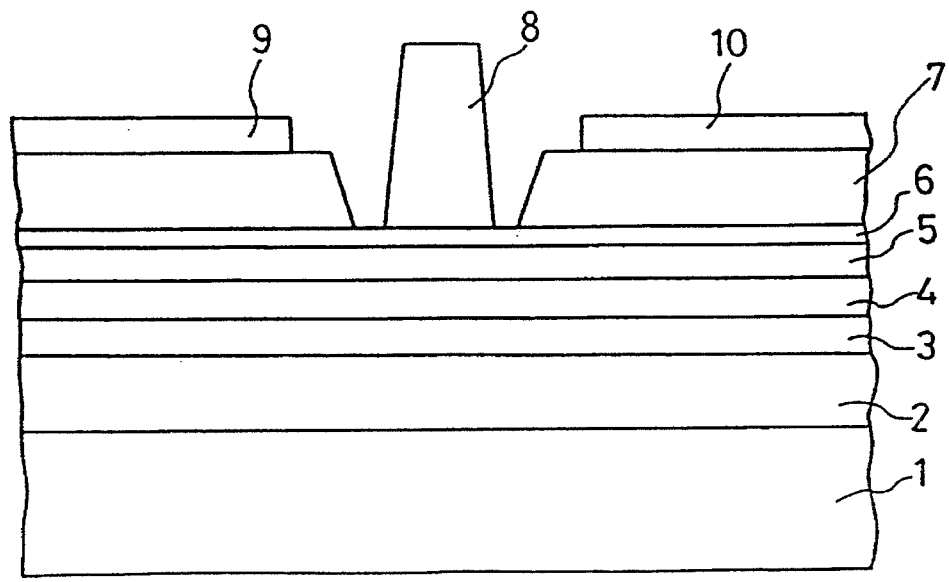
FIG. 6 is a cross-sectional view illustrating a semiconductor device in accordance with a fifth embodiment of the present invention.

FIG. 6 is a cross-sectional view illustrating a HEMT employing an InP substrate in accordance with a fifth embodiment of the present invention. In this embodiment, after the recess etching shown in FIG. 2(c), the InP etching stopper layer 6 is not removed and the gate electrode 8 is formed on the InP etching stopper layer 6.

Figure 7:
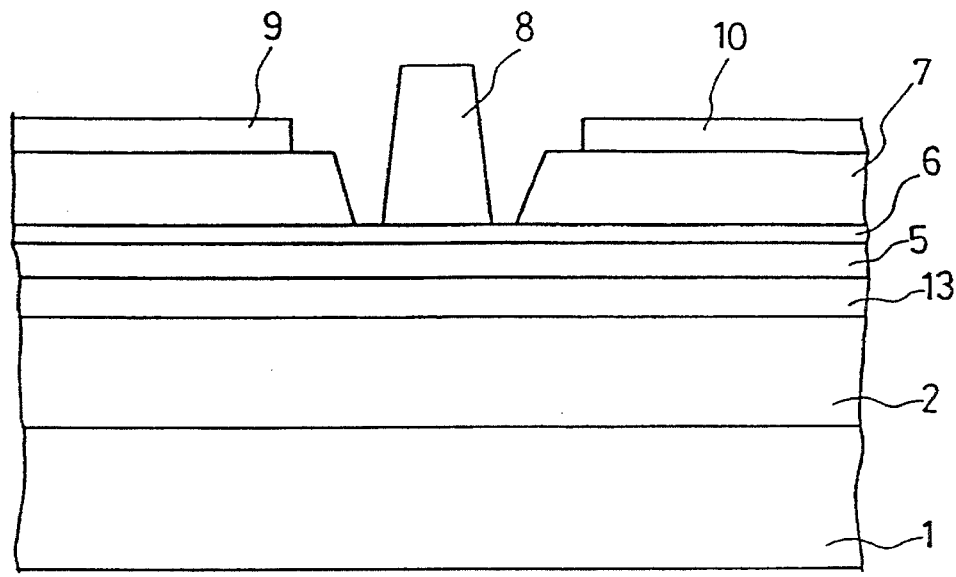
FIG. 7 is a cross-sectional view illustrating a semiconductor device in accordance with a sixth embodiment of the present invention.

FIG. 7 is a cross-sectional view illustrating a MISFET employing an InP substrate in accordance with a sixth embodiment of the present invention. In this embodiment, after the recess etching using the above-described etchant comprising hydrogen peroxide water and acid, the InP etching stopper layer 6 is not removed and the gate electrode 8 is formed on the InP etching stopper layer 6.

Figure 8:
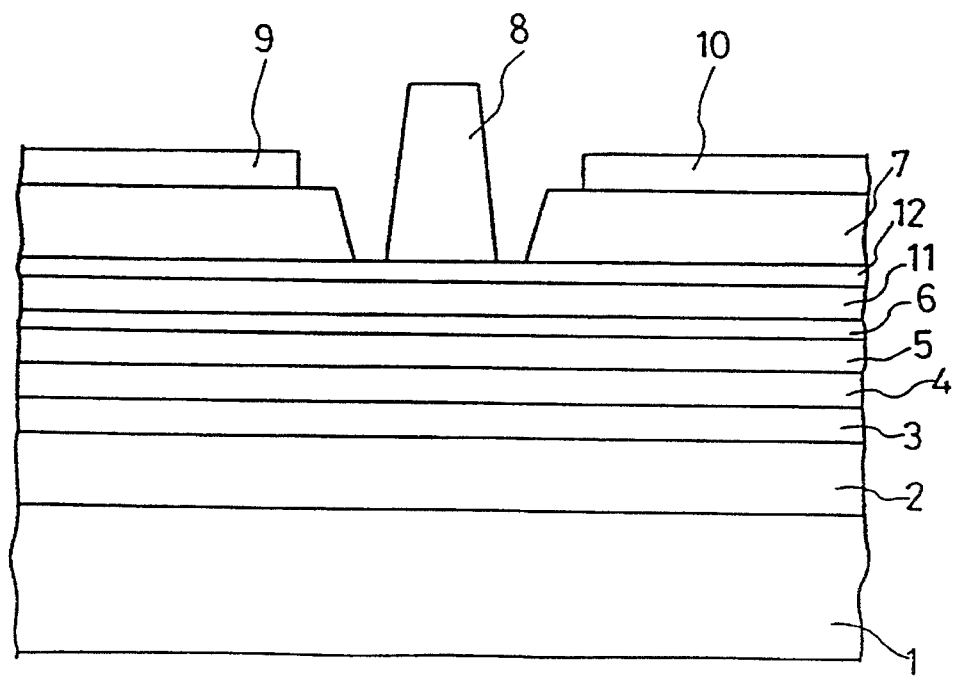
FIG. 8 is a cross-sectional view illustrating a semiconductor device in accordance with a seventh embodiment of the present invention.

FIG. 8 is a cross-sectional view illustrating a HEMT employing an InP substrate in accordance with a seventh embodiment of the present invention. In this embodiment, a second InAlAs Schottky junction formation layer 11 about 10 nm thick and a second InP etching stopper layer 12 about 5 nm thick are inserted between the InP etching stopper layer 6 and the InGaAs ohmic contact layer 7. Therefore, the recess etching using the etchant comprising hydrogen peroxide, water, and acid stops at the second InP etching stopper layer 12. Thereafter, the gate electrode 8 is formed on the second etching stopper layer 12.

Figure 9:
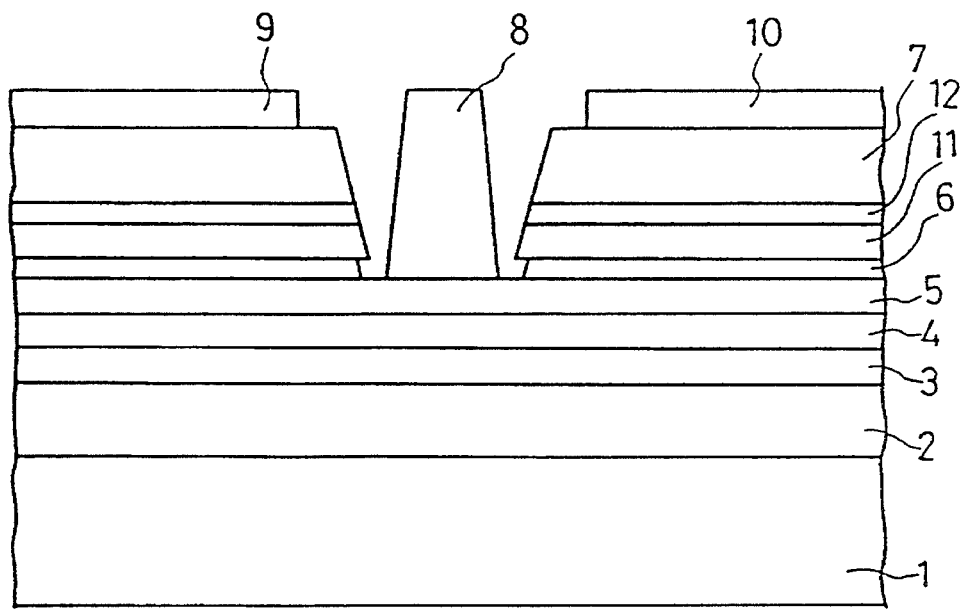
FIG. 9 is a cross-sectional view illustrating a semiconductor device in accordance with an eighth embodiment of the present invention.

FIG. 9 is a cross-sectional view illustrating a HEMT employing an InP substrate in accordance with an eighth embodiment of the present invention. In this embodiment, a second InAlAs Schottky junction formation layer 11 about 10 nm thick and a second InP etching stopper layer 12 about 5 nm thick are inserted between the InP etching stopper layer 6 and the InGaAs ohmic contact layer 7. Therefore, the recess etching using the etchant comprising hydrogen peroxide, water, and acid stops at the second InP etching stopper layer 12. Then, the second etching stopper layer 12 in the recess is removed by hydrochloric acid. Thereafter, the second InAlAs Schottky junction formation layer 11 and the InP etching stopper layer 6 are etched using the above-described etchants, and the gate electrode 8 is formed on the InAlAs Schottky junction formation layer 5.

Figure 10:
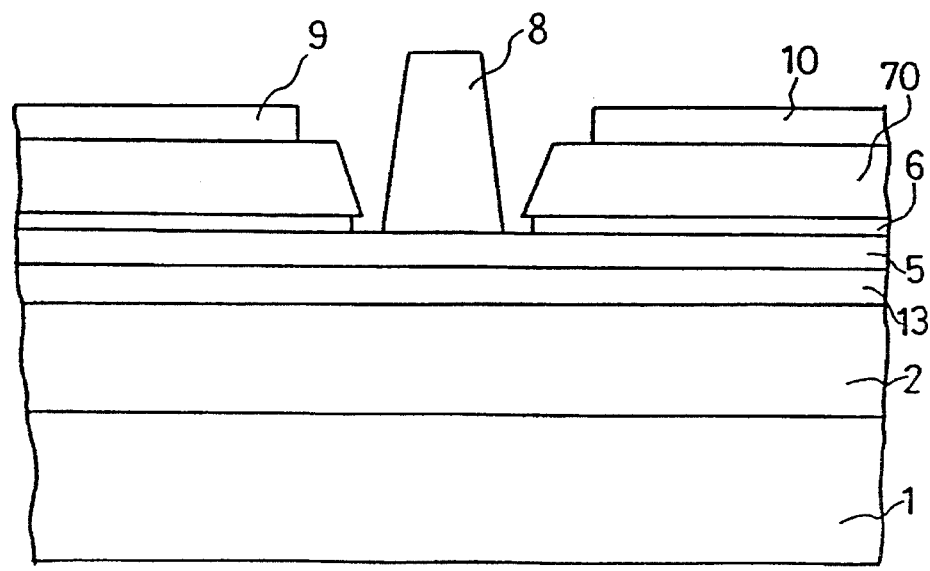
FIG. 10 is a cross-sectional view illustrating a semiconductor device in accordance with a ninth embodiment of the present invention.

FIG. 10 is a cross-sectional view illustrating a MISFET employing an InP substrate in accordance with a ninth embodiment of the present invention. In FIG. 10, the same reference numerals as in FIG. 3 designate the same parts. This MISFET includes an n type InAlAs ohmic contact layer 70 about 50 nm thick having a dopant concentration of about $4\times10^{18}$ cm$^{-3}$ in place of the n type InGaAs ohmic contact layer 7 of FIG. 1. The gate electrode 8 is formed after the InP etching stopper layer 6 in the recess is removed.

Figure 12:
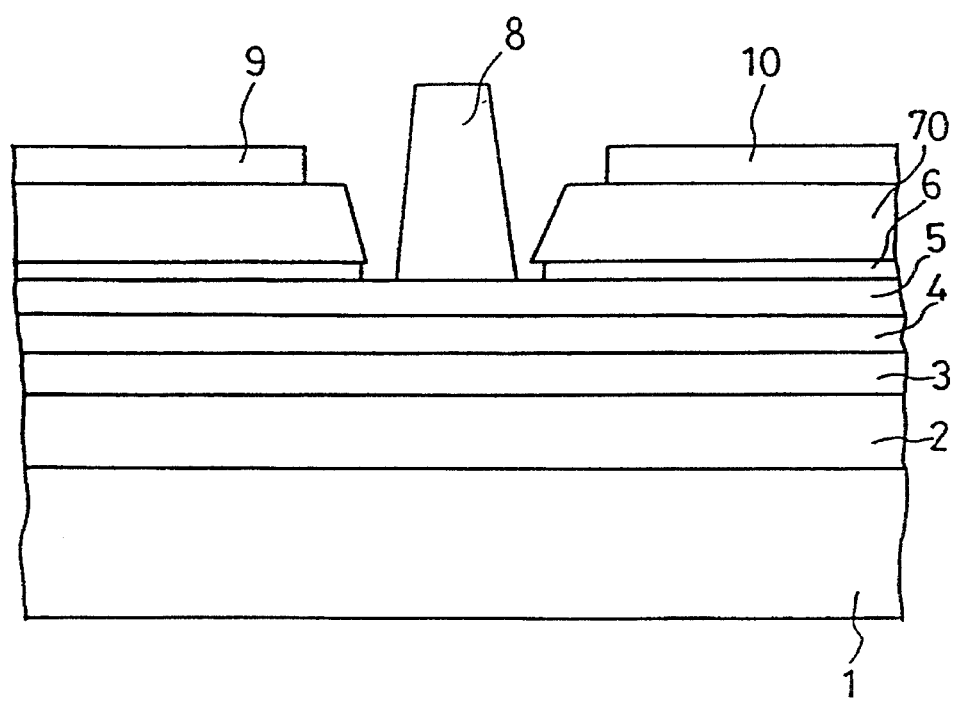
FIG. 12 is a cross-sectional view illustrating a semiconductor device in accordance with a tenth embodiment of the present invention.

FIG. 12 is a cross-sectional view illustrating a HEMT employing an InP substrate in accordance with a tenth embodiment of the present invention. In FIG. 12, the same reference numerals as in FIG. 1 designate the same parts. This HEMT includes an n type InAlAs ohmic contact layer 70 about 50 nm thick having a dopant concentration of about $4\times10^{18}$ cm$^{-3}$ in place of the n type InGaAs ohmic contact layer 7 of FIG. 1. The gate electrode 8 is formed after the InP etching stopper layer 6 in the recess is removed.

Figure 13:
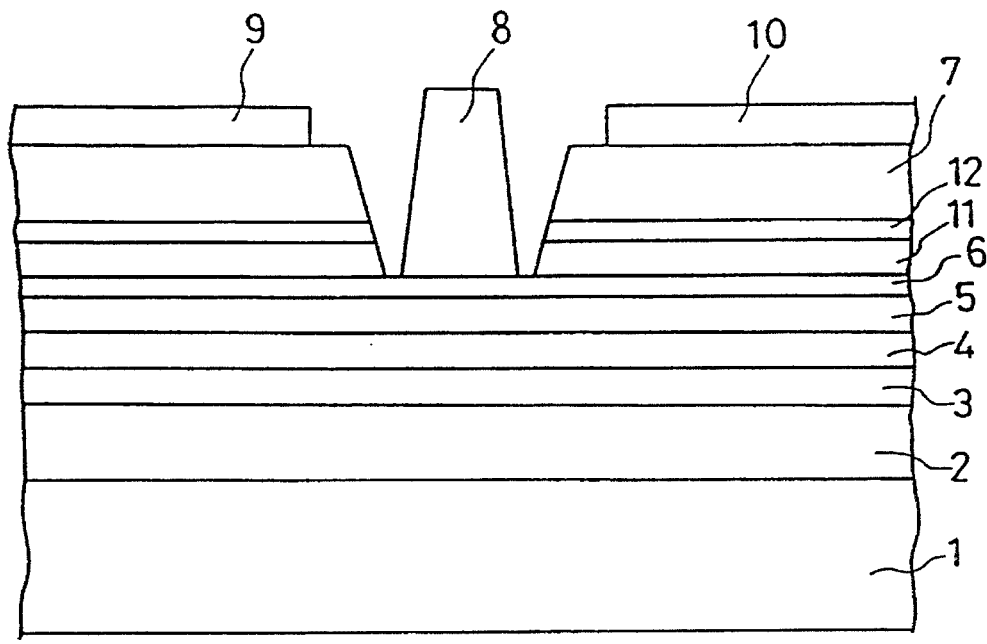
FIG. 13 is a cross-sectional view illustrating a semiconductor device in accordance with a eleventh embodiment of the present invention.

FIG. 13 is a cross-sectional view illustrating a HEMT employing an InP substrate in accordance with an eleventh embodiment of the present invention. In FIG. 13, the same reference numerals as in FIG. 9 designate the same parts. In this embodiment, after the recess etching using the etchant comprising hydrogen peroxide, water, and acid, the InP etching stopper layer 6 is not removed and the gate electrode 8 is formed on the InP etching stopper layer 6.

Figure 11:
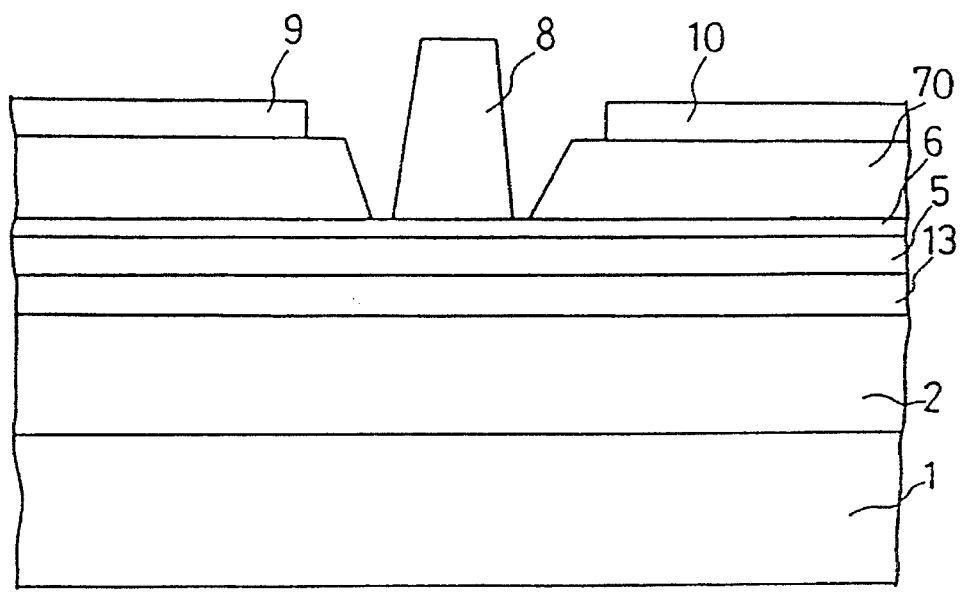
FIG. 11 is a cross-sectional view illustrating a semiconductor device in accordance with a twelfth embodiment of the present invention.

FIG. 11 is a cross-sectional view illustrating a MISFET employing an InP substrate in accordance with a twelfth embodiment of the present invention. In the figure, the same reference numerals as in FIG. 3 designate the same parts. This MISFET includes an n type InAlAs ohmic contact layer 70 in place of the n type InGaAs ohmic contact layer 7 of FIG. 3. After the recess etching using the etchant comprising hydrogen peroxide, water, and acid, the InP etching stopper layer 6 in the recess is not removed and the gate electrode 8 is formed on the InP etching stopper layer 6.

Figure 14:
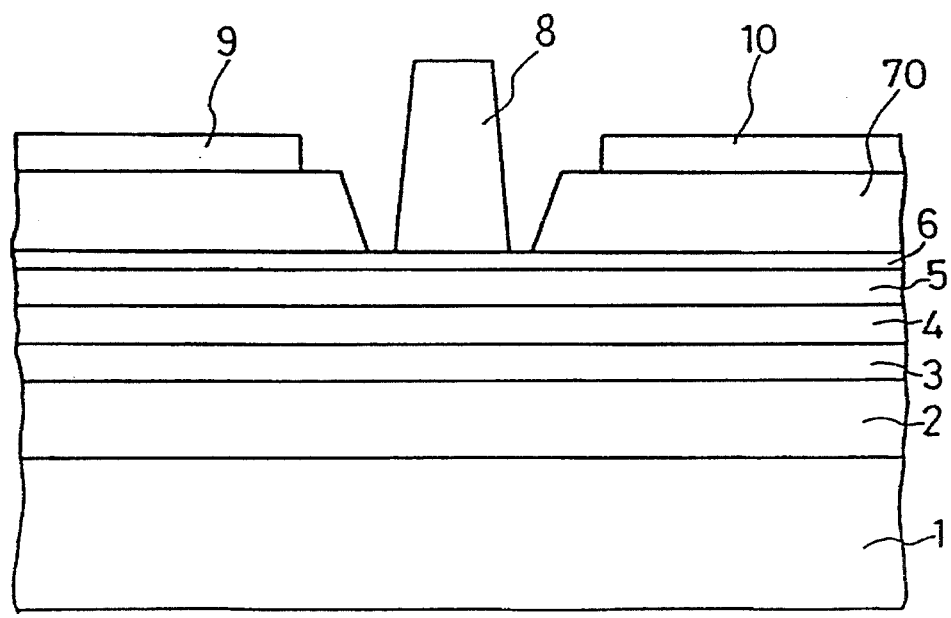
FIG. 14 is a cross-sectional view illustrating a semiconductor device in accordance with a thirteenth embodiment of the present invention.

FIG. 14 is a cross-sectional view illustrating a HEMT employing an InP substrate in accordance with a thirteenth embodiment of the present invention. In FIG. 14, the same reference numerals as in FIG. 12 designate the same parts. In this embodiment, after the recess etching using the etchant comprising hydrogen peroxide, water, and acid, the InP etching stopper layer 6 in the recess is not removed and the gate electrode 8 is formed on the InP etching stopper layer 6.

Figure 15:
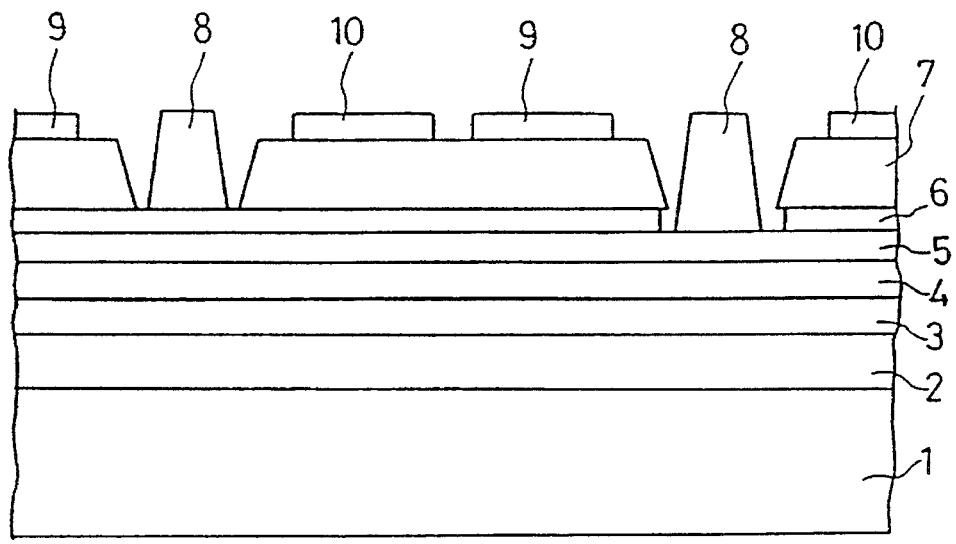
FIG. 15 is a cross-sectional view illustrating a semiconductor device in accordance with a fourteenth embodiment of the present invention.

FIG. 15 is a cross-sectional view illustrating a semiconductor device comprising two HEMTs in accordance with a fourteenth embodiment of the present invention. In this embodiment, the HEMT of FIG. 1 and the HEMT of FIG. 6 are formed on the same substrate. In production, either of the two HEMTs may be formed first.

The pinch-off voltage of the HEMT of FIG. 1 in which the InP etching stopper layer is absent beneath the gate is different from the pinch-off voltage of the HEMT of FIG. 6 in which the InP etching stopper layer is present beneath the gate. When these two transistors are combined on a substrate like complementary transistors, power consumption is reduced. In addition, since the number of transistors in a circuit is reduced, the circuit structure is simplified. In the HEMT of FIG. 1 with no InP layer 6 beneath the gate, pinch-off occurs at a lower minus voltage than in the HEMT of FIG. 6.

Figure 17:
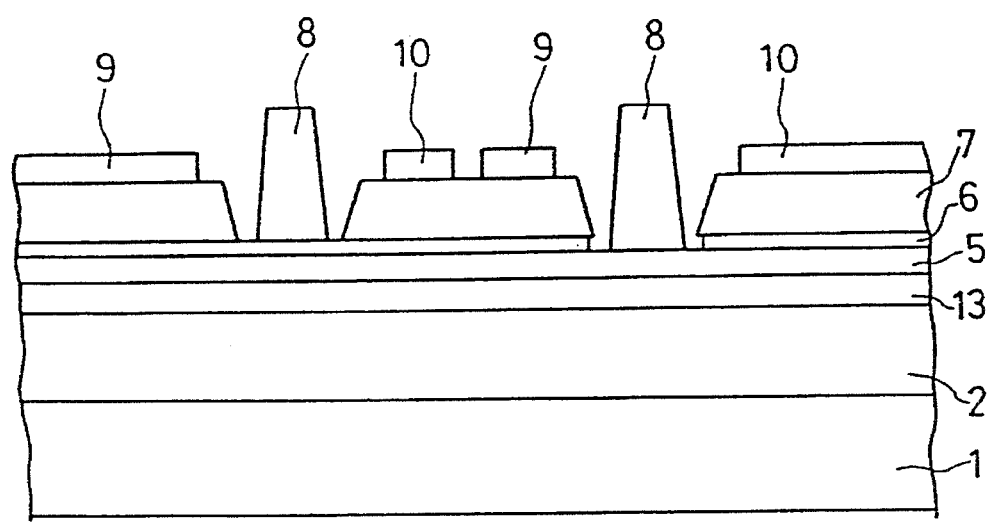
FIG. 17 is a cross-sectional view illustrating a semiconductor device in accordance with a fifteenth embodiment of the present invention.

FIG. 17 is a cross-sectional view illustrating a semiconductor device comprising two MISFETs in accordance with a fifteenth embodiment of the present invention. In this embodiment, the MISFET of FIG. 3 and the MISFET of FIG. 7 are formed on the same substrate.

Figure 18:
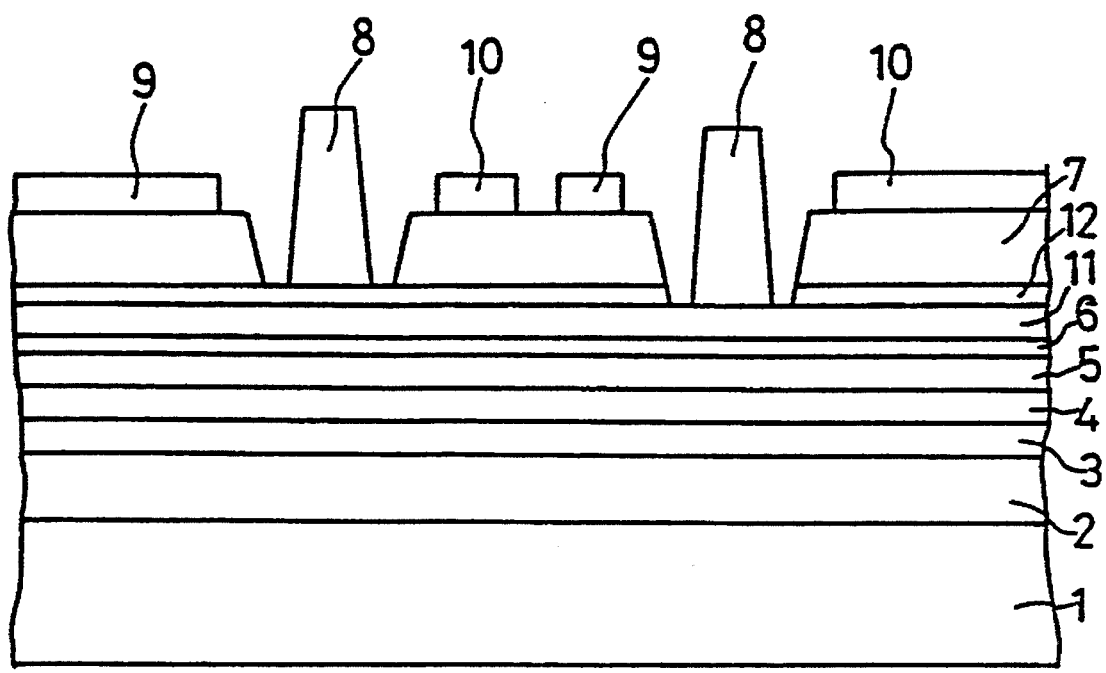
FIG. 18 is a cross-sectional view illustrating a semiconductor device in accordance with a sixteenth embodiment of the present invention.

FIG. 18 is a cross-sectional view illustrating a semiconductor device comprising two HEMTs in accordance with a sixteenth embodiment of the present invention. In this embodiment, the HEMT of FIG. 4 and the HEMT of FIG. 8 are formed on the same substrate.

Figure 19:
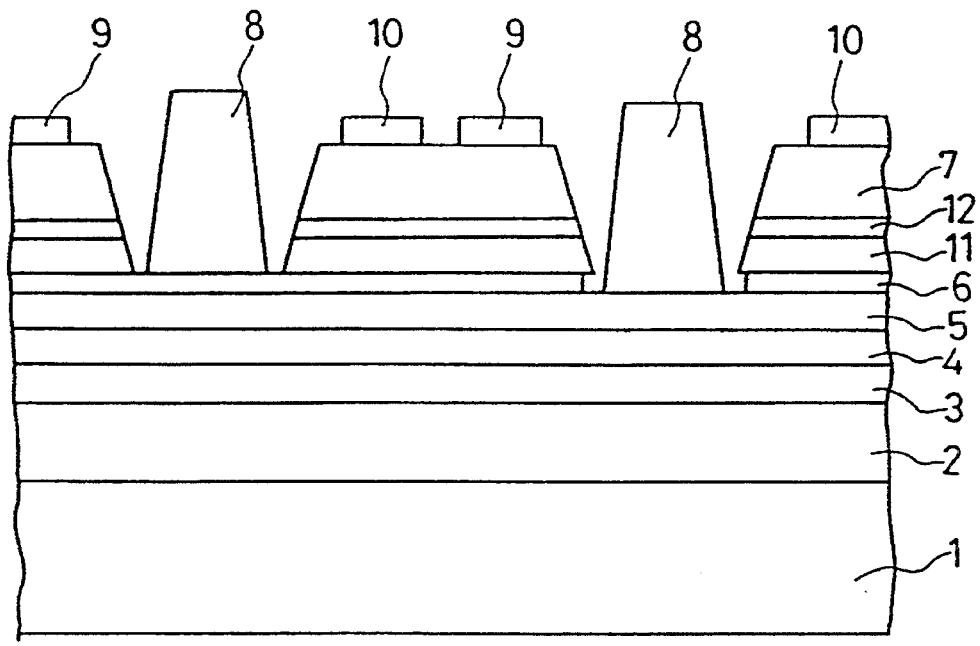
FIG. 19 is a cross-sectional view illustrating a semiconductor device in accordance with a seventeenth embodiment of the present invention.

FIG. 19 is a cross-sectional view illustrating a semiconductor device comprising two HEMTs in accordance with a seventeenth embodiment of the present invention. In this embodiment, the HEMT of FIG. 9 and the HEMT of FIG. 13 are formed on the same substrate.

Figure 20:
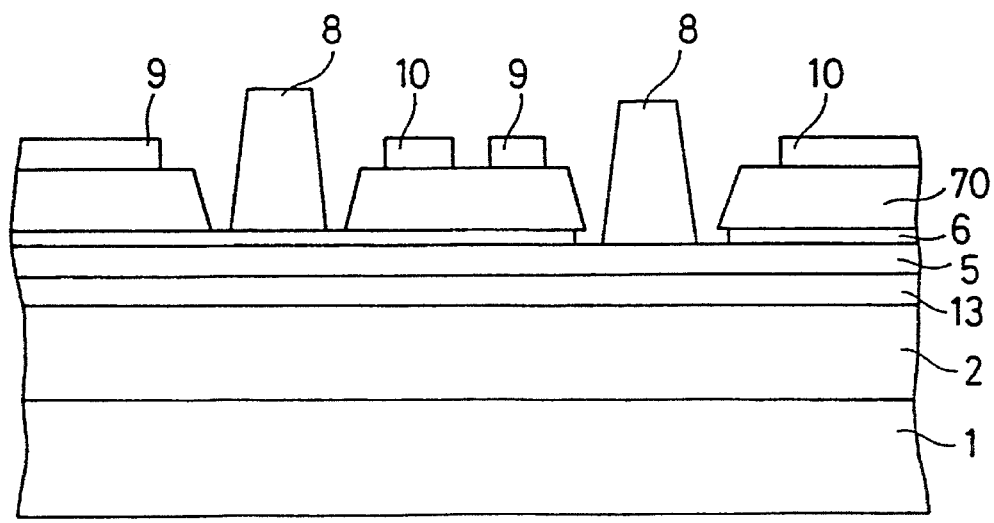
FIG. 20 is a cross-sectional view illustrating a semiconductor device in accordance with a nineteenth embodiment of the present invention.

FIG. 20 is a cross-sectional view illustrating a semiconductor device comprising two MISFETs in accordance with an eighteenth embodiment of the present invention. In this embodiment, the MISFET of FIG. 10 and the MISFET of FIG. 11 are formed on the same substrate.

Figure 16:
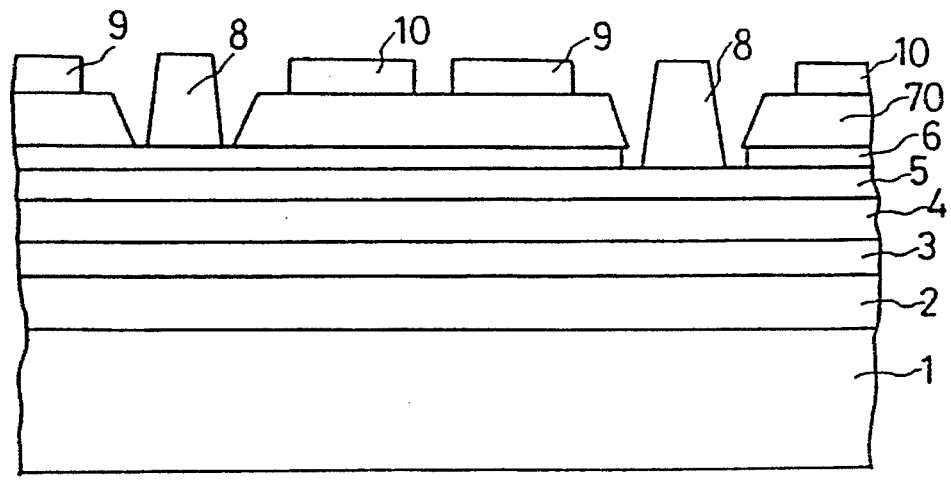
FIG. 16 is a cross-sectional view illustrating a semiconductor device in accordance with an eighteenth embodiment of the present invention.

FIG. 16 is a cross-sectional view illustrating a semiconductor device comprising two HEMTs in accordance with a nineteenth embodiment of the present invention. In this embodiment, the HEMT of FIG. 12 and the HEMT of FIG. 14 are formed on the same substrate.

Figure 21:
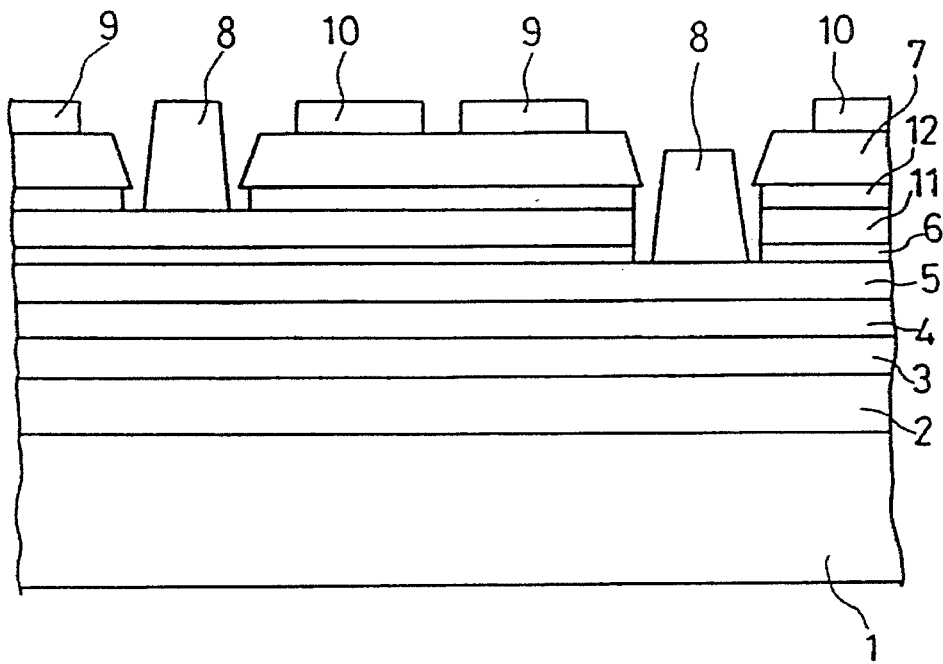
FIG. 21 is a cross-sectional view illustrating a semiconductor device in accordance with a twentieth embodiment of the present invention.

FIG. 21 is a cross-sectional view illustrating a semiconductor device comprising two HEMTs in accordance with a twentieth embodiment of the present invention. In this embodiment, the HEMT of FIG. 4 and the HEMT of FIG. 9 are formed on the same substrate.

Figure 22:
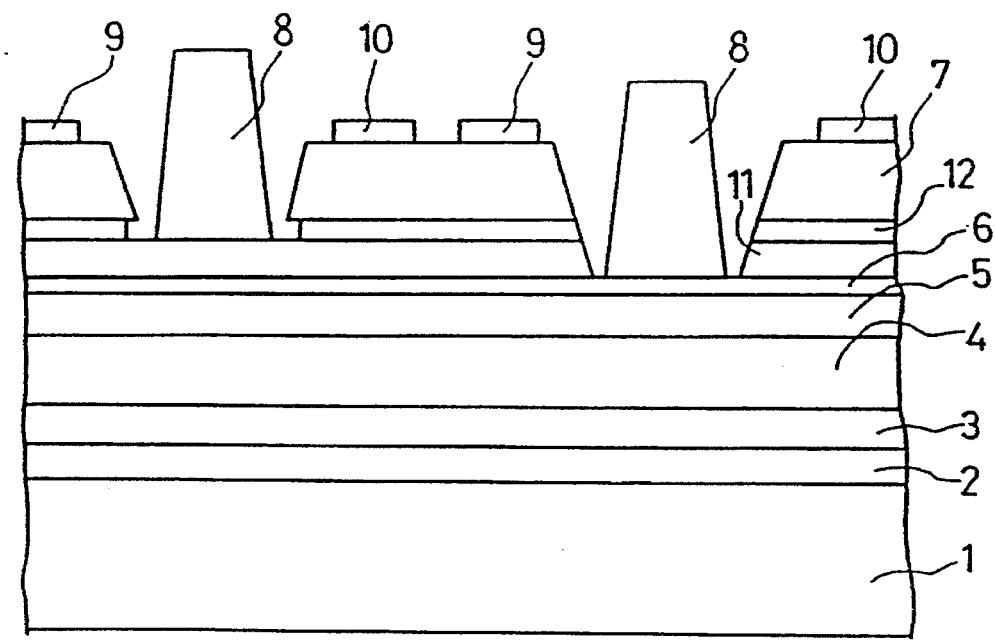
FIG. 22 is a cross-sectional view illustrating a semiconductor device in accordance with a twenty-first embodiment of the present invention.

FIG. 22 is a cross-sectional view illustrating a semiconductor device comprising two HEMTs in accordance with a twenty-first embodiment of the present invention. In this embodiment, the HEMT of FIG. 4 and the HEMT of FIG. 13 are formed on the same substrate.

Figure 23:
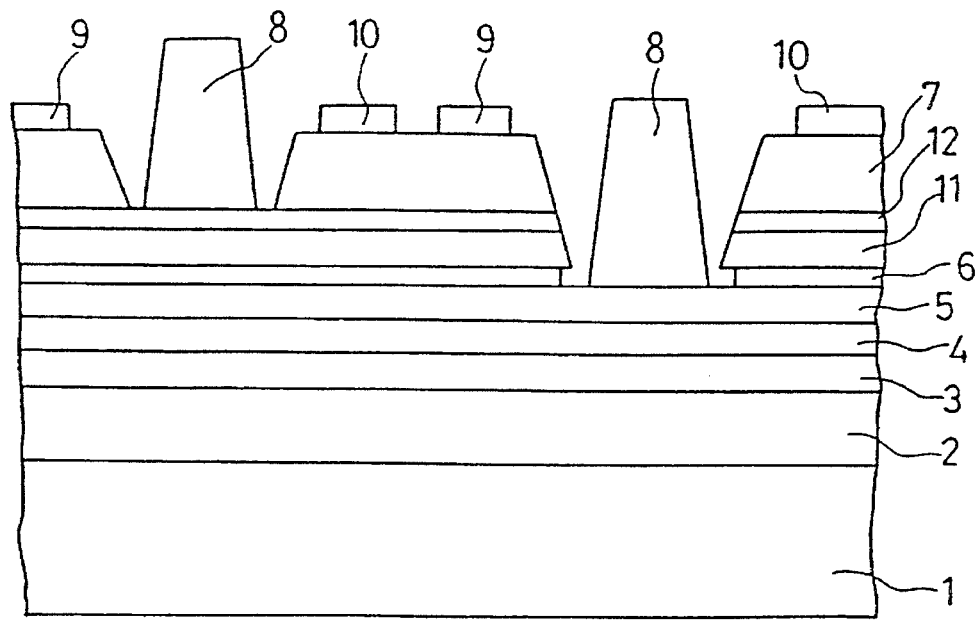
FIG. 23 is a cross-sectional view illustrating a semiconductor device in accordance with a twenty-second embodiment of the present invention.

FIG. 23 is a cross-sectional view illustrating a semiconductor device comprising two HEMTs in accordance with a twenty-second embodiment of the present invention. In this embodiment, the HEMT of FIG. 8 and the HEMT of FIG. 9 are formed on the same substrate.

Figure 24:
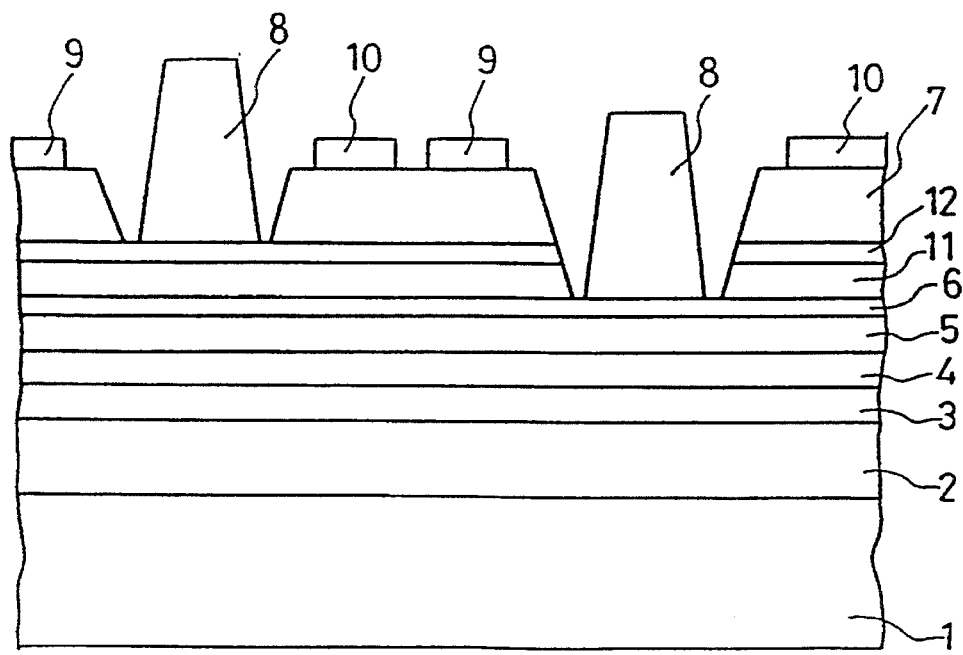
FIG. 24 is a cross-sectional view illustrating a semiconductor device in accordance with a twenty-third embodiment of the present invention.

FIG. 24 is a cross-sectional view illustrating a semiconductor device comprising two HEMTs in accordance with a twenty-third embodiment of the present invention. In this embodiment, the HEMT of FIG. 8 and the HEMT of FIG. 13 are formed on the same substrate.

Figure 25:
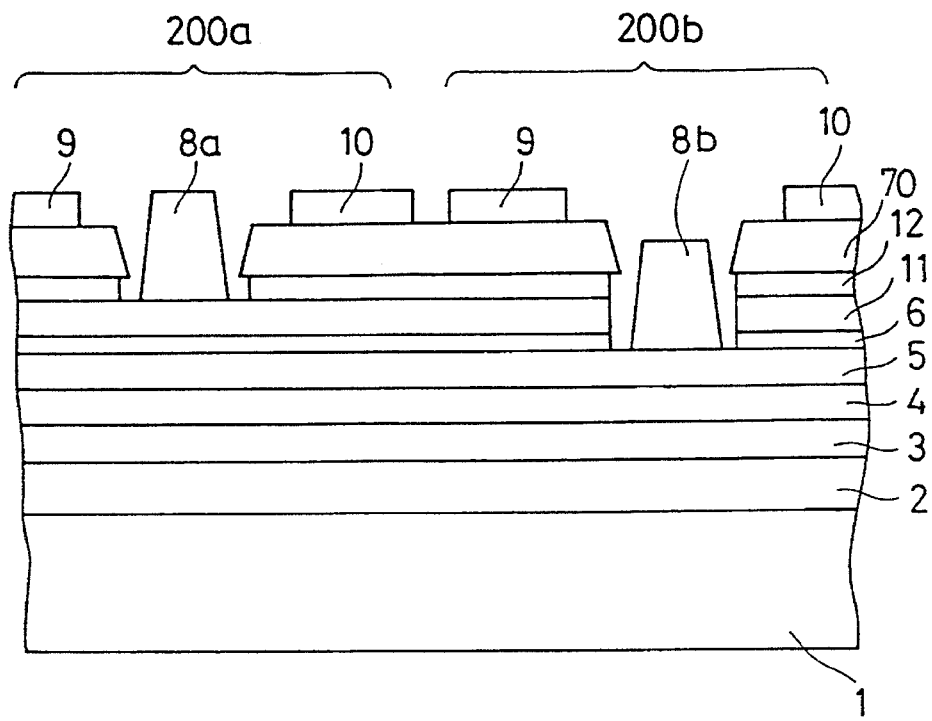
FIG. 25 is a cross-sectional view illustrating a semiconductor device in accordance with a twenty-fourth embodiment of the present invention.

FIG. 25 is a cross-sectional view illustrating a semiconductor device comprising two HEMTs in accordance with a twenty-fourth embodiment of the present invention. In this semiconductor device, a first InAlAs Schottky junction formation layer 5, a first InP etching stopper layer 6, a second InAlAs Schottky junction formation layer 11, and a second InP etching stopper layer 12 are successively disposed on the n type InAlAs electron supply layer 4. In producing the gate recesses of the two HEMTs 200a and 200b, first of all, prescribed portions of the n type InAlAs ohmic contact layer 19 are etched using the etchant comprising hydrogen peroxide, water, and at least one of tartaric acid, phosphoric acid, and sulfuric acid to expose the surface of the second InP etching stopper layer 12. Then, the second InP etching stopper layer 12 in the gate region of the HEMT 200a is removed to expose the second InAlAs Schottky junction formation layer 11, and the gate electrode 8a is formed on the second Schottky junction formation layer 11. Then, the second InAlAs Schottky junction formation layer 11 in the gate region of the HEMT 200b is etched using the above-described etchant to expose the surface of the first InP etching stopper layer 6. Then, the first InP etching stopper layer 6 in the gate region of the HEMT 200b is etched with hydrochloric acid to expose the surface of the first InAlAs Schottky junction formation layer 5, and the gate electrode 8b is formed on the first Schottky junction formation layer 5. Also in this case, either of the HEMTs 200a and 200b may be produced first.

Figure 26:
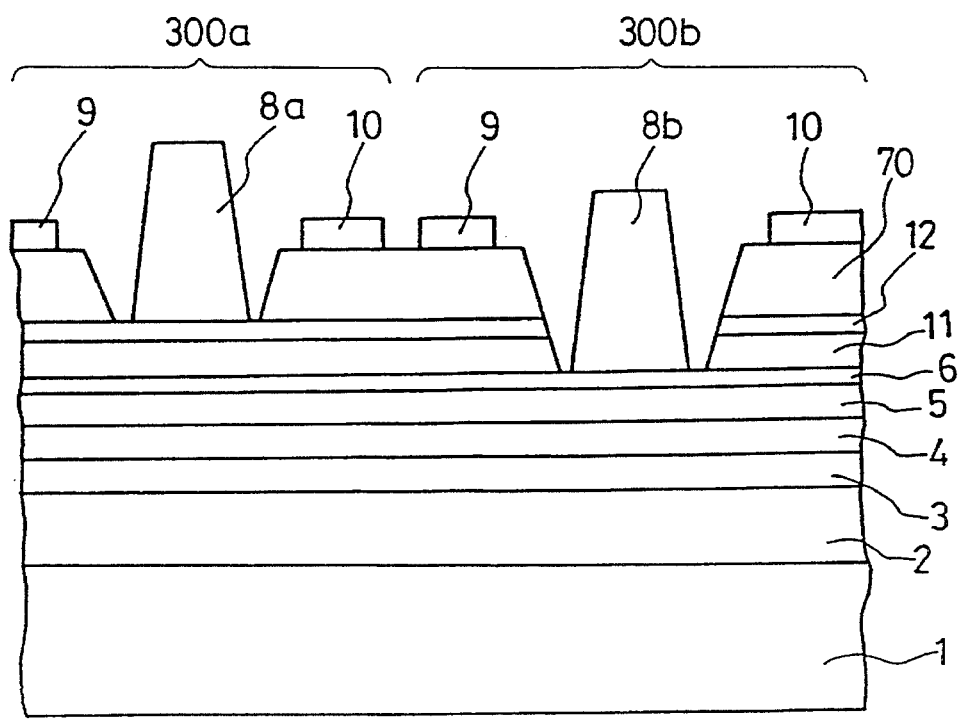
FIG. 26 is a cross-sectional view illustrating a semiconductor device in accordance with a twenty-fifth embodiment of the present invention.

FIG. 26 is a cross-sectional view illustrating a semiconductor device comprising two HEMTs in accordance with a twenty-fifth embodiment of the present invention. In the figure, the same reference numerals as in FIG. 25 designate the same parts. In producing gate recesses of the two HEMTs 300a and 300b, first of all, prescribed portions of the n type InAlAs ohmic contact layer 19 are etched using the above-described etchant comprising hydrogen peroxide, water, and acid to expose the surface of the second InP etching stopper layer 12. Then, the gate electrode 8a of the HEMT 300a is formed on the second InP etching stopper layer 12. Thereafter, the second InP etching stopper layer 12 and the second InAlAs Schottky junction formation layer 11 in the gate region of the HEMT 300b are etched away to expose the surface of the first InP etching stopper layer 6, and the gate electrode 8b of the HEMT 300b is formed on the first InP layer 6.

Figure 27:
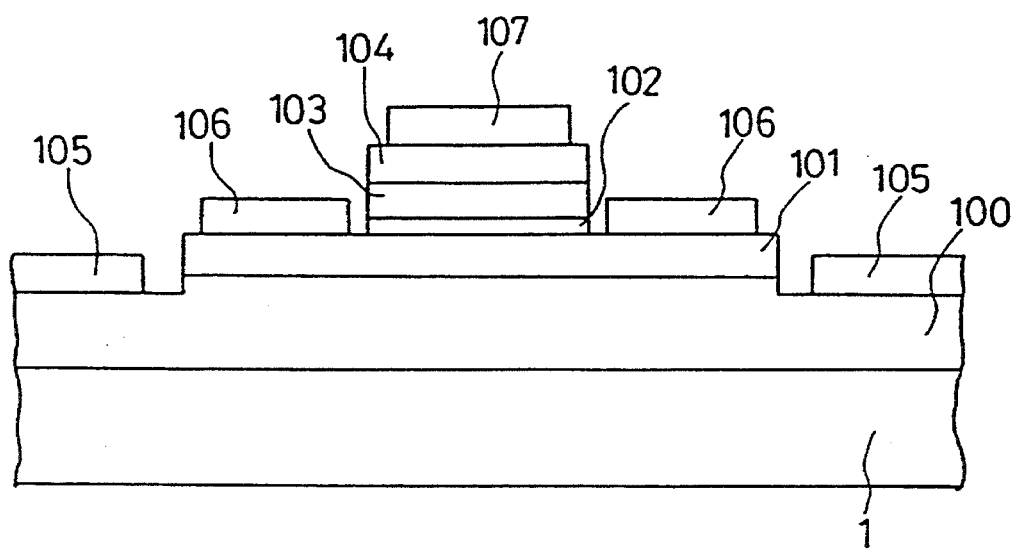
FIG. 27 is a cross-sectional view illustrating a semiconductor device in accordance with a twenty-sixth embodiment of the present invention.

FIG. 27 is a cross-sectional view illustrating a HBT employing an InP substrate in accordance with a twenty-sixth embodiment of the present invention. In the figure, reference numeral 1 designates an InP substrate. An n type InGaAs collector layer 100 having a ridge is disposed on the InP substrate 1, and collector electrodes 105 are disposed on the collector layer 100 at opposite sides of the ridge. A p type InGaAs base layer 101 is disposed on the ridge of the collector layer 100, and base electrodes 106 are disposed on the base layer 101 spaced from each other. An n type InP etching stopper layer 102 is disposed on the p type InGaAs base layer 101 between the base electrodes 106. An n type InAlAs emitter layer 103 and an n$^+$ type InGaAs emitter contact layer 104 are disposed on the InP etching stopper layer 102. An emitter electrode 107 is disposed on the n$^+$ type InGaAs emitter contact layer 104. In this embodiment, the base electrodes 106 and the InP etching stopper layer 102 are disposed on the same level, i.e., on the same plane, on the InGaAs base layer 101.

Figure 28:
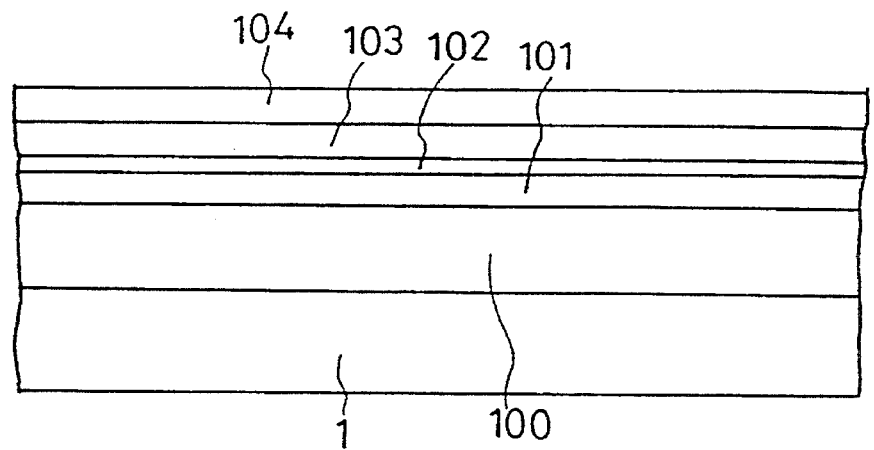
FIGS. 28(a)–28(c) are cross-sectional views illustrating a method for producing the semiconductor device of FIG. 27.
Figure 28:
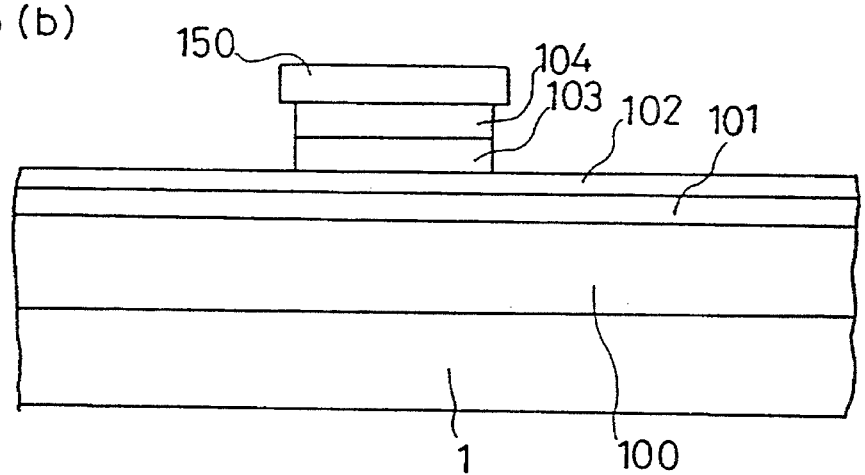
Figure 28:
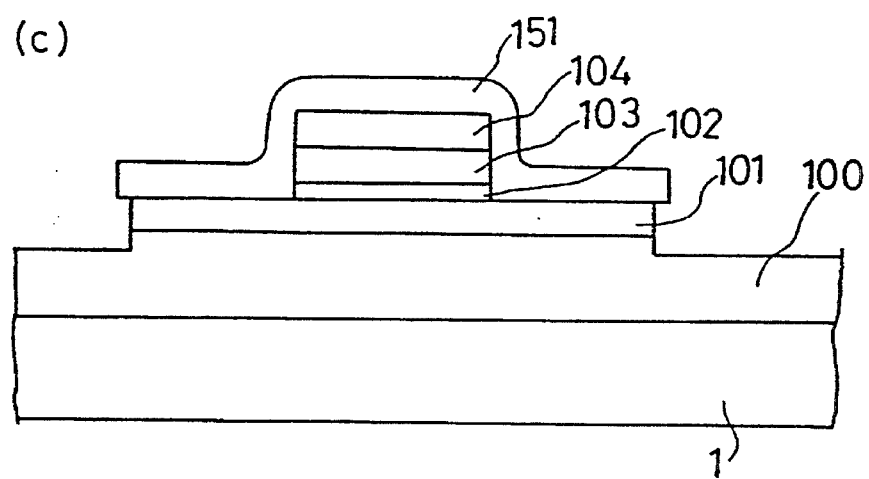

A method for producing the HBT of FIG. 27 is illustrated in FIGS. 28(a)–28(c).

Initially, there are successively grown on the InP substrate 1, the n type InGaAs collector layer 100 about 1 micron thick having a dopant concentration of about $5\times10^{16}$ cm$^{-3}$, the p type InGaAs base layer 101 about 100 nm thick having a dopant concentration of about $1\times10^{19}$ cm$^{-3}$, the n type InP etching stopper layer 102 about 10 nm thick, the n type InAlAs emitter layer 103 about 150 nm thick having a dopant concentration of about $5\times10^{17}$ cm$^{-3}$, and the n$^+$ type InGaAs emitter contact layer 104 about 100 nm thick having a dopant concentration of about $1\times10^{19}$ cm$^{-3}$ by a crystal growth technique (FIG. 28(a)).

Then, a photoresist is deposited on the surface and patterned to form a first photoresist layer 150, and the InGaAs emitter contact layer 104 and the InAlAs emitter layer 103 are etched using the photoresist layer 150 as a mask. This etching is carried out at 20°~25° C. using, as an etchant, a mixture of hydrogen peroxide, water, and at least one of tartaric acid, phosphoric acid, and sulfuric acid. Preferably, hydrogen peroxide, water, and acid are mixed in the ratio of 1:50. Since this etchant etches InGaAs and InAlAs but does not etch InP, the etching automatically stops at the surface of the InP etching stopper layer 102 (FIG. 28(b)).

Then, the InP etching stopper layer 102 is etched with hydrochloric acid using the photoresist layer 150 as a mask. After removing the photoresist layer 150, a second photoresist layer 151 is formed over the emitter contact layer 104 extending on portions of the base layer 101, and the p type InGaAs base layer 101 and upper portions of the n type InGaAs collector layer 100 are etched using the photoresist layer 151 as a mask. Thereafter, the collector electrodes 105, the base electrodes 106, and the emitter electrode 107, each having a thickness of about 100 nm, are formed to complete the HBT of FIG. 27. Preferably, the collector electrode 105 includes AuGe/Ni/Au with AuGe in contact with the collector layer 100, the base electrode 106 includes Ti/Mo/Au with Ti in contact with the base layer 101, and the emitter electrode 107 includes Ti/Mo/Au with Ti in contact with the emitter contact layer 104.

In this embodiment, the HBT includes the laminated structure comprising the III-V compound semiconductor layers including As as a main constituent group V element (hereinafter referred to as first compound semiconductor layers) and the III-V compound semiconductor layer including P as a main constituent group V element (hereinafter referred to as second compound semiconductor layer), and the recess etching is applied to the laminated structure using the etchant comprising hydrogen peroxide, water, and at least one of tartaric acid, phosphoric acid, and sulfuric acid, which etchant selectively etches the first compound semiconductor layers. Therefore, it is possible to accurately stop the etching at the surface of the second compound semiconductor layer without reducing the thickness of the base layer 101. As the result, variations in electrical characteristics of the HBT are reduced.

Figure 29:
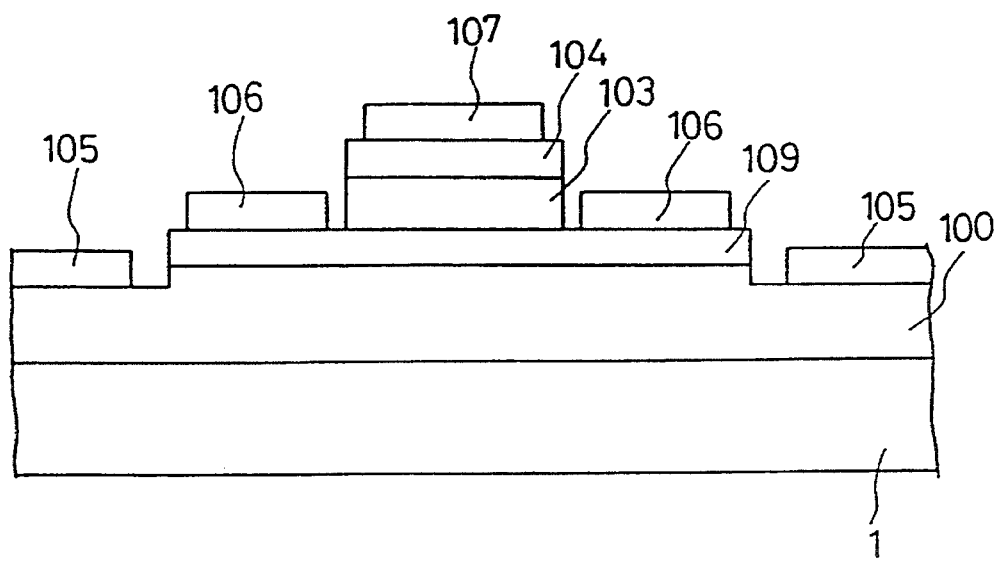
FIG. 29 is a cross-sectional view illustrating a semiconductor device in accordance with a twenty-seventh embodiment of the present invention.

FIG. 29 is a cross-sectional view illustrating a HBT employing an InP substrate in accordance with a twenty-seventh embodiment of the present invention. In FIG. 29, the same reference numerals as in FIG. 27 designate the same parts. Reference numeral 109 designates a p type InP base layer about 100 nm thick having a dopant concentration of about $1\times10^{19}$ cm$^{-3}$. In this embodiment, during the etching of the n type InAlAs emitter layer 103 and the n$^+$ type InGaAs emitter contact layer 104, the InP base layer 109 serves as an etching stopper layer, so that the etching stopper layer 102 of FIG. 27 can be dispensed with.

Figure 30:
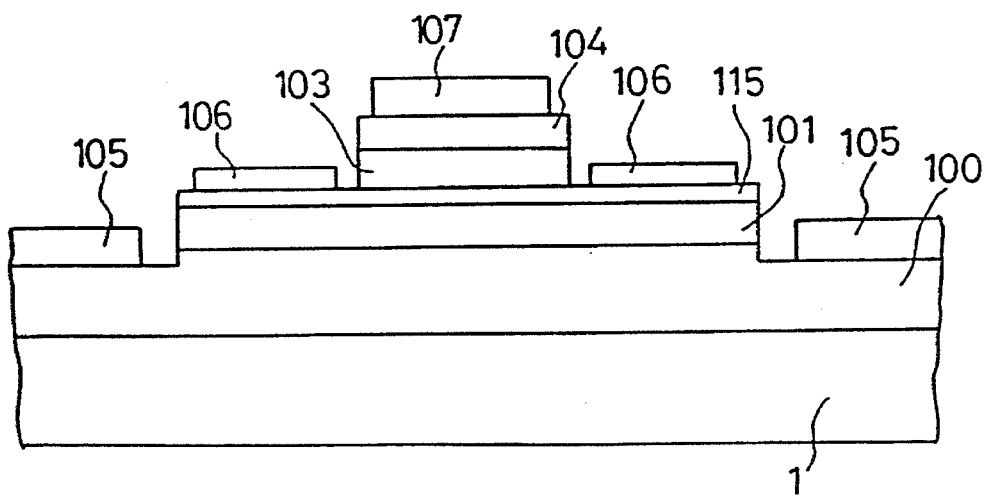
FIG. 30 is a cross-sectional view illustrating a semiconductor device in accordance with a twenty-eighth embodiment of the present invention.

FIG. 30 is a cross-sectional view illustrating a HBT employing an InP substrate in accordance with a twenty-eighth embodiment of the present invention. In the figure, the same reference numerals as in FIG. 27 designate the same parts. Reference numeral 115 designates a p type InP etching stopper layer about 10 nm thick having a dopant concentration of $1\times10^{19}$ cm$^{-3}$. In this embodiment, after the etching of the n type InAlAs emitter layer 103 and the n$^+$ type InGaAs emitter contact layer 104, the p type InP etching stopper layer 115 is not removed, and the etching for exposing the collector layer 100 is carried out using the InP etching stopper layer 115 as a mask.

Figure 31:
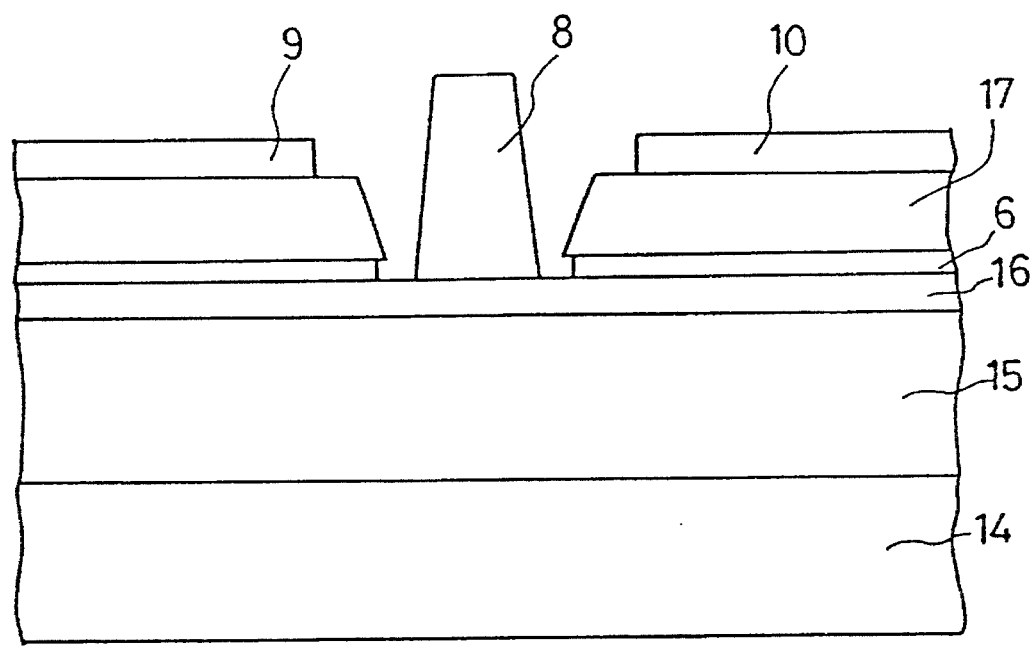
FIG. 31 is a cross-sectional view illustrating a semiconductor device in accordance with a twenty-ninth embodiment of the present invention.

FIG. 31 is a cross-sectional view illustrating a HEMT employing a GaAs substrate in accordance with a twenty-ninth embodiment of the present invention. In FIG. 31, reference numeral 14 designates a GaAs substrate. Disposed on the GaAs substrate 14 are a GaAs buffer layer 15, an n type AlGaAs electron supply layer 16, an InP etching stopper layer 6, and an n type GaAs ohmic contact layer 17. A gate electrode 8 is disposed on the electron supply layer 16, and source and drain electrodes 9 and 10 are disposed on the ohmic contact layer 17 spaced from each other.

FIGS. 32(a)–32(d) illustrate a method for producing the HEMT of FIG. 31.

Figure 32A:
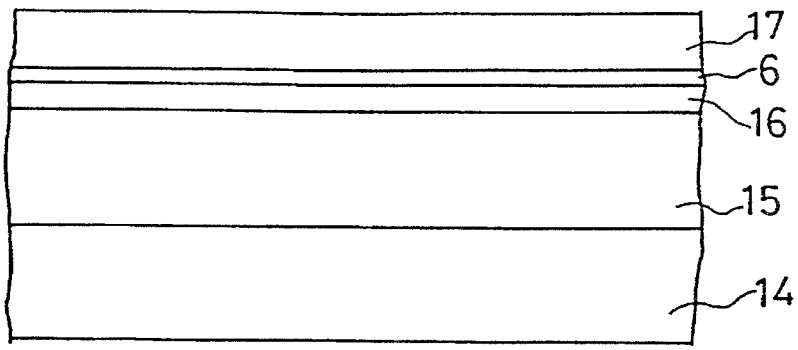
FIGS. 32(a)–32(d) are cross-sectional views illustrating a method for producing the semiconductor device of FIG. 31.

Initially, there are successively grown on the GaAs substrate 14, the GaAs buffer layer 15 about 1 micron thick, the n type AlGaAs electron supply layer 16 about 40 nm thick having a dopant concentration of about $2\times10^{18}$ cm$^{-3}$, the InP etching stopper layer about 5 nm thick having a dopant concentration of about $2\times10^{18}$ cm$^{-3}$, and the n type GaAs ohmic contact layer 17 about 100 nm thick having a dopant concentration of about $2\times10^{18}$ cm$^{-3}$ (FIG. 32(a)). These layers are grown by conventional techniques, such as MBE, MOCVD, and the like.

Figure 32B:
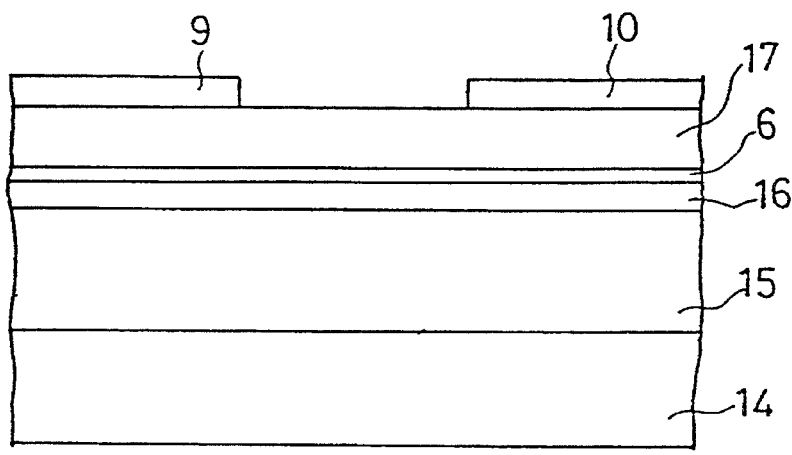
Figure 32C:
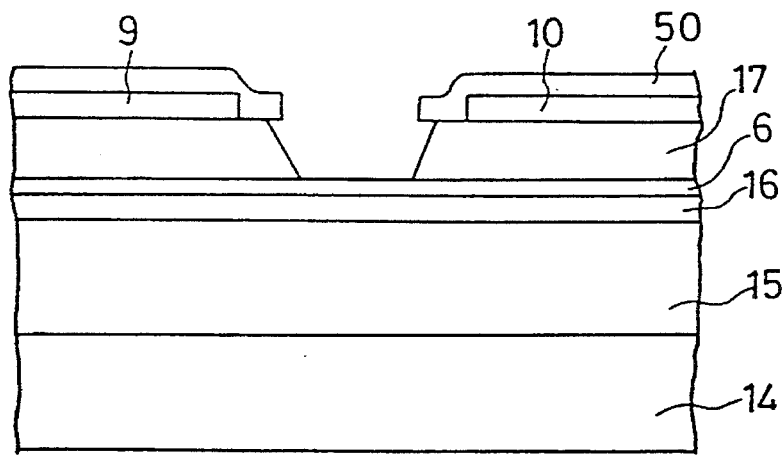

Thereafter, source and drain electrodes 9 and 10 about 100 nm thick are formed on the n type GaAs ohmic contact layer 7 by evaporation deposition and lift-off (FIG. 32(b)). These electrodes may typically comprise Au/Ge/Ni, with Au in contact with the ohmic contact layer 7.

Then, a photoresist is deposited on the surface and patterned to form a photoresist layer 50, followed by a recess etching using the photoresist layer 50 as a mask. The recess etching is carried out at 20°~25° C. using, as an etchant, a mixture of hydrogen peroxide, water, and at least one of tartaric acid, phosphoric acid, and sulfuric acid. Preferably, hydrogen peroxide, water, and acid are mixed in the ratio of 1:50. During the etching, this etchant etches GaAs which is a III-V compound semiconductor including As as a main constituent group V element but does not etch InP which is a III-V compound semiconductor including P as a main constituent group V element, so that the etching automatically stops at the surface of the InP etching stopper layer 6 (FIG. 32(c)).

Figure 32D:
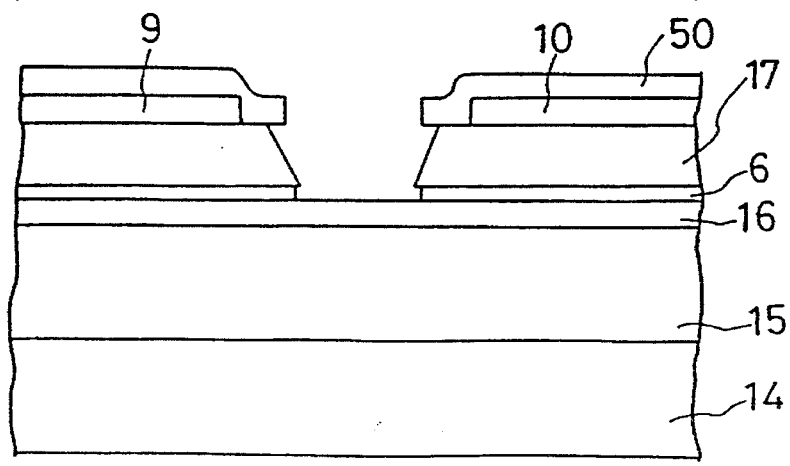

Thereafter, the InP etching stopper layer 6 exposed at the bottom of the recess is removed with hydrochloric acid to expose the AlGaAs electron supply layer 16 (FIG. 32(d)). It is well known that hydrochloric acid etches InP but does not etch GaAs.

Thereafter, a gate metal, such as aluminum, is deposited on the entire surface to a thickness of about 400 nm, and the photoresist mask 50 and overlying portions of the gate metal are removed by lift-off, forming a gate electrode on the n type AlGaAs electron supply layer 16. Thus, the HEMT of FIG. 31 is completed.

Figure 33:
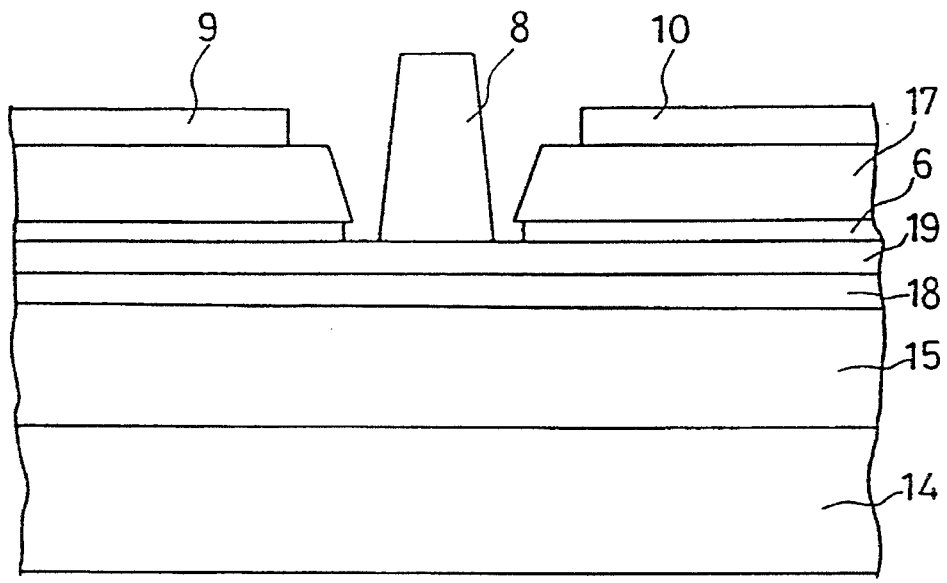
FIG. 33 is a cross-sectional view illustrating a semiconductor device in accordance with a thirtieth embodiment of the present invention.

FIG. 33 is a cross-sectional view illustrating a MISFET employing a GaAs substrate in accordance with a thirtieth embodiment of the present invention. In the figure, the same reference numerals as in FIG. 31 designate the same parts. This MISFET includes an n type GaAs channel layer 18 about 10 nm thick having a dopant concentration of about $1\times10^{18}$ cm$^{-3}$ and an AlGaAs Schottky junction formation layer 19 about 10 nm thick in place of the n type AlGaAs electron supply layer 16 of FIG. 31.

Figure 34:
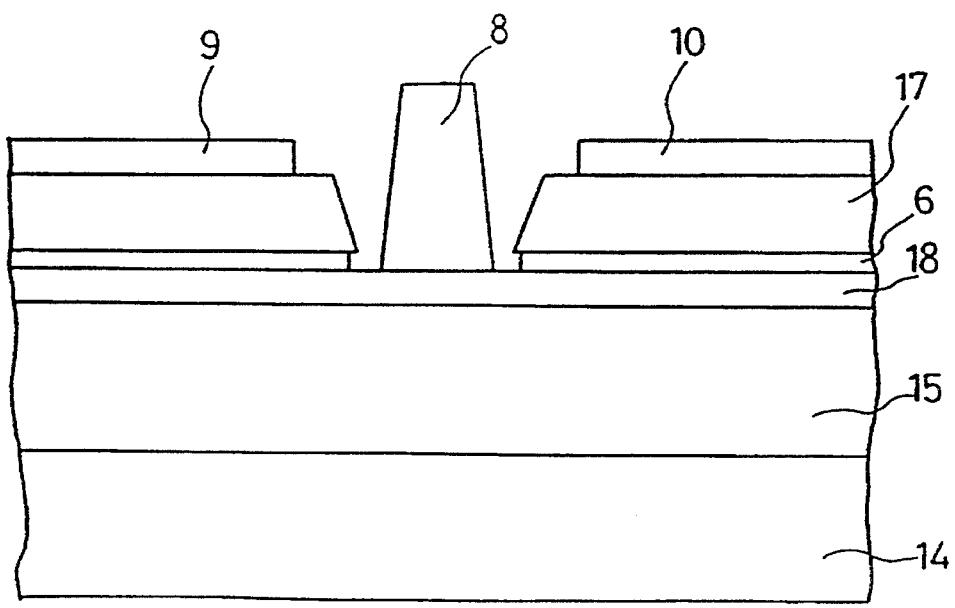
FIG. 34 is a cross-sectional view illustrating a semiconductor device in accordance with a thirty-first embodiment of the present invention.

FIG. 34 is a cross-sectional view illustrating a MESFET employing a GaAs substrate in accordance with a thirty-first embodiment of the present invention. In the figure, the same reference numerals as in FIG. 31 designate the same parts. This MESFET includes an n type GaAs channel layer 18 in place of the n type AlGaAs electron supply layer 16 of FIG. 31.

Figure 35:
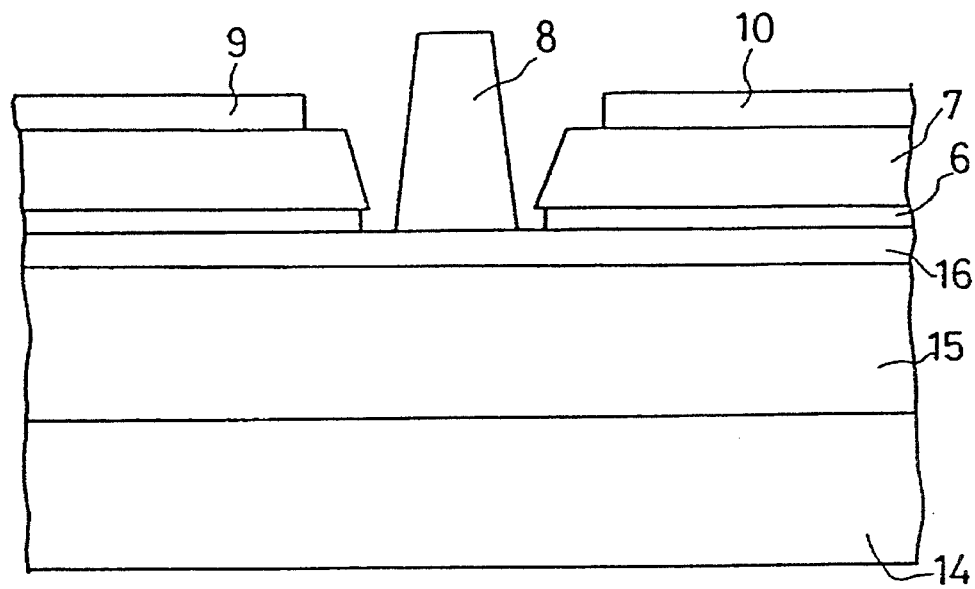
FIG. 35 is a cross-sectional view illustrating a semiconductor device in accordance with a thirty-second embodiment of the present invention.

FIG. 35 is a cross-sectional view illustrating a HEMT employing a GaAs substrate in accordance with a thirty-second embodiment of the present invention. In the figure, the same reference numerals as in FIG. 31 designate the same parts. This HEMT includes an n type InGaAs ohmic contact layer 7 in place of the n type GaAs ohmic contact layer 17 of FIG. 31.

Figure 36:
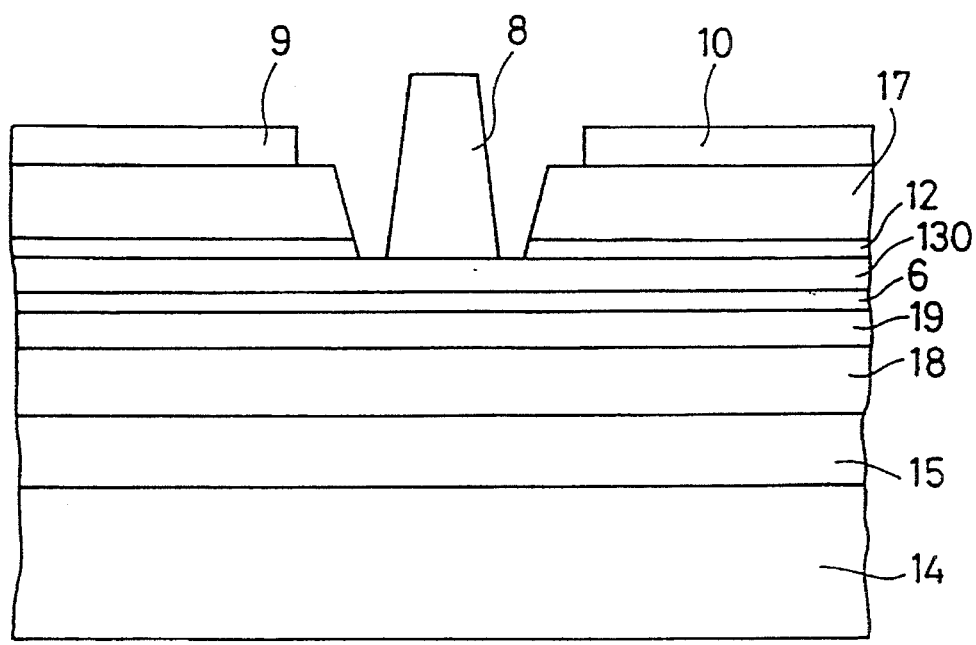
FIG. 36 is a cross-sectional view illustrating a semiconductor device in accordance with a thirty-third embodiment of the present invention.

FIG. 36 is a cross-sectional view illustrating a MISFET employing a GaAs substrate in accordance with a thirty-third embodiment of the present invention. In the figure, the same reference numerals as in FIG. 33 designate the same parts. In the embodiment, a second AlGaAs Schottky junction formation layer 130 about 50 nm thick having a dopant concentration of about $4\times10^{18}$ cm$^{-3}$ and a second InP etching stopper layer 12 are inserted between the InP etching stopper layer 6 and the GaAs ohmic contact layer 17. In producing the gate recess, a prescribed portion of the GaAs ohmic contact layer 17 is etched using the etchant comprising hydrogen peroxide, water, and acid, and the second InP etching stopper layer 12 exposed at the bottom of the recess is etched with hydrochloric acid, and the gate electrode 8 is formed on the second AlGaAs Schottky junction formation layer 130.

Figure 37:
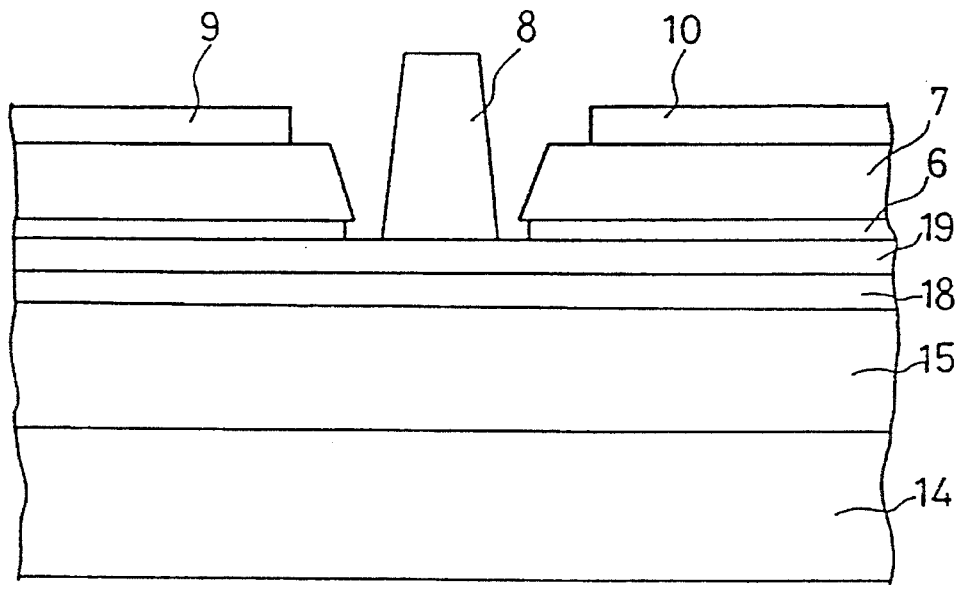
FIG. 37 is a cross-sectional view illustrating a semiconductor device in accordance with a thirty-fourth embodiment of the present invention.

FIG. 37 is a cross-sectional view illustrating a MISFET employing a GaAs substrate in accordance with a thirty-fourth embodiment of the present invention. In the figure, the same reference numerals as in FIG. 33 designate the same parts. This MISFET includes an n type InGaAs ohmic contact layer 7 in place of the n type GaAs ohmic contact layer 17 of FIG. 33.

Figure 38:
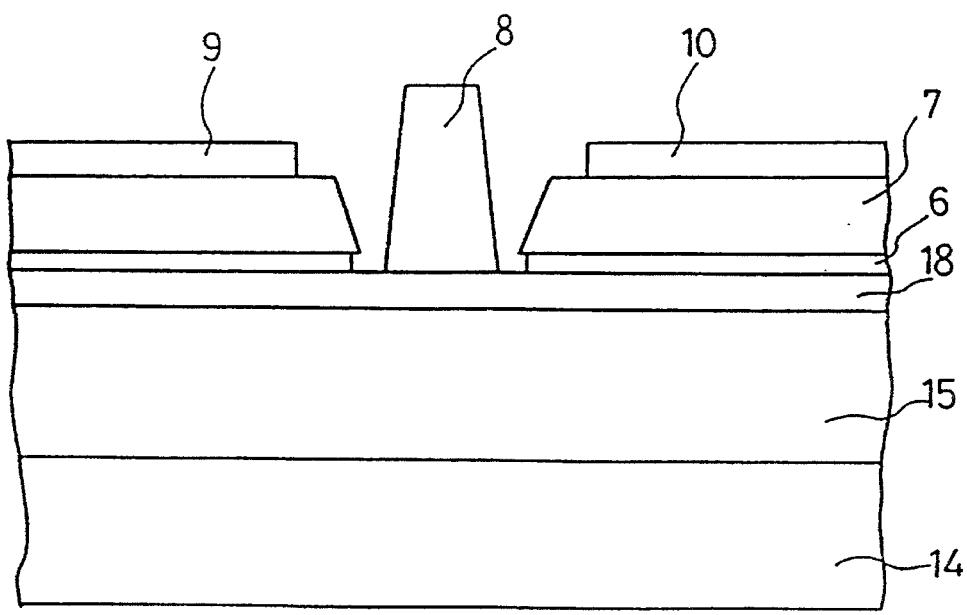
FIG. 38 is a cross-sectional view illustrating a semiconductor device in accordance with a thirty-fifth embodiment of the present invention.

FIG. 38 is a cross-sectional view illustrating a MESFET employing a GaAs substrate in accordance with a thirty-fifth embodiment of the present invention. In the figure, the same reference numerals as in FIG. 34 designate the same parts. This MESFET includes an n type InGaAs ohmic contact layer 7 in place of the n type GaAs ohmic contact layer 17 of FIG. 34.

Figure 40:
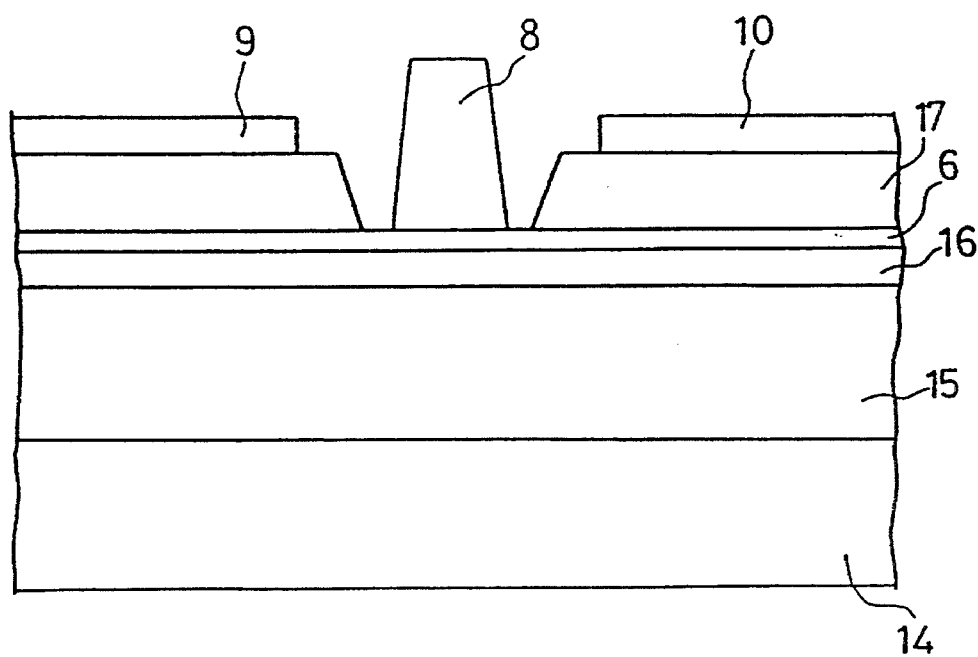
FIG. 40 is a cross-sectional view illustrating a semiconductor device in accordance with a thirty-sixth embodiment of the present invention.

FIG. 40 is a cross-sectional view illustrating a HEMT employing a GaAs substrate in accordance with a thirty-sixth embodiment of the present invention. In the figure, the same reference numerals as in FIG. 31 designate the same parts. In this embodiment, after the recess etching using the etchant comprising hydrogen peroxide, water, and acid, the InP etching stopper layer 6 exposed at the bottom of the recess is not removed and the gate electrode 8 is formed on the InP etching stopper layer 6.

Figure 41:
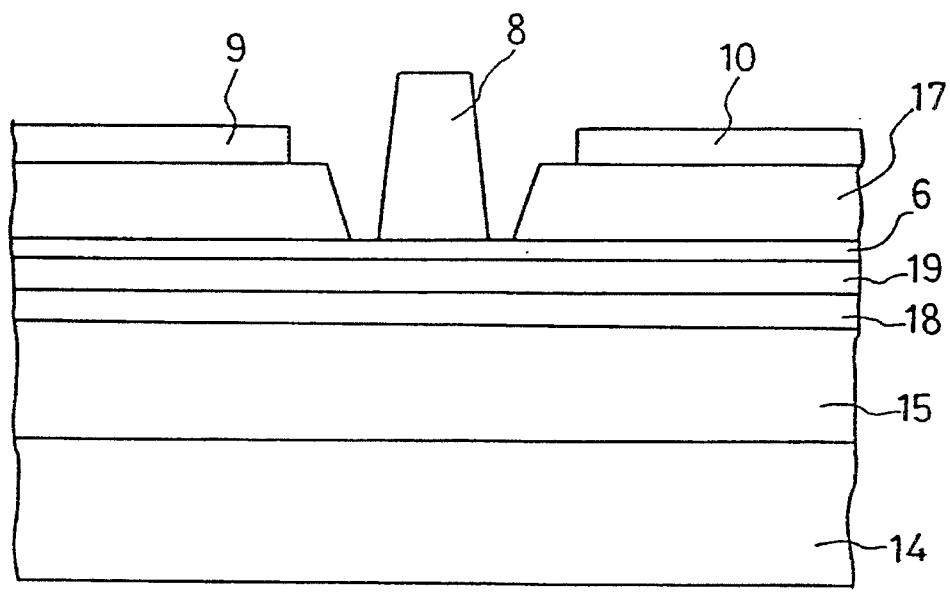
FIG. 41 is a cross-sectional view illustrating a semiconductor device in accordance with a thirty-seventh embodiment of the present invention.

FIG. 41 is a cross-sectional view illustrating a MISFET employing a GaAs substrate in accordance with a thirty-seventh embodiment of the present invention. In the figure, the same reference numerals as in FIG. 33 designate the same parts. Also in this embodiment, the InP etching stopper layer 6 at the bottom of the recess is not removed and the gate electrode 8 is formed on the InP etching stopper layer 6.

Figure 42:
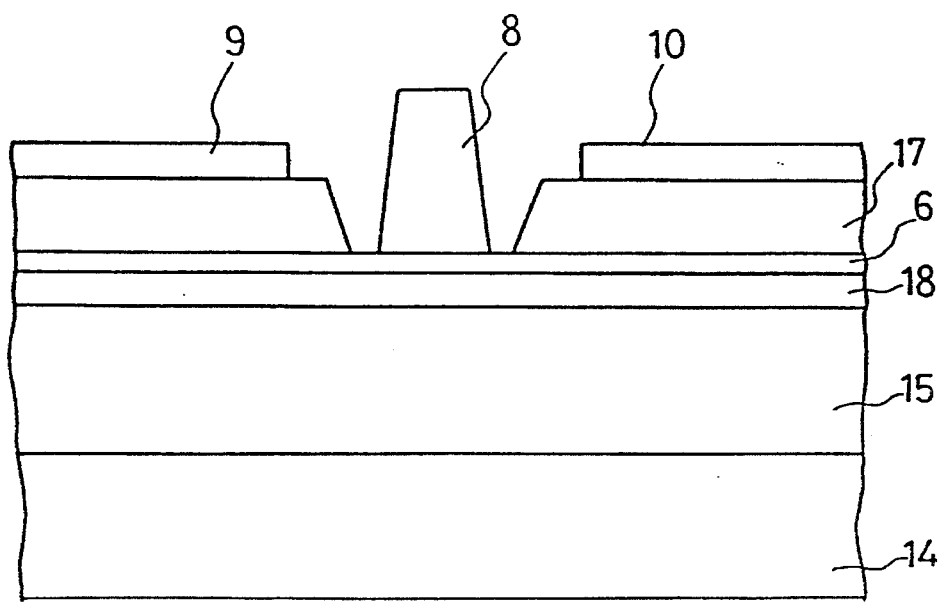
FIG. 42 is a cross-sectional view illustrating a semiconductor device in accordance with a thirty-eighth embodiment of the present invention.

FIG. 42 is a cross-sectional view illustrating a MESFET employing a GaAs substrate in accordance with a thirty-eighth embodiment of the present invention. In FIG. 42, the same reference numerals as in FIG. 31 designate the same parts. This MESFET includes an n type GaAs channel layer 18 in place of the n type AlGaAs electron supply layer 16 of FIG. 31, and the gate electrode 8 is disposed on the InP etching stopper layer 6.

Figure 39:
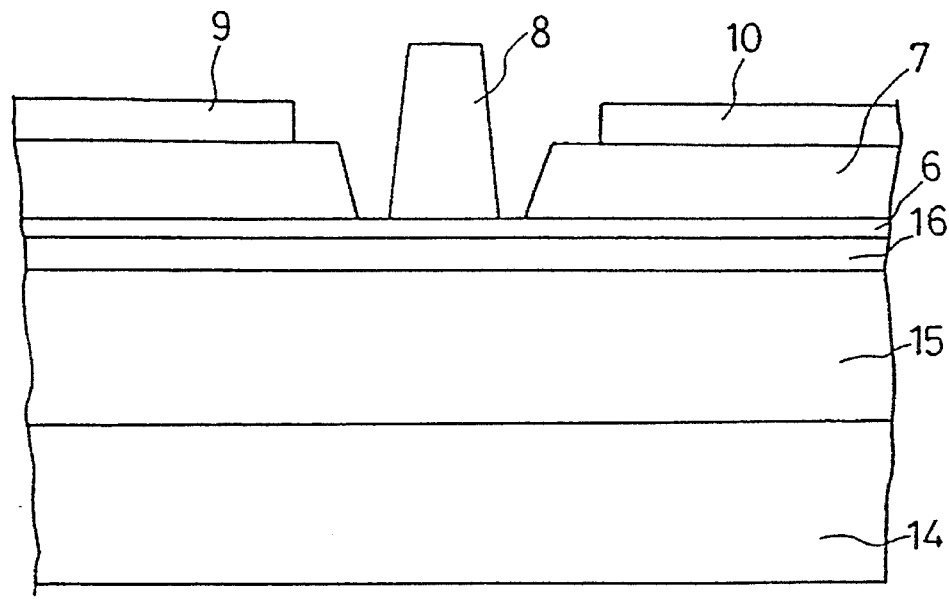
FIG. 39 is a cross-sectional view illustrating a semiconductor device in accordance with a thirty-ninth embodiment of the present invention.

FIG. 39 is a cross-sectional view illustrating a HEMT employing a GaAs substrate in accordance with a thirty-ninth embodiment of the present invention. In the figure, the same reference numerals as in FIG. 35 designate the same parts. In this embodiment, the InP etching stopper layer 6 at the bottom of the recess is not removed, and the gate electrode 8 is formed on the InP etching stopper layer 6.

Figure 43:
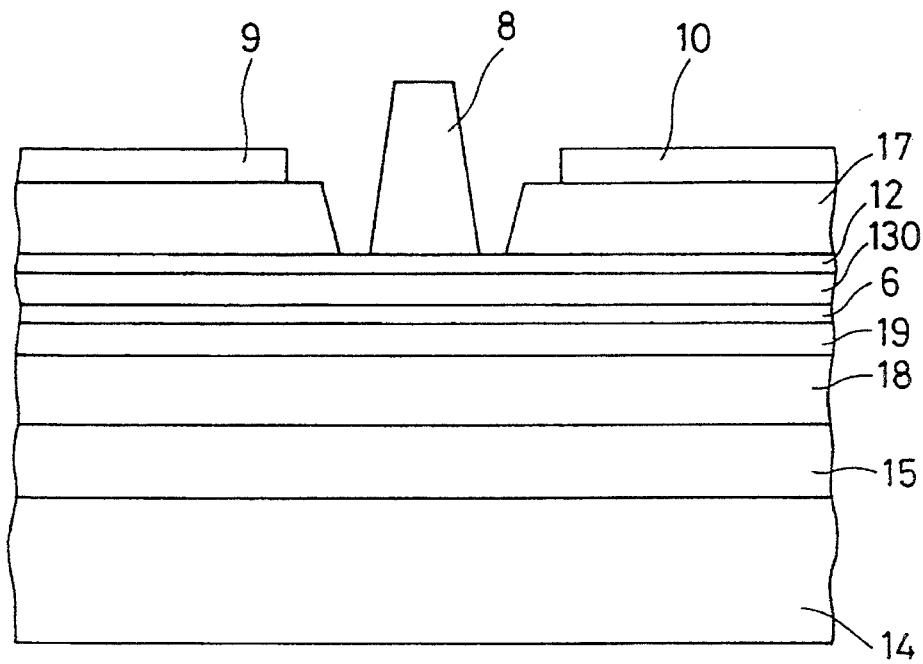
FIG. 43 is a cross-sectional view illustrating a semiconductor device in accordance with a fortieth embodiment of the present invention.

FIG. 43 is a cross-sectional view illustrating a MISFET employing a GaAs substrate in accordance with a fortieth embodiment of the present invention. In the figure, the same reference numerals as in FIG. 41 designate the same parts. In this embodiment, a second AlGaAs Schottky junction formation layer 130 and a second InP etching stopper layer 12 are inserted between the InP etching stopper layer 6 and the GaAs ohmic contact layer 17. In producing the gate recess, a prescribed portion of the GaAs ohmic contact layer 17 is etched using the above-described etchant comprising hydrogen peroxide, water, and acid, and the gate electrode 8 is formed on the second InP etching stopper layer 12.

Figure 44:
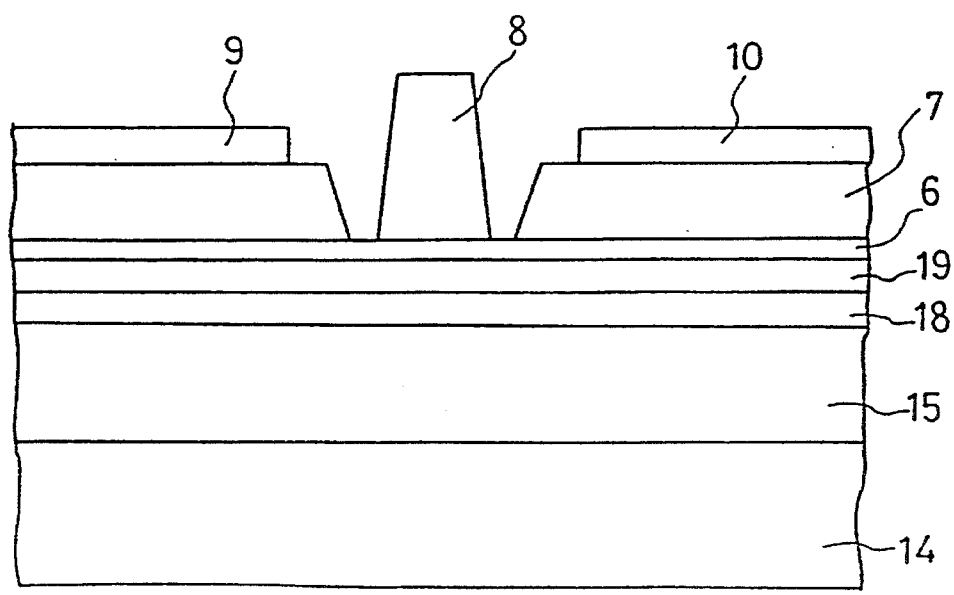
FIG. 44 is a cross-sectional view illustrating a semiconductor device in accordance with a forty-first embodiment of the present invention.

FIG. 44 is a cross-sectional view illustrating a MISFET employing a GaAs substrate in accordance with a forty-first embodiment of the present invention. In the figure, the same reference numerals as in FIG. 41 designate the same parts. This MISFET includes an n type InGaAs ohmic contact layer 7 in place of the n type GaAs ohmic contact layer 17 of FIG. 41.

Figure 45:
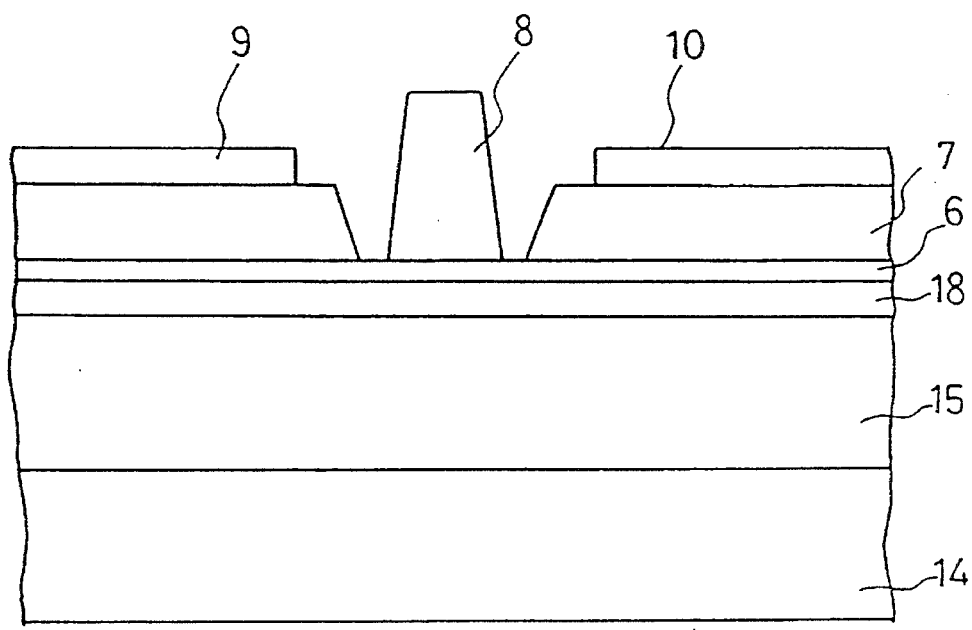
FIG. 45 is a cross-sectional view illustrating a semiconductor device in accordance with a forty-second embodiment of the present invention.

FIG. 45 is a cross-sectional view illustrating a MESFET employing a GaAs substrate in accordance with a forty-second embodiment of the present invention. In the figure, the same reference numerals as in FIG. 42 designate the same parts. This MESFET includes an n type InGaAs ohmic contact layer 7 in place of the n type GaAs ohmic contact layer 17 of FIG. 42.

Figure 46:
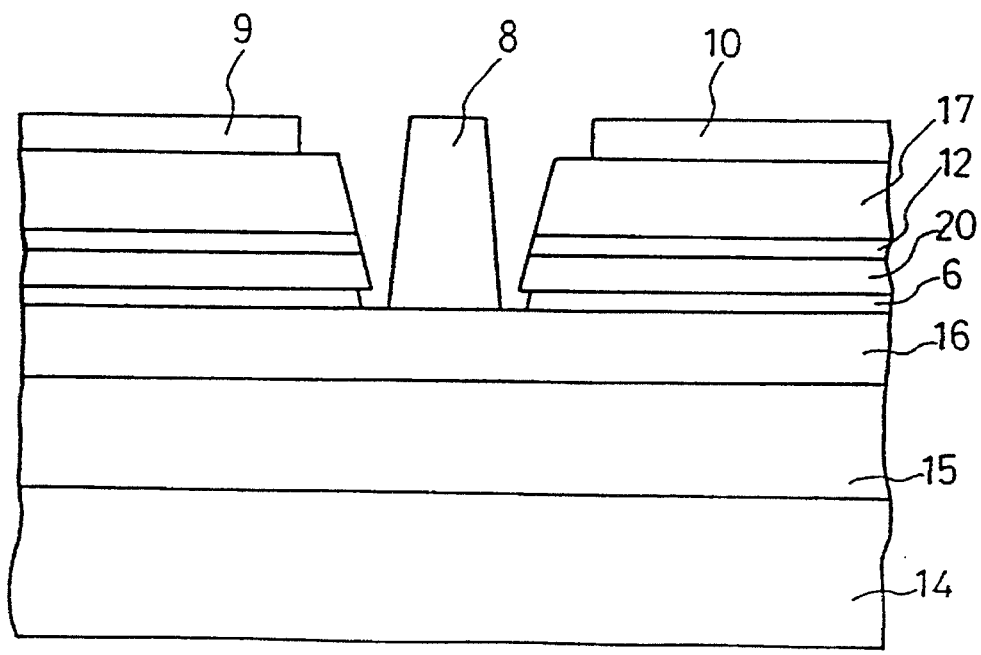
FIG. 46 is a cross-sectional view illustrating a semiconductor device in accordance with a forty-third embodiment of the present invention.

FIG. 46 is a cross-sectional view illustrating a HEMT employing a GaAs substrate in accordance with a forty-third embodiment of the present invention. In the figure, the same reference numerals as in FIG. 31 designate the same parts. In this embodiment, a second AlGaAs Schottky junction formation layer 20 and a second InP etching stopper layer 12 are inserted between the InP etching stopper layer 6 and the n type GaAs ohmic contact layer 17. In producing the gate recess, the InP etching stopper layer 6 in the recess is removed and the gate electrode 8 is formed on the n type AlGaAs electron supply layer 16.

Figure 47:
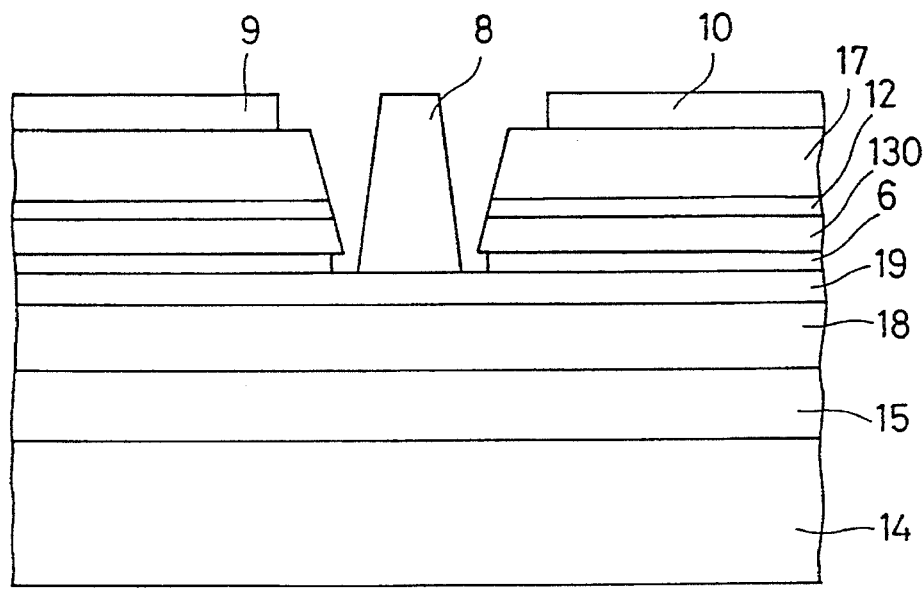
FIG. 47 is a cross-sectional view illustrating a semiconductor device in accordance with a forth-fourth embodiment of the present invention.

FIG. 47 is a cross-sectional view illustrating a MISFET employing a GaAs substrate in accordance with a forty-fourth embodiment of the present invention. In the figure, the same reference numerals as in FIG. 33 designate the same parts. In this embodiment, a second AlGaAs Schottky junction formation layer 130 and a second InP etching stopper layer 12 are inserted between the InP etching stopper layer 6 and the n type GaAs ohmic contact layer 17. In producing the gate recess, the InP etching stopper layer 6 in the recess is removed and the gate electrode is formed on the AlGaAs Schottky junction formation layer 19.

Figure 48:
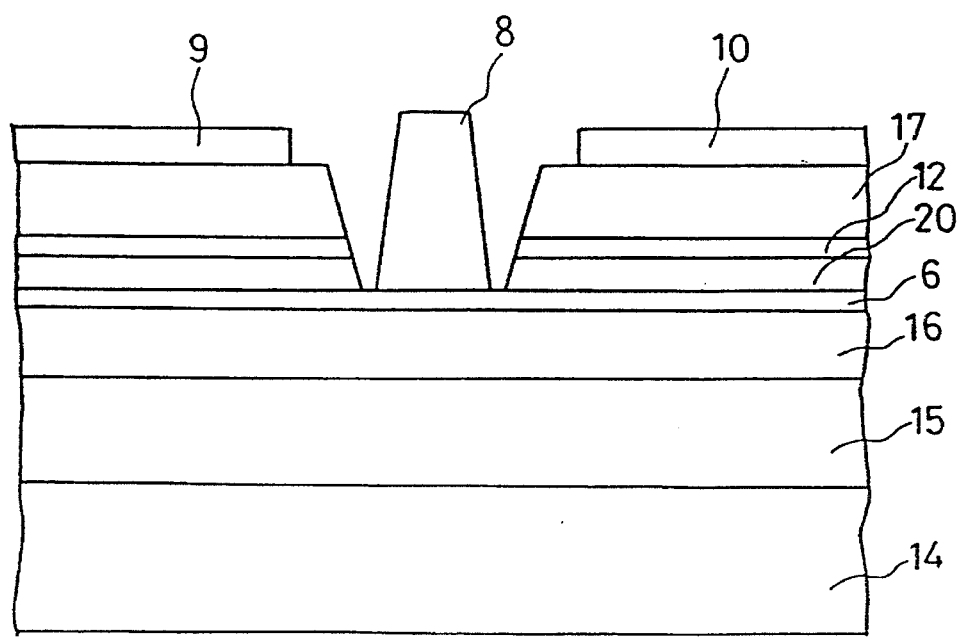
FIG. 48 is a cross-sectional view illustrating a semiconductor device in accordance with a forty-fifth embodiment of the present invention.

FIG. 48 is a cross-sectional view illustrating a HEMT employing a GaAs substrate in accordance with a forty-fifth embodiment of the present invention. In the figure, the same reference numerals as in FIG. 46 designate the same parts. In this embodiment, the InP etching stopper layer 6 at the bottom of the recess is not removed and the gate electrode 8 is disposed thereon.

Figure 49:
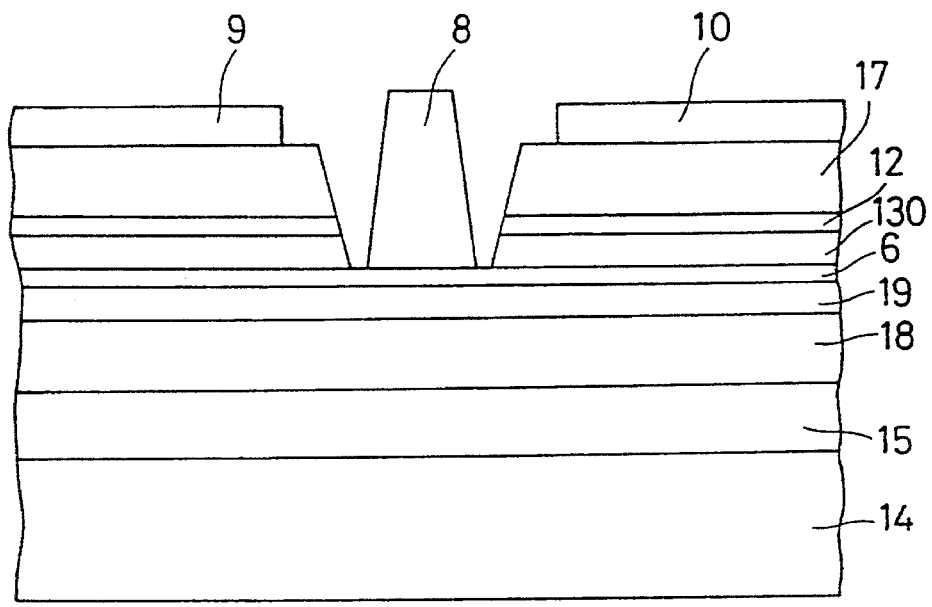
FIG. 49 is a cross-sectional view illustrating a semiconductor device in accordance with a forty-sixth embodiment of the present invention.

FIG. 49 is a cross-sectional view illustrating a MISFET employing a GaAs substrate in accordance with a forty-sixth embodiment of the present invention. In the figure, the same reference numerals as in FIG. 47 designate the same parts. In this embodiment, the InP etching stopper layer 6 at the bottom of the recess is not removed and the gate electrode 8 is disposed thereon.

Figure 50:
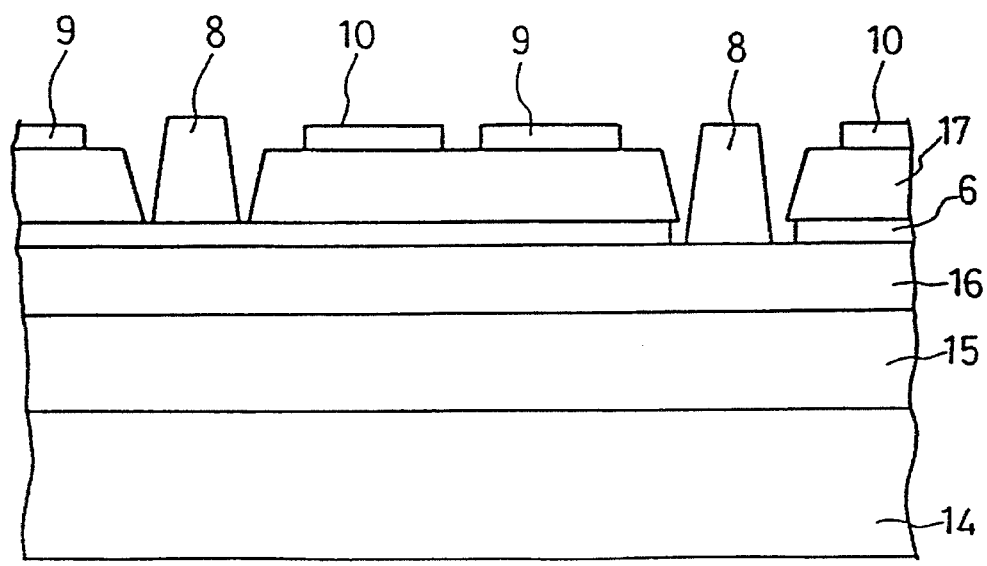
FIG. 50 is a cross-sectional view illustrating a semiconductor device in accordance with a forty-seventh embodiment of the present invention.

FIG. 50 is a cross-sectional view illustrating a semiconductor device in accordance with a forty-seventh embodiment of the present invention. In this embodiment, the HEMTs shown in FIGS. 31 and 40 having different pinch-off voltages are formed on the same substrate.

Figure 51:
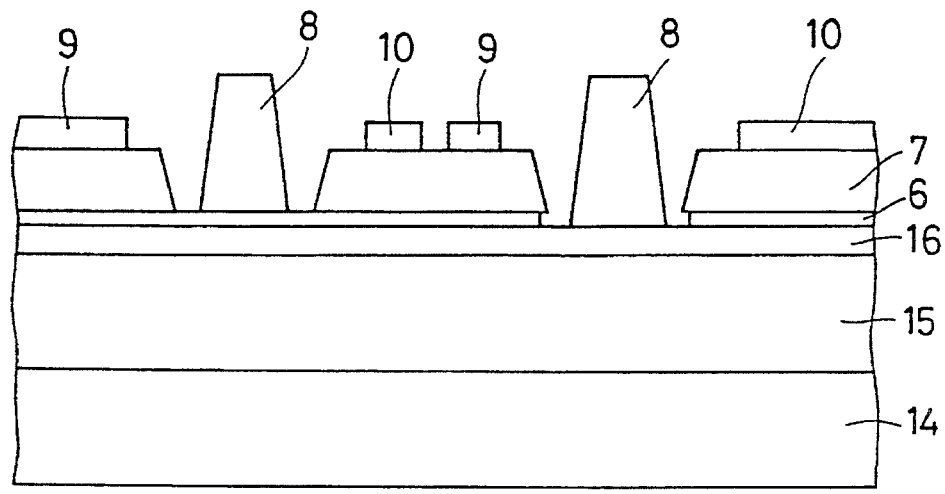
FIG. 51 is a cross-sectional view illustrating a semiconductor device in accordance with a forty-eighth embodiment of the present invention.

FIG. 51 is a cross-sectional view illustrating a semiconductor device in accordance with a forty-eighth embodiment of the present invention. In this embodiment, the HEMTs shown in FIGS. 35 and 39 having different pinch-off voltages are formed on the same substrate.

Figure 52:
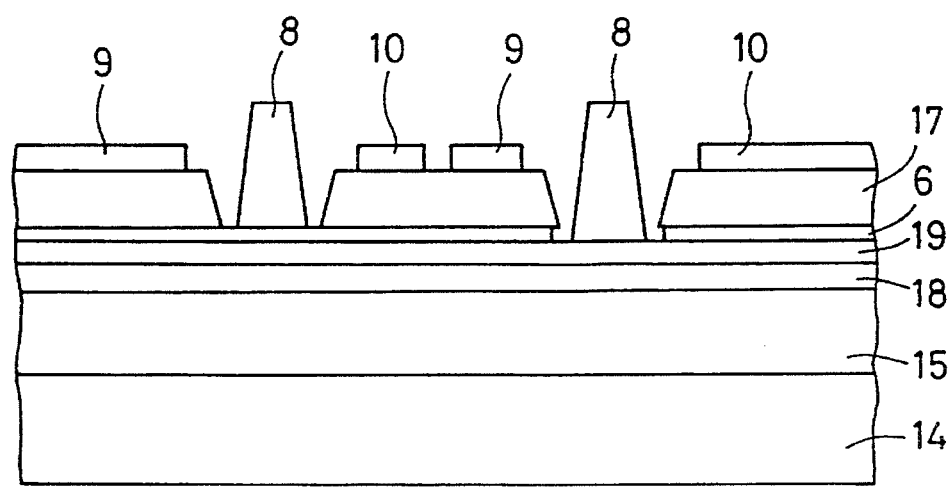
FIG. 52 is a cross-sectional view illustrating a semiconductor device in accordance with a forty-ninth embodiment of the present invention.

FIG. 52 is a cross-sectional view illustrating a semiconductor device in accordance with a forty-ninth embodiment of the present invention. In this embodiment, the MISFETs shown in FIGS. 33 and 41 having different pinch-off voltages are formed on the same substrate.

Figure 53:
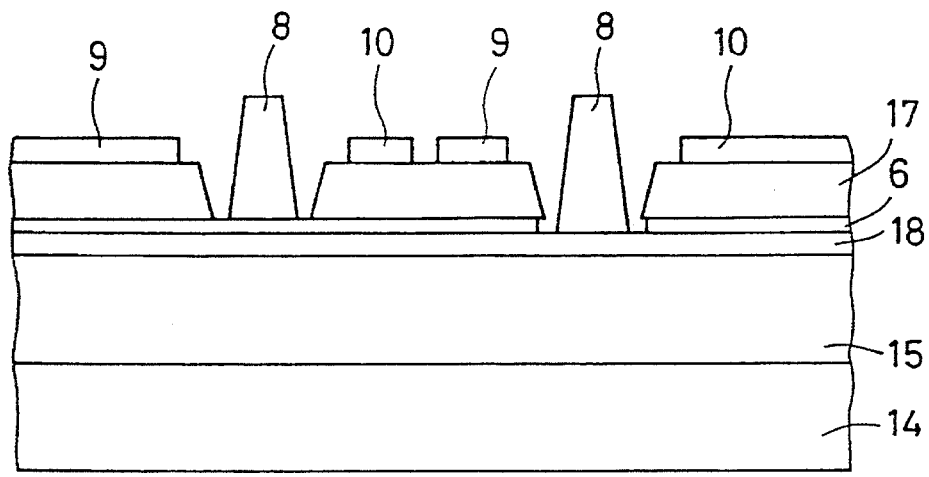
FIG. 53 is a cross-sectional view illustrating a semiconductor device in accordance with a fiftieth embodiment of the present invention.

FIG. 53 is a cross-sectional view illustrating a semiconductor device in accordance with a fiftieth embodiment of the present invention. In this embodiment, the MESFETs shown in FIGS. 34 and 42 having different pinch-off voltages are formed on the same substrate.

Figure 54:
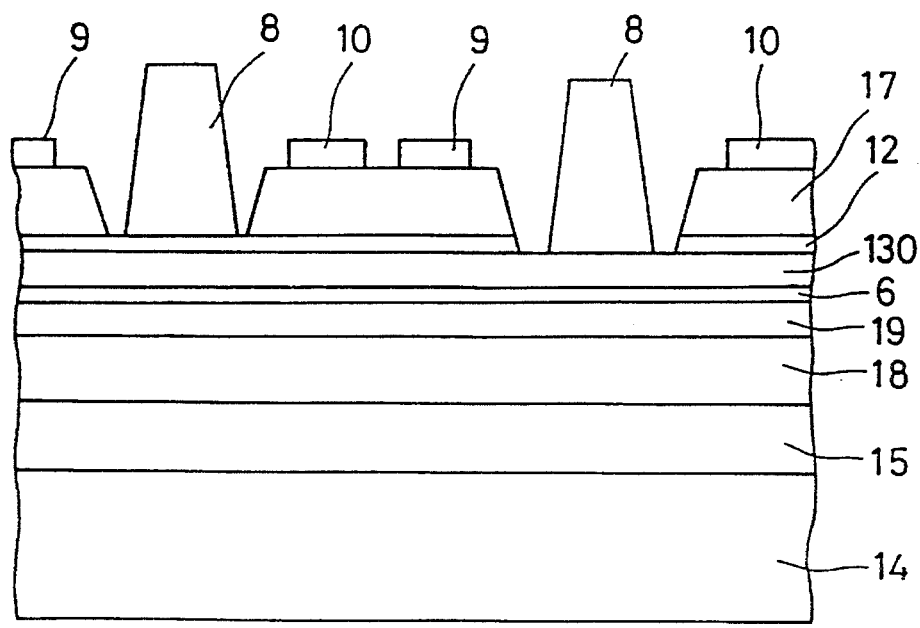
FIG. 54 is a cross-sectional view illustrating a semiconductor device in accordance with a fifty-first embodiment of the present invention.

FIG. 54 is a cross-sectional view illustrating a semiconductor device in accordance with a fifty-first embodiment of the present invention. In this embodiment, the MISFETs shown in FIGS. 36 and 43 having different pinch-off voltages are formed on the same substrate.

Figure 55:
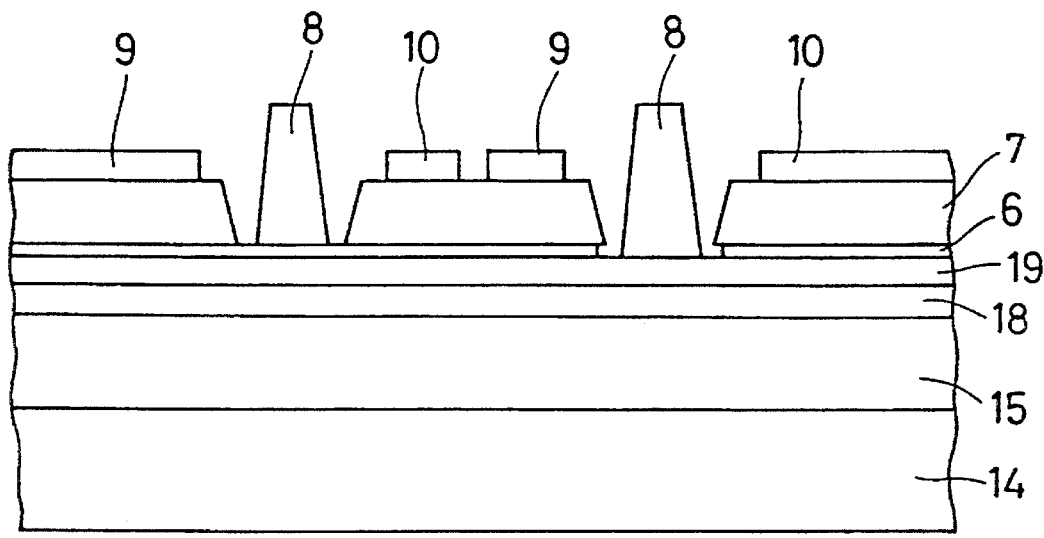
FIG. 55 is a cross-sectional view illustrating a semiconductor device in accordance with a fifty-second embodiment of the present invention.

FIG. 55 is a cross-sectional view illustrating a semiconductor device in accordance with a fifty-second embodiment of the present invention. In this embodiment, the MISFETs shown in FIGS. 37 and 44 having different pinch-off voltages are formed on the same substrate.

Figure 56:
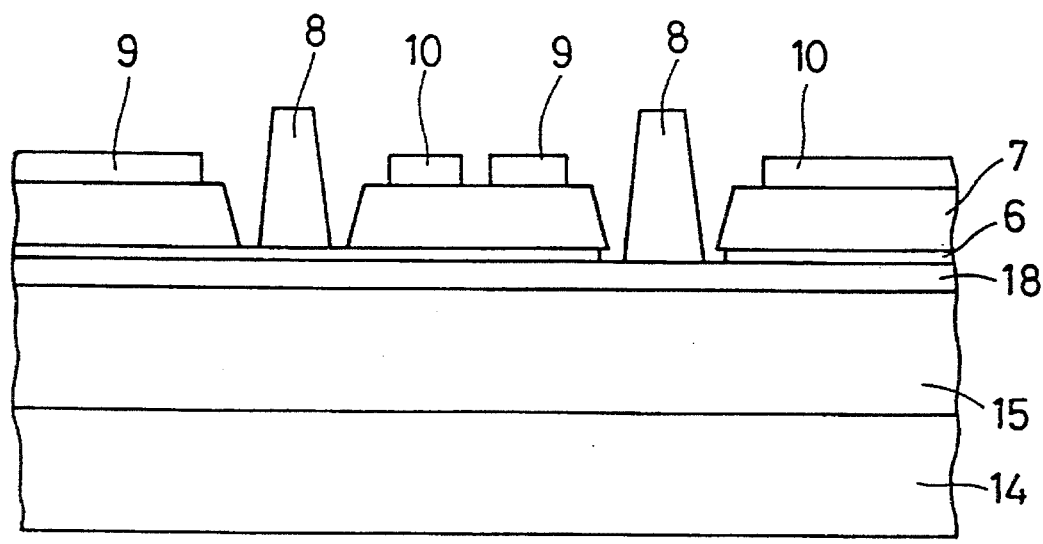
FIG. 56 is a cross-sectional view illustrating a semiconductor device in accordance with a fifty-third embodiment of the present invention.

FIG. 56 is a cross-sectional view illustrating a semiconductor device in accordance with a fifty-third embodiment of the present invention. In this embodiment, the MESFETs shown in FIGS. 38 and 45 having different pinch-off voltages are formed on the same substrate.

Figure 57:
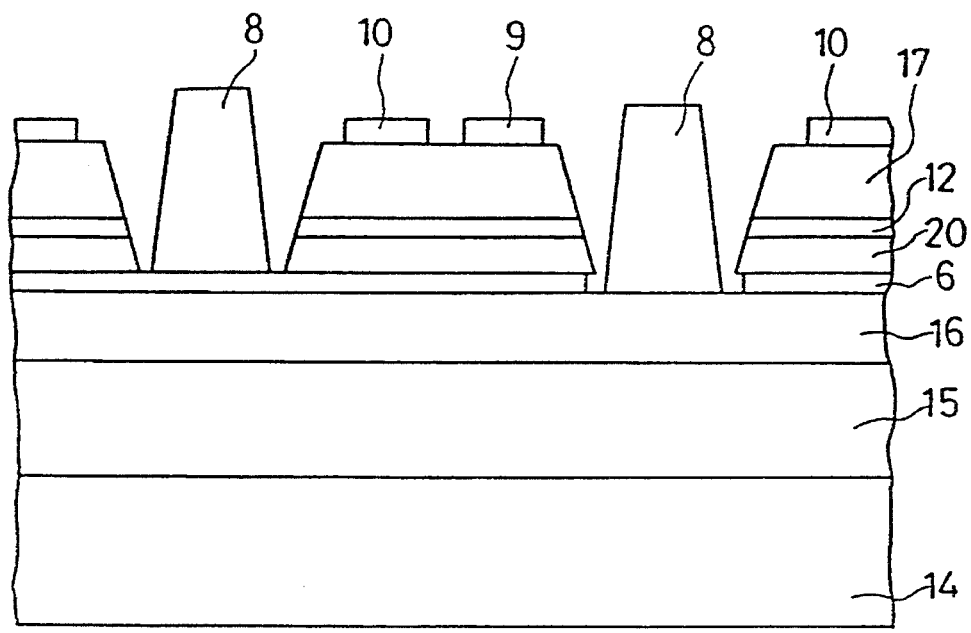
FIG. 57 is a cross-sectional view illustrating a semiconductor device in accordance with a fifty-fourth embodiment of the present invention.

FIG. 57 is a cross-sectional view illustrating a semiconductor device in accordance with a fifty-fourth embodiment of the present invention. In this embodiment, the HEMTs shown in FIGS. 46 and 48 having different pinch-off voltages are formed on the same substrate.

Figure 58:
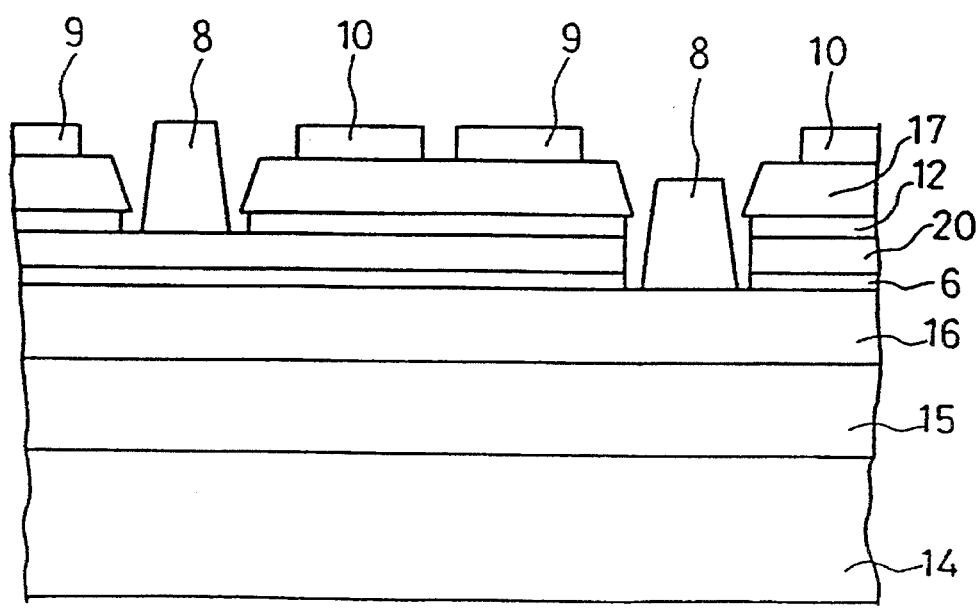
FIG. 58 is a cross-sectional view illustrating a semiconductor device in accordance with a fifty-fifth embodiment of the present invention.

FIG. 58 is a cross-sectional view illustrating a semiconductor device in accordance with a fifty-fifth embodiment of the present invention. In this embodiment, the HEMTs shown in FIGS. 31 and 46 having different pinch-off voltages are formed on the same substrate.

Figure 59:
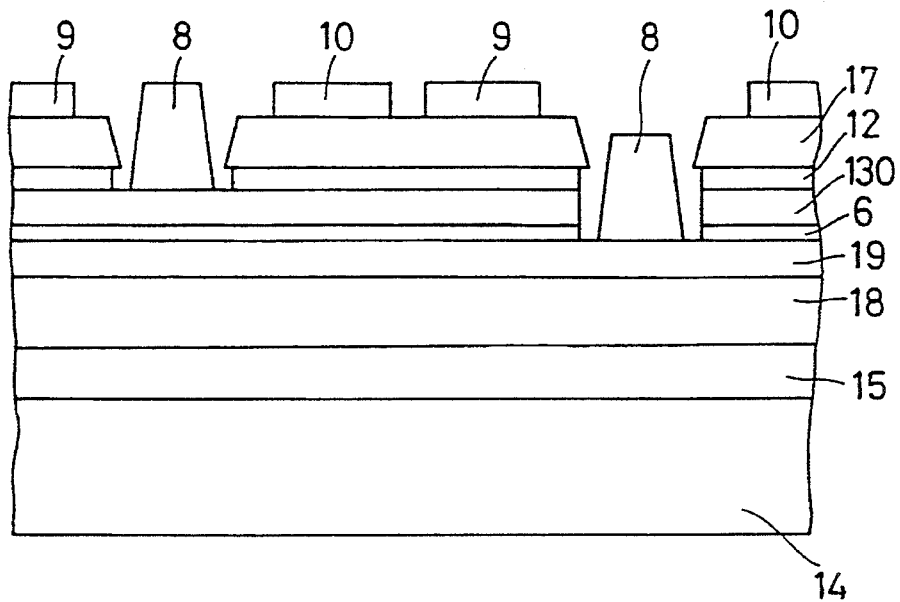
FIG. 59 is a cross-sectional view illustrating a semiconductor device in accordance with a fifty-sixth embodiment of the present invention.

FIG. 59 is a cross-sectional view illustrating a semiconductor device in accordance with a fifty-sixth embodiment of the present invention. In this embodiment, the MISFETs shown in FIGS. 36 and 47 having different pinch-off voltages are formed on the same substrate.

Figure 60:
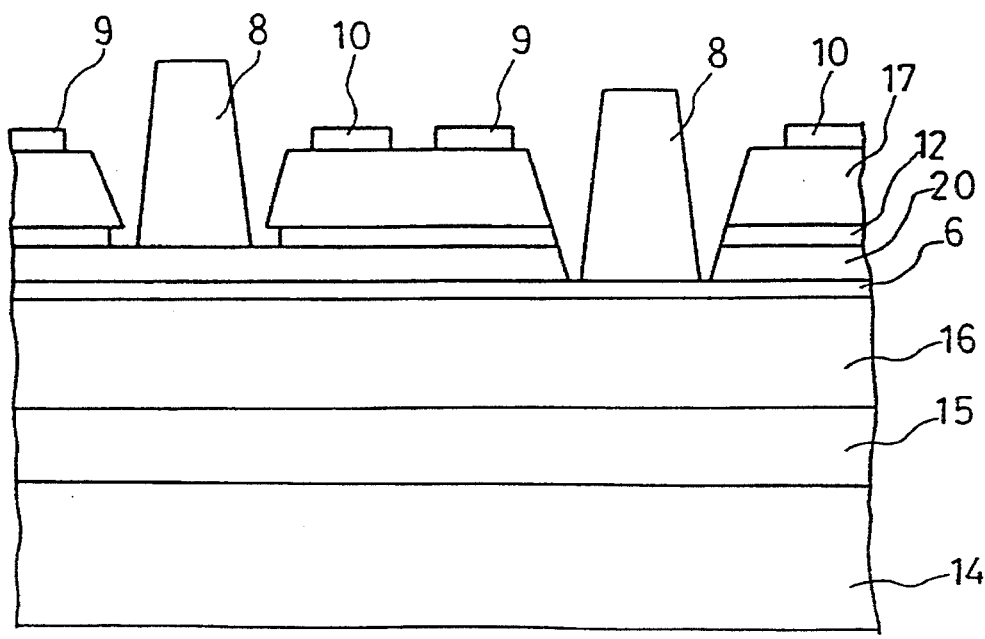
FIG. 60 is a cross-sectional view illustrating a semiconductor device in accordance with a fifty-seventh embodiment of the present invention.

FIG. 60 is a cross-sectional view illustrating a semiconductor device in accordance with a fifty-seventh embodiment of the present invention. In this embodiment, the HEMTs shown in FIGS. 31 and 48 having different pinch-off voltages are formed on the same substrate.

Figure 61:
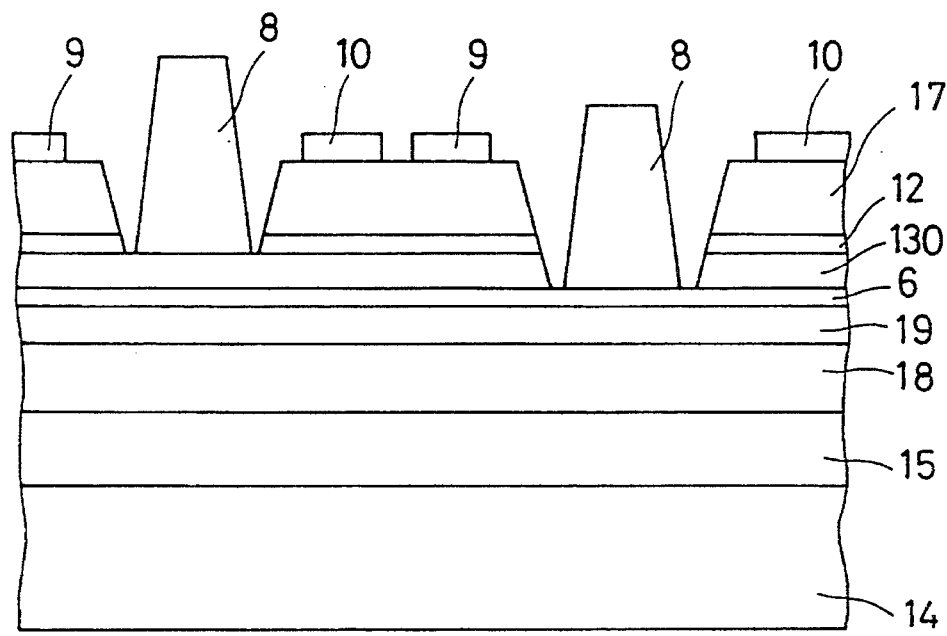
FIG. 61 is a cross-sectional view illustrating a semiconductor device in accordance with a fifty-eighth embodiment of the present invention.

FIG. 61 is a cross-sectional view illustrating a semiconductor device in accordance with a fifty-eighth embodiment of the present invention. In this embodiment, the MISFETs shown in FIGS. 36 and 49 having different pinch-off voltages are formed on the same substrate.

Figure 62:
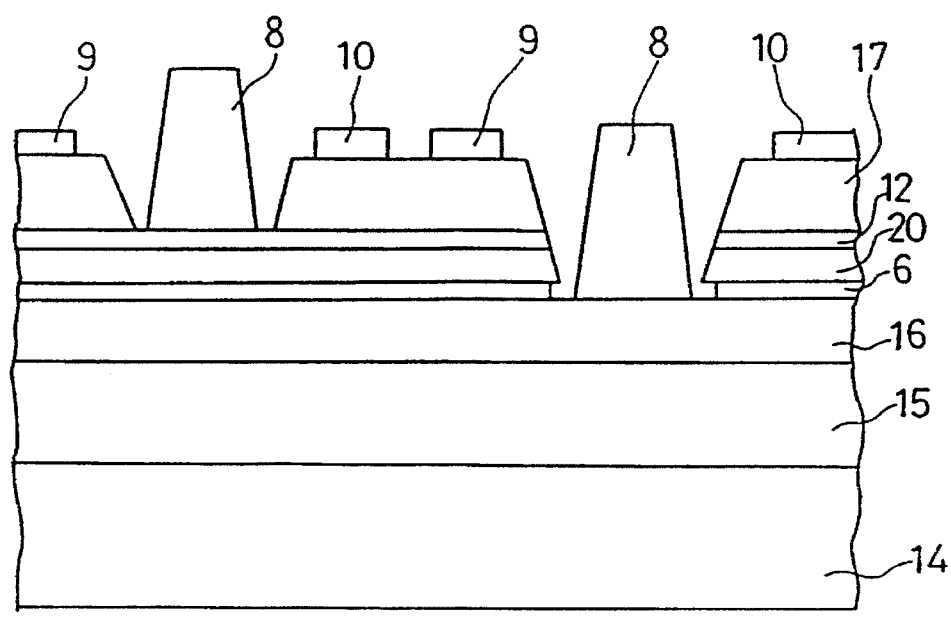
FIG. 62 is a cross-sectional view illustrating a semiconductor device in accordance with a fifty-ninth embodiment of the present invention.

FIG. 62 is a cross-sectional view illustrating a semiconductor device in accordance with a fifty-ninth embodiment of the present invention. In this embodiment, the HEMTs shown in FIGS. 39 and 46 having different pinch-off voltages are formed on the same substrate.

Figure 63:
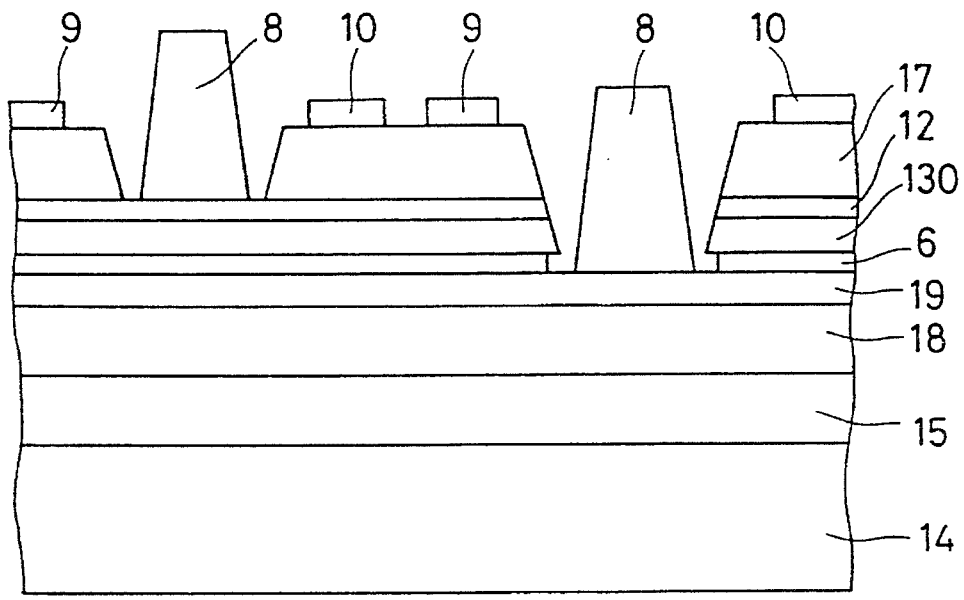
FIG. 63 is a cross-sectional view illustrating a semiconductor device in accordance with a sixtieth embodiment of the present invention.

FIG. 63 is a cross-sectional view illustrating a semiconductor device in accordance with a sixtieth embodiment of the present invention. In this embodiment, the MISFETs shown in FIGS. 43 and 47 having different pinch-off voltages are formed on the same substrate.

Figure 64:
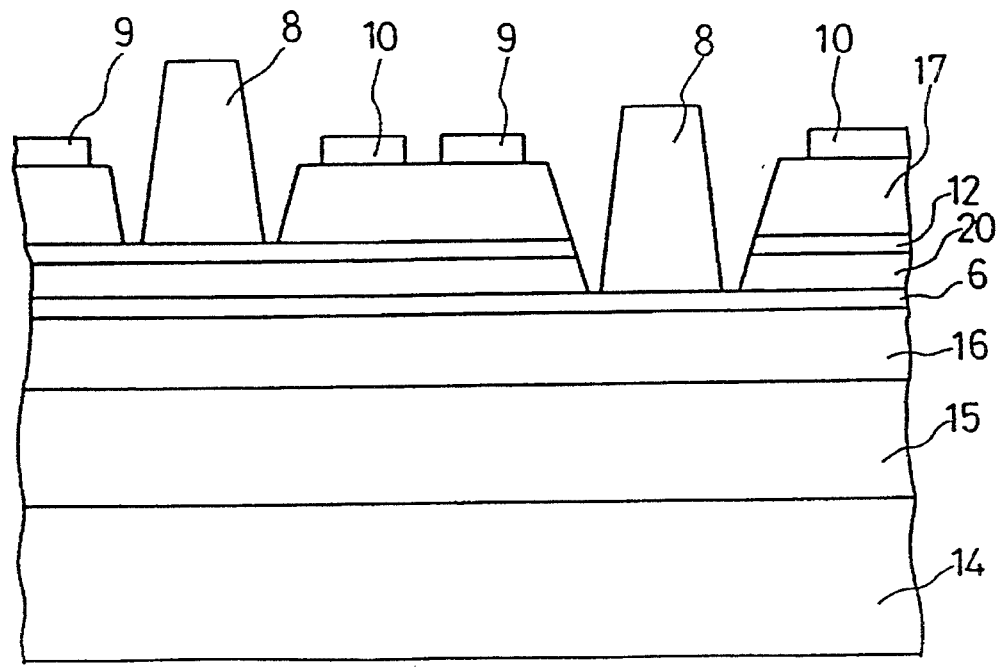
FIG. 64 is a cross-sectional view illustrating a semiconductor device in accordance with a sixty-first embodiment of the present invention.

FIG. 64 is a cross-sectional view illustrating a semiconductor device in accordance with a sixty-first embodiment of the present invention. In this embodiment, the HEMTs shown in FIGS. 39 and 48 having different pinch-off voltages are formed on the same substrate.

Figure 65:
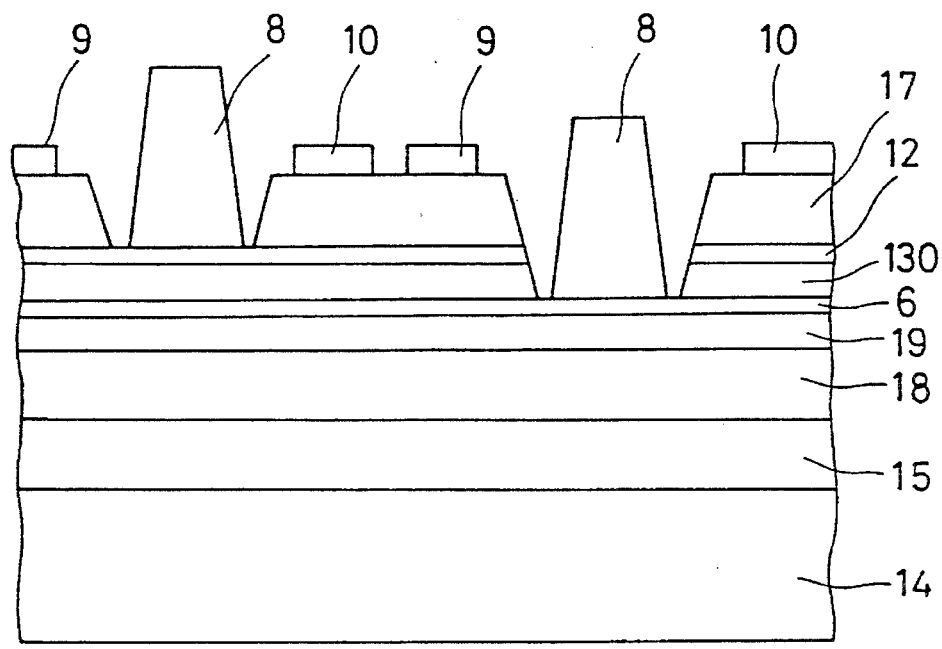
FIG. 65 is a cross-sectional view illustrating a semiconductor device in accordance with a sixty-second embodiment of the present invention.

FIG. 65 is a cross-sectional view illustrating a semiconductor device in accordance with a sixty-second embodiment of the present invention. In this embodiment, the MISFETs shown in FIGS. 43 and 49 having different pinch-off voltages are formed on the same substrate.

Figure 66:
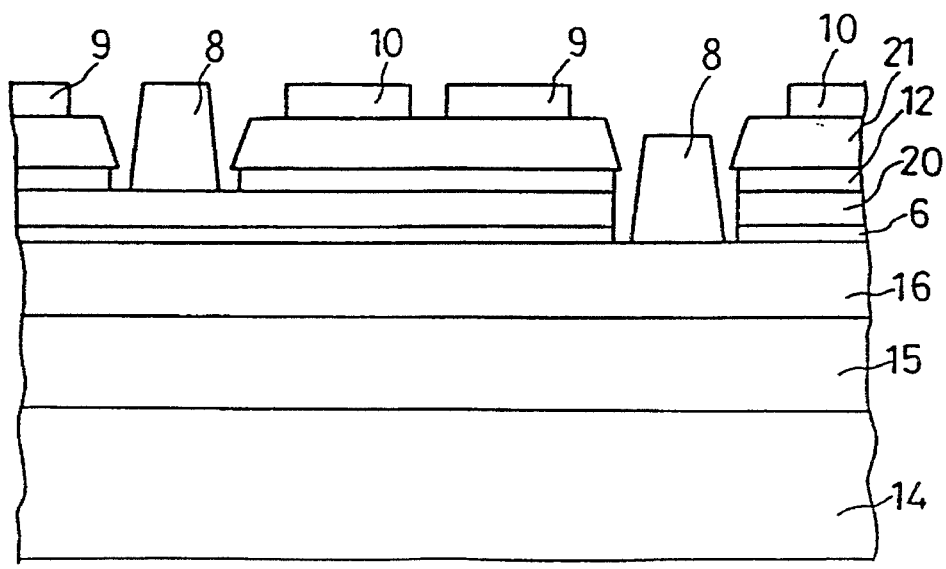
FIG. 66 is a cross-sectional view illustrating a semiconductor device in accordance with a sixty-third embodiment of the present invention.

FIG. 66 is a cross-sectional view illustrating a semiconductor device in accordance with a sixty-third embodiment of the present invention. In this embodiment, an n type AlGaAs ohmic contact layer 21 about 50 nm thick is used in place of the n type GaAs ohmic contact layer 17 of FIG. 58.

Figure 67:
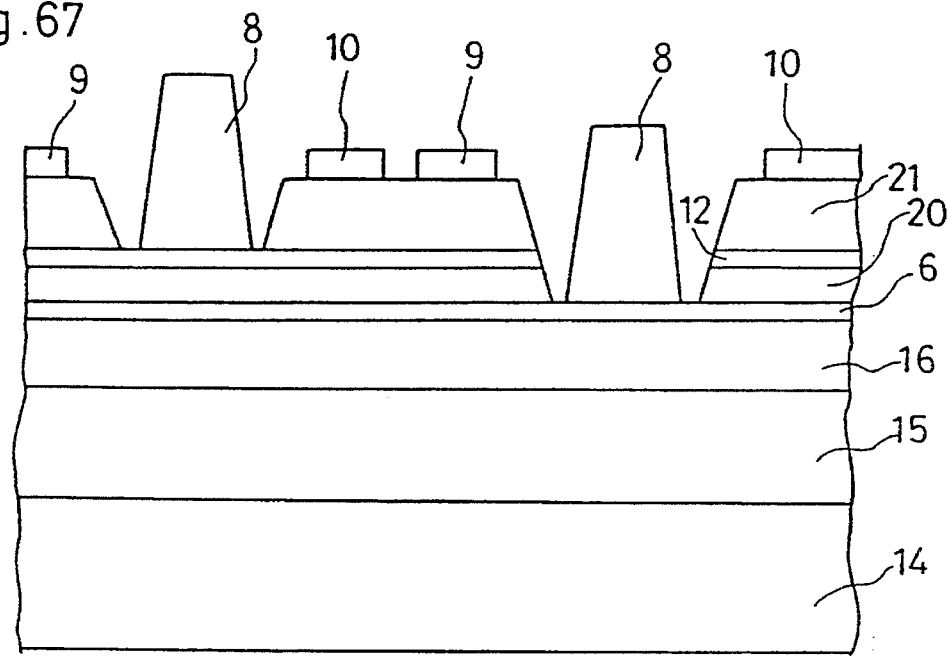
FIG. 67 is a cross-sectional view illustrating a semiconductor device in accordance with a sixty-fourth embodiment of the present invention.

FIG. 67 is a cross-sectional view illustrating a semiconductor device in accordance with a sixty-fourth embodiment of the present invention. In this embodiment, an n type AlGaAs ohmic contact layer 21 is used in place of the n type GaAs ohmic contact layer 17 of FIG. 64.

Figure 68:
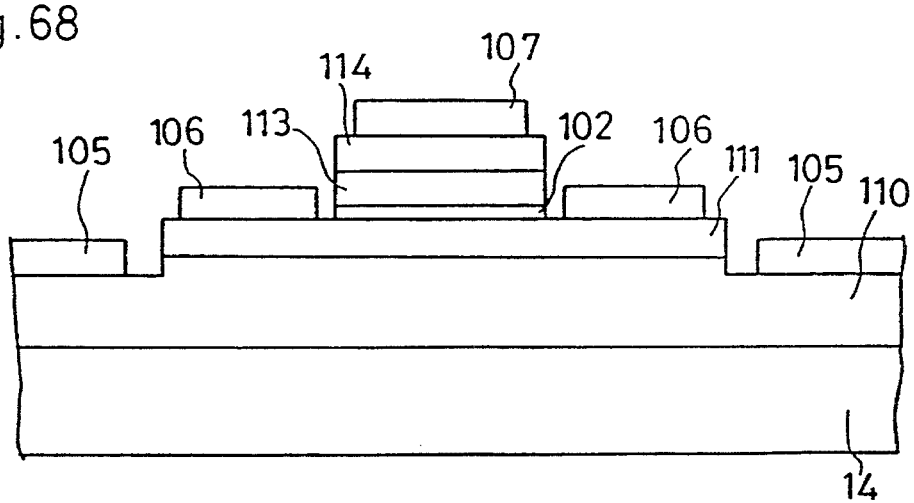
FIG. 68 is a cross-sectional view illustrating a semiconductor device in accordance with a sixty-fifth embodiment of the present invention.

FIG. 68 is a cross-sectional view illustrating a HBT employing a GaAs substrate in accordance with a sixty-fifth embodiment of the present invention. In this embodiment, there are successively disposed on a GaAs substrate 14, an n type GaAs collector layer 110, a p type GaAs base layer 111, an n type InP etching stopper layer 102, an n type AlGaAs emitter layer 113, and an $n^+$ type GaAs emitter contact layer 114. A method for fabricating this HBT is identical to the method illustrated in FIGS. 28(a)–28(c).

Figure 69:
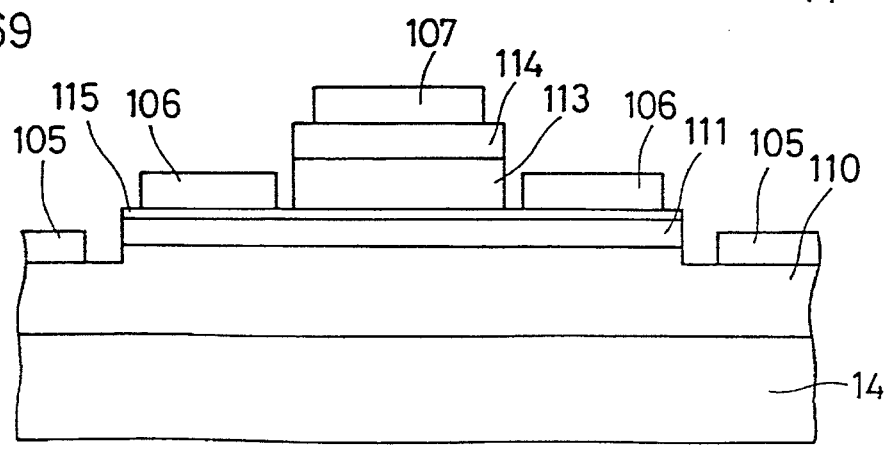
FIG. 69 is a cross-sectional view illustrating a semiconductor device in accordance with a sixty-sixth embodiment of the present invention.

FIG. 69 is a cross-sectional view illustrating a HBT employing a GaAs substrate in accordance with a sixty-sixth embodiment of the present invention. This HBT is different from the HBT of FIG. 68 only in that a p type InP etching stopper layer 115 is used in place of the n type InP etching stopper layer 102 and the base electrodes 106 are disposed on the p type InP etching stopper layer 115. In production, after the etching of the $n^+$ type GaAs emitter contact layer 114 and the n type AlGaAs emitter layer 113, the p type InP etching stopper layer 115 is not removed and the base electrodes 106 are formed on the etching stopper layer 115.

What is claimed is:

1. A heterojunction bipolar transistor comprising:

a III-V compound semiconductor substrate having a surface;

III-V compound semiconductor layers successively disposed on said surface including an InGaAs layer, an InP layer, and an InAlAs layer; and base electrodes in contact with said InP layer wherein contact of said base electrodes with said InP layer is coplanar with contact between said InAlAs layer and said InP layer.

2. A heterojunction bipolar transistor comprising:

a III-V compound semiconductor substrate having a surface;

III-V compound semiconductor layers successively disposed on said surface including a GaAs layer, an InP layer, and an AlGaAs layer; and a base electrode in contact with said InP layer wherein contact of said base electrode with said InP layer is coplanar with contact between said AlGaAs layer and said InP layer.

* * * * *